US005956838A

United States Patent [19]

Ishii

[11] Patent Number: 5,956,838

[45] Date of Patent: Sep. 28, 1999

[54] IC LEADFRAME PROCESSING SYSTEM

[75] Inventor: Mitoshi Ishii, Ohita, Japan

[73] Assignee: Ishii Tool & Engineering Corp., Ohita, Japan

[21] Appl. No.: 08/972,354

[22] Filed: Nov. 18, 1997

[30] Foreign Application Priority Data

Dec. 3, 1996 [JP] Japan .................................... 8-337632

[51] Int. Cl.[6] ............................ B23D 23/00; B21D 43/00

[52] U.S. Cl. ............................ 29/566.3; 29/740; 29/759; 29/827

[58] Field of Search .................................... 29/566.3, 564, 29/563, 827, 759, 740, 564.9, 33

[56] References Cited

U.S. PATENT DOCUMENTS 5,361,486 11/1994 Harmsen et al. ......................... 29/563
5,636,430 6/1997 Uchiyama et al. .................... 29/564.7
5,645,393 7/1997 Ishii ........................................ 414/417

*Primary Examiner*—William Briggs
*Attorney, Agent, or Firm*—Armstrong, Westerman, Hattori, McLeland & Naughton

[57] ABSTRACT

An IC leadframe processing system for use in an IC manufacturing system, whereby IC leadframes of different types can be subjected to various lead machining processes by a single processing system without a need of various types of cutting and bending dies. The topmost leadframe is separated by a separating device one by one from a stack of leadframes stored, each having a plurality of IC chips connected thereto. The leadframe is cut into each individual packaged IC by a leadframe cutting device. Lead wires of each packaged IC are subjected to pinch cutting, dam cutting and end cutting by a cutting die and then bent into a Z shape by a bending machine.

9 Claims, 41 Drawing Sheets

IC LEADFRAME PROCESSING SYSTEM

BACKGROUND OF THE INVENTION

1. Field of the Invention

The present invention relates to an IC (integrated circuit) leadframe processing system. More particularly, the present invention relates to an IC leadframe processing system for bending and cutting a series of ICs connected with a leadframe during a production process or a leadframe of a single IC.

2. Description of the Background Art

ICs are produced through various manufacturing processes. The steps of processing the leadframe portion of an IC provided with a leadframe are roughly as follows. Upon completion of an IC chip, it is bonded to a leadframe, wired and coated with a plastic material for protection. Next, unnecessary portions of the leadframe are cut off, and pin portions are bent into a desired shape by using a bender. Thus, an IC is completed.

These leadframe machining steps are carried out by using devices necessary for machining, e.g. a cutting machine and a bending machine, which are arranged in a side-by-side relation on a machining line. The leadframe machining line is provided for each type of leadframe. The reason for this is that the leadframe size, number of pins and pin spacing vary for each type of IC, and it is therefore necessary to use machining devices conformable to each type of leadframe.

Installation of a machining line for each type of leadframe requires a great deal of installation cost. Moreover, a large amount of maintenance is required, and the maintenance costs a great deal. To increase the production capacity (throughput) of the leadframe machining process in excess of the production capacity of one machining line, another machining line of the same configuration must be added. A reduction of the production capacity can also be realized only in units of one machining line. Thus, fine adjustment of the throughput cannot be made.

The present inventor proposed an IC stocker, an IC unloading and positioning apparatus, and an IC feed system, which can be applied to ICs of various specifications (U.S. Pat. No. 5,645,393). However, the proposed technique is not a processing system that performs a series of steps, i.e. from the feed of an IC leadframe to the final machining step, by a single processing system.

SUMMARY OF THE INVENTION

Accordingly, an object of the present invention is to provide an IC leadframe processing system for use in an IC manufacturing system, which is capable of machining IC leadframes of different types by a single processing system.

Another object of the present invention is to provide an IC leadframe processing system capable of meeting a need of increasing or reducing the throughput of the IC leadframe machining process simply by increasing or reducing the number of IC leadframe processing systems each unitized as a single processing system.

To attain the above-described objects, the present invention provides an IC leadframe processing system unitized as a single processing system. The IC leadframe processing system includes a storage device for storing a stack of leadframes each having a plurality of IC chips mounted thereon, and a separating device for separating a leadframe one by one from the stack of leadframes stored in the storage device. The IC leadframe processing system further includes a leadframe cutting machine for cutting the leadframe into each individual IC chip to obtain a packaged IC, and a machining device for machining lead wires of the packaged IC. Further, a transfer device transfers the leadframe between the separating device and the leadframe cutting machine and also transfers the packaged IC between the leadframe cutting machine and the machining device.

The IC leadframe processing system is more effective if it further includes a centering device disposed between the separating device and the leadframe cutting machine to position the leadframe separated by the separating device. However, the centering device is not necessarily essential for the IC leadframe processing system according to the present invention. It is desirable for the transfer device to comprise two or more transfer devices. However, a single transfer device will suffice if the transfer efficiency is not considered.

It is preferable for the separating device to be an IC pushing-up mechanism that pushes up the stack of leadframes in the storage device from the bottom of the stack to separate only the topmost leadframe from the stack of leadframes one by one.

It is preferable for the machining device to include a cutting machine for cutting corner portions of the lead wires and cutting dam portions interconnecting the lead wires and further cutting distal end portions of the lead wires and to further include a lead bending machine for bending the lead wires by holding and moving the distal ends of the lead wires. By doing so, cutting and bending are favorably separated from each other.

It is preferable for the transfer device to include a first transfer device for transferring the leadframe between the centering device and the leadframe cutting machine; a second transfer device for transferring the packaged IC cut by the leadframe cutting machine to the machining device: and a third transfer device for transferring the packaged IC between a plurality of machining steps in the machining device. By doing so, even more effective machining can be realized.

It is preferable for the cutting machine to include a lead processing machine table for placing the packaged IC thereon, which is controlled so as to be movable in a predetermined plane for cutting the packaged IC mounted thereon; a lead processing machine indexing table for indexing the packaged IC placed on the lead processing machine table to a rotational angle position substantially in the above-described plane; and a cutting die for cutting the lead wires of the packaged IC.

It is preferable for the cutting machine to have cutting die members simultaneously driven by the same press machine to cut the corner portions of the lead wires, the dam portions of the lead wires, and the distal end portions of the lead wires. With this arrangement, the mechanism of the system is advantageously simplified.

It is preferable for the lead processing machine indexing table to include a first lead processing machine indexing table for indexing the packaged IC to a rotational angle position substantially in the above-described plane to cut pinch portions, which are corner portions of the lead wires; a second lead processing machine indexing table for indexing the packaged IC to a rotational angle position substantially in the above-described plane to cut dam portions interconnecting respective portions of the lead wires so that the lead wires do not separate from each other; a third lead processing machine indexing table for indexing the packaged IC to a rotational angle position substantially in the above-described plane to cut lead distal end portions at which distal end portions of the lead wires are connected to each other so that the lead wires do not separate from each other; and a fourth lead processing machine indexing table for indexing the packaged IC to a rotational angle position substantially in the above-described plane to bend distal ends of the lead wires.

It is preferable for the IC leadframe processing system to further include a feed correction driving mechanism for correcting respective positions in the above-described plane of the first lead processing machine indexing table, the third lead processing machine indexing table and the fourth lead processing machine indexing table. With this arrangement, the accuracy of positioning for cutting is favorably increased.

DETAILED DESCRIPTION OF THE EMBODIMENTS

[Machining Process]

An embodiment of the present invention will be described below with reference to the accompanying drawings. FIG.

Figure 1B:
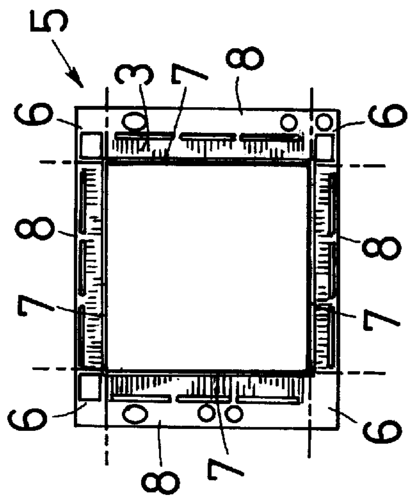
FIG. 1(*a*) shows an outline of the operation of an IC leadframe processing system according to the present invention, and FIG. 1(*b*) is a front view of a packaged IC.
Figure 1A:
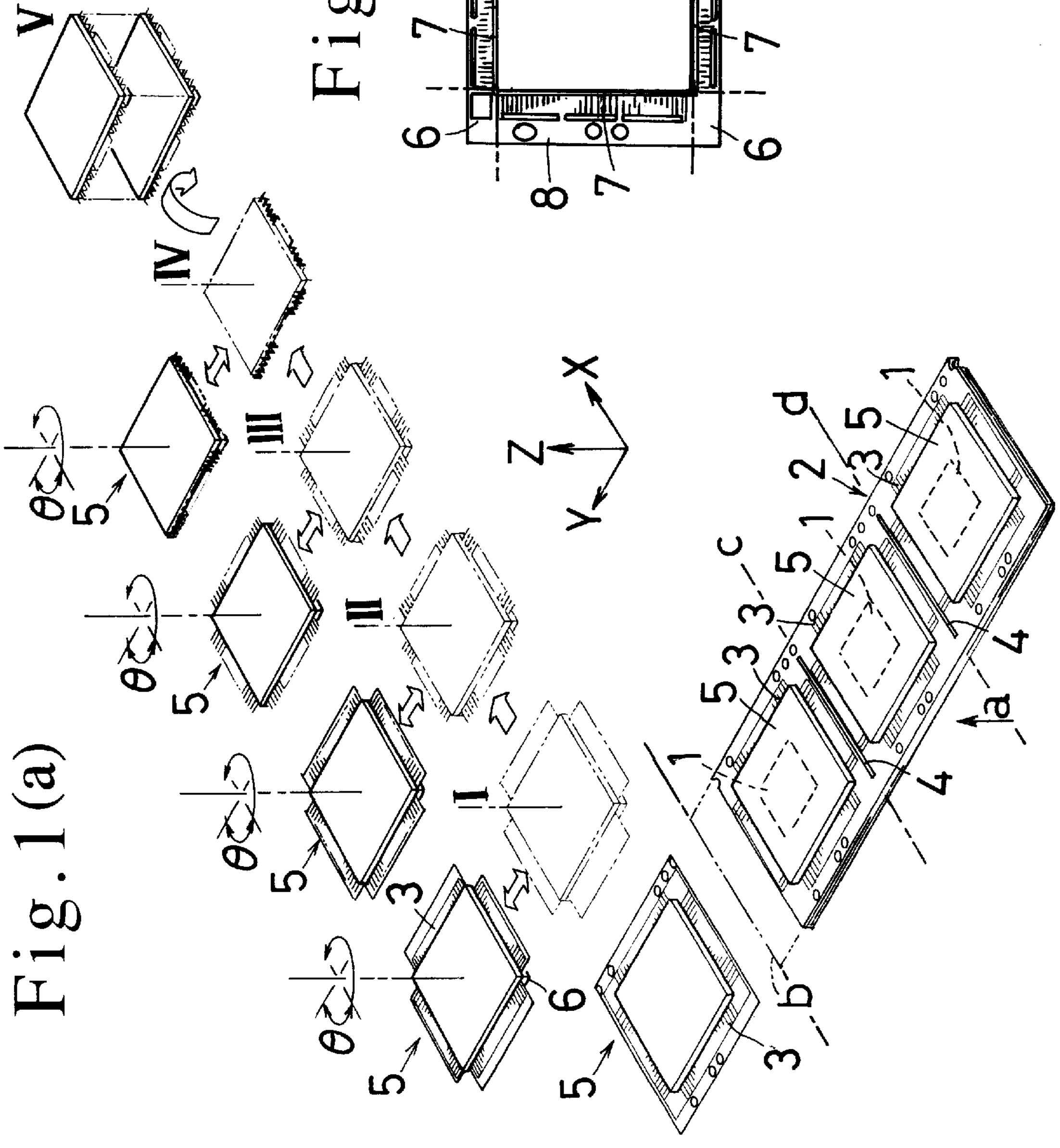

1(*a*) is an oblique projection showing an outline of a process in which a continuous leadframe having packaged ICs mounted thereon is cut for each packaged IC, and each packaged IC is subjected to machining. FIG. 1(*a*) is used to give a brief explanation of the function of the leadframe processing system according to the present invention. More specifically, the figure schematically shows a locus of travel of packaged ICs in the process of cutting the leadframe and machining each packaged IC. FIG. 1(*b*) is a plan view showing the configuration of a packaged IC before it is machined. As shown in FIG. 1(*a*), three IC chips 1 are connected to a leadframe 2 such that the IC chips 1 are disposed at a regular interval in the central portion of the leadframe 2. The leadframe 2 is made of a thin metal sheet and has a plurality of lead wires 3 previously formed by blanking or other similar process.

The lead wires 3 are electrically connected to each packaged IC chip 1 and used to connect the IC chip 1 to a printed-wiring board (not shown) by soldering. Thus, the lead wires 3 have the function of electrically connecting the IC chip 1 and the function of mechanically securing it. The leadframe 2 is made of a hoop material (coil material). Each IC chip 1 is disposed in a punched central portion of the hoop material. Lead wires 3 are formed in the peripheral portion of the hoop material by blanking. A stack of leadframes 2 is accommodated in a cassette 45 (see FIG. 4).

The cassette 45 containing a stack of leadframes 2 is centered and held by an IC stocker 30 (see FIGS. 5 to 9). When the leadframes 2 are pushed up (in the direction of the arrow a) from the lowermost end of the cassette 45 by an IC pushing-up mechanism 100 (see FIG. 10). the topmost leadframe 2 in the cassette 45 is introduced into the space between centering plates 131*a* and 131*b* (see FIG. 11) of a centering device 120 (see FIGS. 11 to 15). Thus, the leadframe 2 is centered and positioned in the centered state. The leadframe 2 is held by an arm 150 of a first transfer device 140 (see FIGS. 11 and 12) and transferred to a leading edge recognition position b which has been set in advance.

When the leading edge of the leadframe 2 thus transferred reaches the leading edge recognition position b, a recognition camera (not shown) picks up an image of the leadframe 2 to recognize the position of the leading edge and the pitch of the packaged ICs 5. An analyzer (not shown) analyzes the image of the leadframe 2, thereby accurately recognizing the cut positions c and d of the leadframe 2. As the cut positions of the leadframe 2 are accurately measured and recognized, the cut positions c and d of the leadframe 2 can be determined. It should be noted that the accurate cut positions c and d are each detected by detecting a slit 4 as a center position between each pair of adjacent IC chips 1. Next, the first transfer device 140 transfers the leadframe 2 to a leadframe cutting machine 160 (see FIGS. 16 to 18). The leadframe cutting machine 160 cuts the leadframe 2 at the cut position c.

When the leadframe 2 is cut at the cut position c, a single packaged IC 5 is obtained. The packaged IC 5 cut from the leadframe 2 is sent to the subsequent step for machining the lead wires 3, which have not yet been machined. The leadframe 2 remaining after the cutting process is returned to the leading edge recognition position b by the first transfer device 140 and cut at the cut position d by a cutting operation similar to the above. Each individual packaged IC 5 cut from the leadframe 2 is transferred by a second transfer device 210 (see FIGS. 19 to 21) to the position of a lead processing machine table 260 (see FIGS. 22 to 26(*b*)) capable of moving in the directions of two orthogonal axes, i.e. plane motion in the directions of X- and Y-axes, and rotational indexing (θ).

The packaged IC 5 placed on a rotary table is imaged by a recognition camera, which is a CCD camera, to recognize the size and position of the packaged IC 5 and the pitch of the lead wires 3. The position of the packaged IC 5 is corrected by driving a lead processing machine indexing table 295 (see FIGS. 22 and 23) on the basis of the result of the recognition of the position and type of the packaged IC 5. Then, the packaged IC 5 is transferred to the position of a pinch cutting die member 339 (see FIG. 32) to cut pinch portions 6, which are the four corners of the leadframe 2 of the packaged IC 5. To cut the pinch portions 6, the packaged IC 5 is placed on the rotary table of the first lead processing machine indexing table 295 on the lead processing machine table 260 and rotated at intervals of 90 degrees in a plane containing a horizontal plane about a vertical axis, thereby successively cutting the pinch portions 6 by the pinch cutting die member 339.

Upon completion of the cutting of the pinch portions 6 at the four corners, the packaged IC 5 is returned to the position of an intermediate pocket I. Thereafter, the packaged IC 5 is transferred a third transfer device 310 (see FIGS. 27 to 30) from the intermediate pocket I to an intermediate pocket II, i.e. the position of the rotary table of a lead processing machine indexing table 296. The packaged IC 5 placed in the intermediate pocket II is transferred to the position of a dam cutting blade 350 (see FIG. 31) to cut dam portions 7, i.e. connecting portions that connect together the intermediate portions of the lead wires 3 so that the lead wires 3 do not separate from each other. Upon completion of the cutting of the dam portions 7 in the four directions, the packaged IC 5 is returned from the dam cutting blade 350 to the intermediate pocket II and then transferred from the intermediate pocket II to an intermediate pocket III.

The packaged IC 5 is transferred from the intermediate pocket III to an end cutting blade 353 (see FIG. 31) to cut lead distal end portions 8. Then, the packaged IC 5 is transferred from the intermediate pocket III to an intermediate pocket IV. Next, the packaged IC 5 is transferred from the intermediate pocket IV to an IC lead bending machine 400 (see FIG. 38) to effect forming of the lead wires 3 by biaxially-controlled servomotors of the lead bending machine 400, i.e. to bend the lead wires 3 into an L shape. Then, the packaged IC 5 is returned from the IC lead bending machine 400 to the intermediate pocket IV, and transferred from the intermediate pocket IV to an intermediate pocket V by an inverting device 560 (see FIGS. 44 to 46) while being inverted. The inverted packaged IC 5 is temporarily laid on a temporary laying table 561 located at the position of the intermediate pocket V. The temporarily laid packaged IC 5 is stacked on a tray (not shown) for storage by a transfer device (not shown).

[Leadframe Processing Machine 20]

Figure 2:
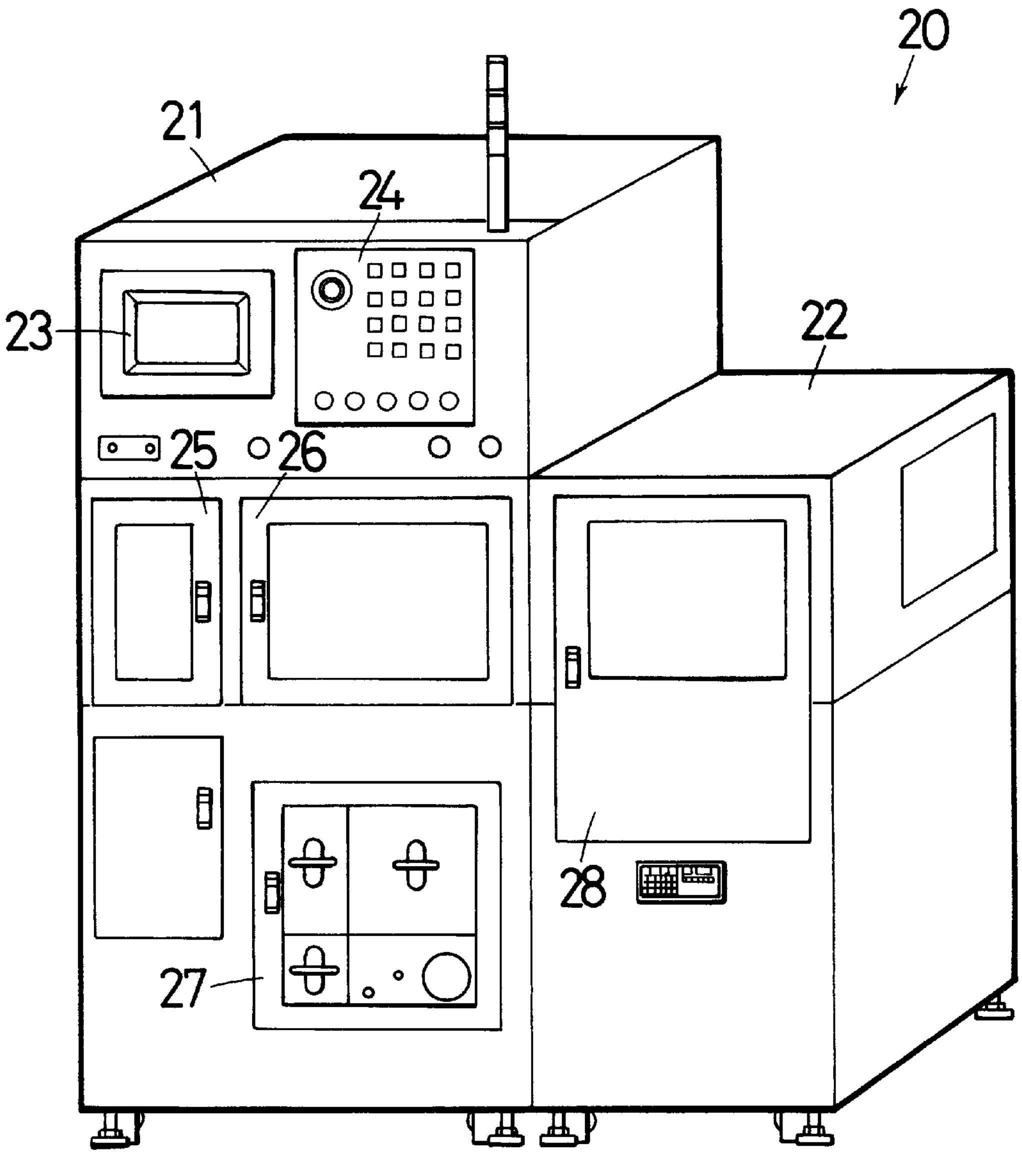
FIG. 2 is a perspective view showing the external appearance of an IC leadframe processing machine.

FIG. 2 shows the external appearance of a leadframe processing machine 20. The leadframe processing machine 20 is covered with a sheet metal cover in the shape of a rectangular parallelepiped. The leadframe processing machine 20 roughly comprises a machine box 21 and an unloading box 22.

A CRT 23 is disposed in the upper part of the machine box 21 to display data and so forth for the controller of the leadframe processing machine 20. A control panel 24 for the controller is disposed at the side of the CRT 23. The control panel 24 has a keyboard and so forth for inputting data concerning the size of leadframes 2, the size of packaged ICs 5, etc.

A loading door 25 is disposed in the middle part of the front side of the machine box 21 to load a stack of packaged ICs 5 accommodated in a magazine into the machine box 21. The loading door 25 can be opened and closed because it is connected to the machine box 21 by hinges. A cassette 45 accommodating leadframes 2 (see FIG. 4) is loaded into the machine box 21 through the loading door 25. A die change door 26 is disposed in the middle part of the machine box 21. The die change door 26 is used to change dies from one to another. A cuttings discharge door 27 is disposed in the lowermost part of the machine box 21 to discharge cuttings removed from the leadframe 2. An unloading door 28 is disposed in the middle part of the unloading box 22 to unload the completed packaged ICs 5 in a magazine.

Figure 3:
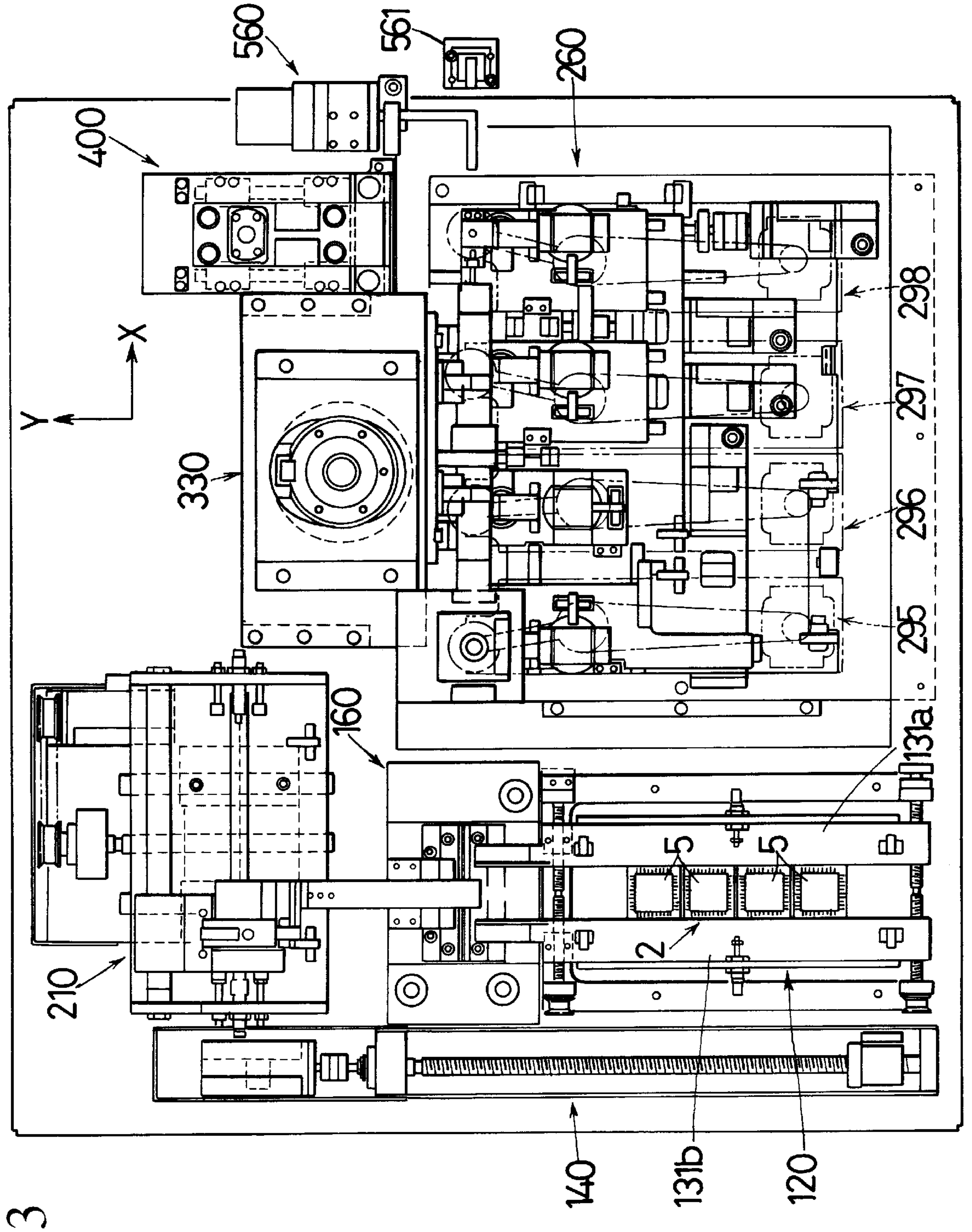
FIG. 3 is a plan view of the IC leadframe processing machine.

FIG. 3 is a plan view of the leadframe processing machine 20. Centering plates 131*a* and 131*b* position and center a leadframe 2 pushed up from an IC stocker 30 (see FIG. 5) disposed underneath the centering plates 131*a* and 131*b*, thereby preparing for the transfer of the leadframe 2 to the subsequent step. The IC stocker 30 is disposed underneath the centering device 120 to center a stack of leadframes 2 accommodated in the cassette 45 and to feed out the leadframes 2 one by one from the top of the cassette 45.

A leadframe 2 centered by the centering device 120 is pushed out and transferred by the first transfer device 140 for the subsequent cutting process. The transferred leadframe 2 is cut into each individual packaged IC 5 by the leadframe cutting machine 160 as stated above. Each individual packaged IC 5 thus cut is transferred to the lead processing machine table 260 (see FIGS. 22 to 26(*b*)) by the second transfer device 210 (see FIG. 19).

The lead processing machine table 260 is capable of moving in the XY-plane and indexing rotation about a vertical axis (Z-axis). The packaged IC 5 placed on the lead processing machine table 260 is subjected to cutting by a cutting die 330 (see FIGS. 31 to 34). The cutting die 330 comprises an upper die and a lower die. As stated above, the cutting die 330 performs three cutting operations, i.e. cutting of the pinch portions 6 at the four corners of the packaged IC 5; cutting of the dam portions 7 of the leadframe 2; and cutting of the lead distal end portions 8. These cutting operations are simultaneously carried out by using the same press machine. The upper die is driven by a screw press machine 360 (see FIG. 35).

When all the three cutting steps are completed with the completion of the cutting of the lead distal end portions 8, the packaged IC 5 is transferred to the lead bending machine 400. The lead bending machine 400 is a forming machine for bending the lead wires 3 Into an L shape. The transfer of the packaged IC 5 between the cutting die 330 (see FIG. 31) and the lead bending machine 400 (see FIG. 38) is carried out at a constant pitch by the third transfer device 310 (see FIGS. 28 to 30). The lead wires 3 of the packaged IC 5 are bent into an L shape, for example, by the lead bending machine 400. Then, the packaged IC 5 is inverted by the inverting device 560 and stored into a storage casing. The structures and functions of the above-described devices and machines will be described below in detail.

[IC Stocker 30]

Figure 4:
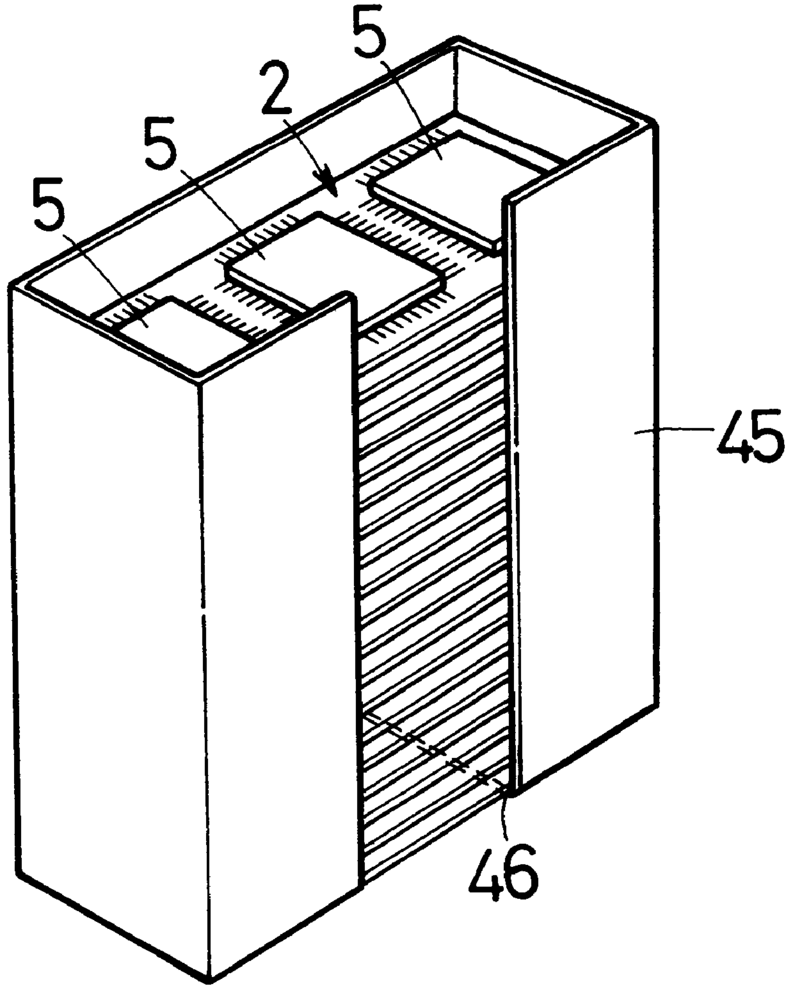
FIG. 4 is an oblique projection showing an IC cassette.

In the example as shown in FIG. 1, each leadframe 2 is sent from the previous step in a state where it has three IC chips 1 connected thereto in series. As shown in FIG. 4, a large number of leadframes 2, each having IC chips 1 disposed thereon, are stacked in a cassette 45. The cassette 45 has a box-like shape as a whole and is loaded into the IC stocker 30 (described later) by a manual operation. The cassette 45 is provided with an opening portion 46 which is open at the front, bottom and top thereof.

Because the cassette 45 is provided with the opening portion 46, the leadframes 2 can be separated and taken out one by one from the top of the cassette 45 by pushing up the stack of leadframes 2 by an amount corresponding to the thickness of one leadframe 2 from the bottom of the cassette 45 by a pushing-up member 111 (see FIG. 10) as described later. Cassettes 45 having different sizes are prepared because leadframes 2 vary in the shape and dimensions according to the type thereof. The cassette 45 is held and secured in a predetermined position in the IC stocker 30 by a cassette holding mechanism 65 (see FIGS. 5 to 9).

Figure 5:
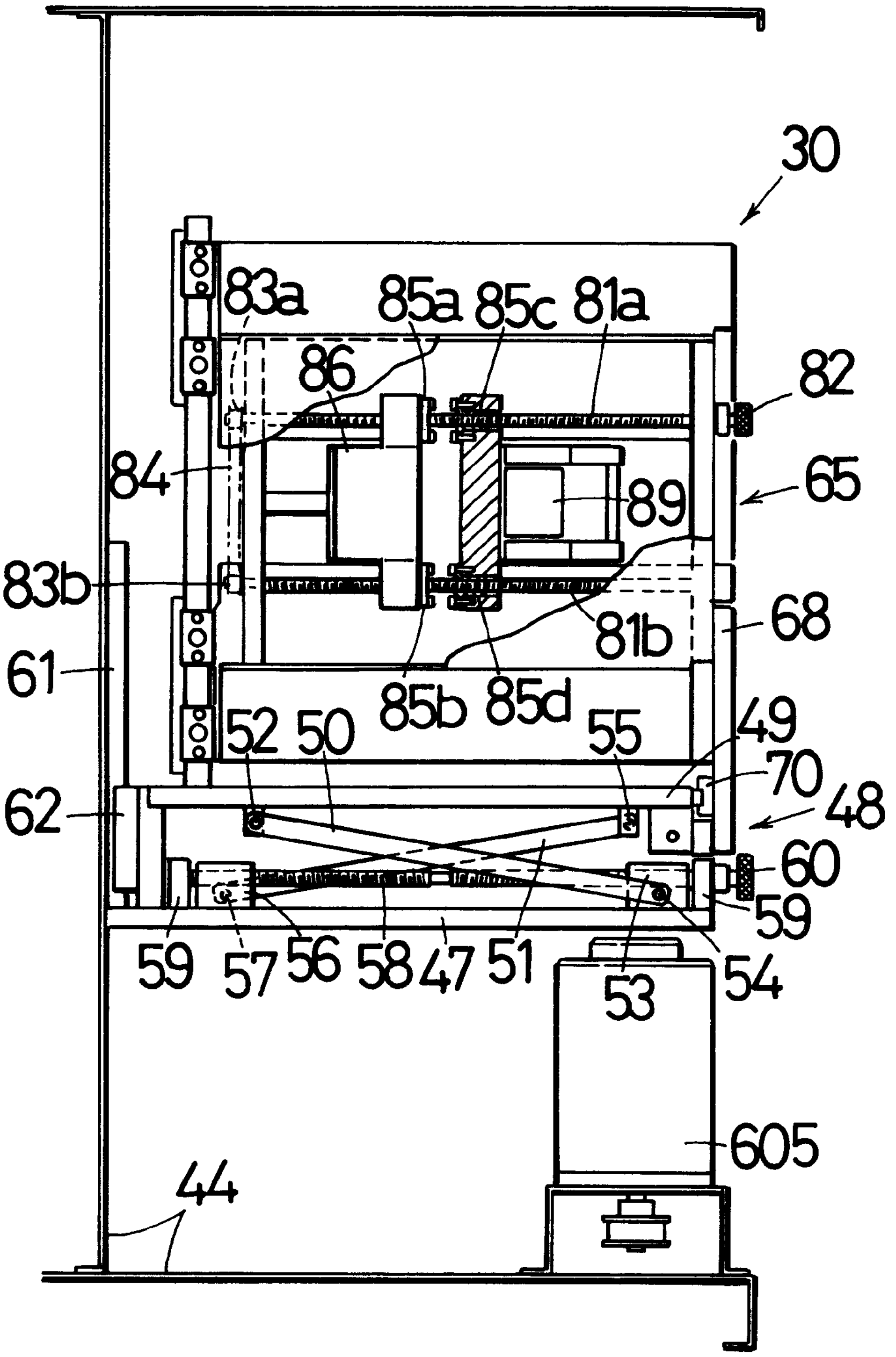
FIG. 5 is a diagram showing an IC stocker.
Figure 6:
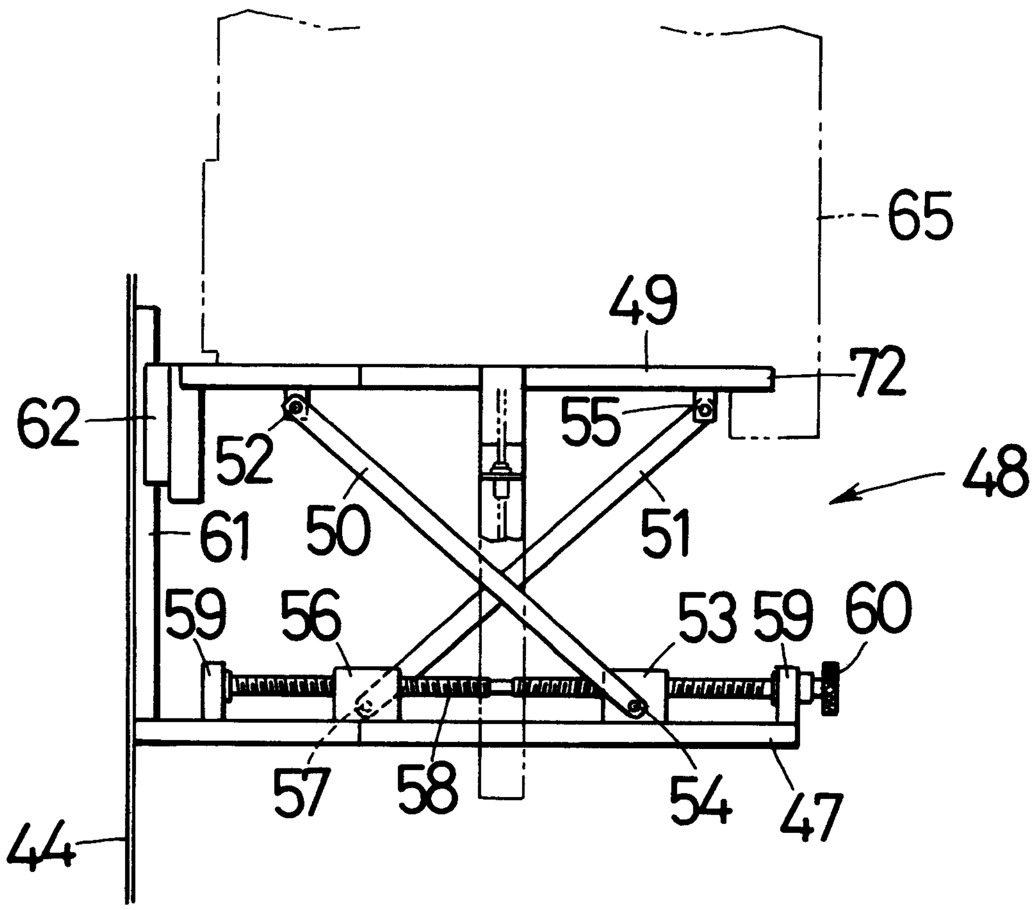
FIG. 6 is a diagram showing a cassette holding mechanism as raised by actuating a cassette lifting mechanism of the IC stocker.
Figure 7:
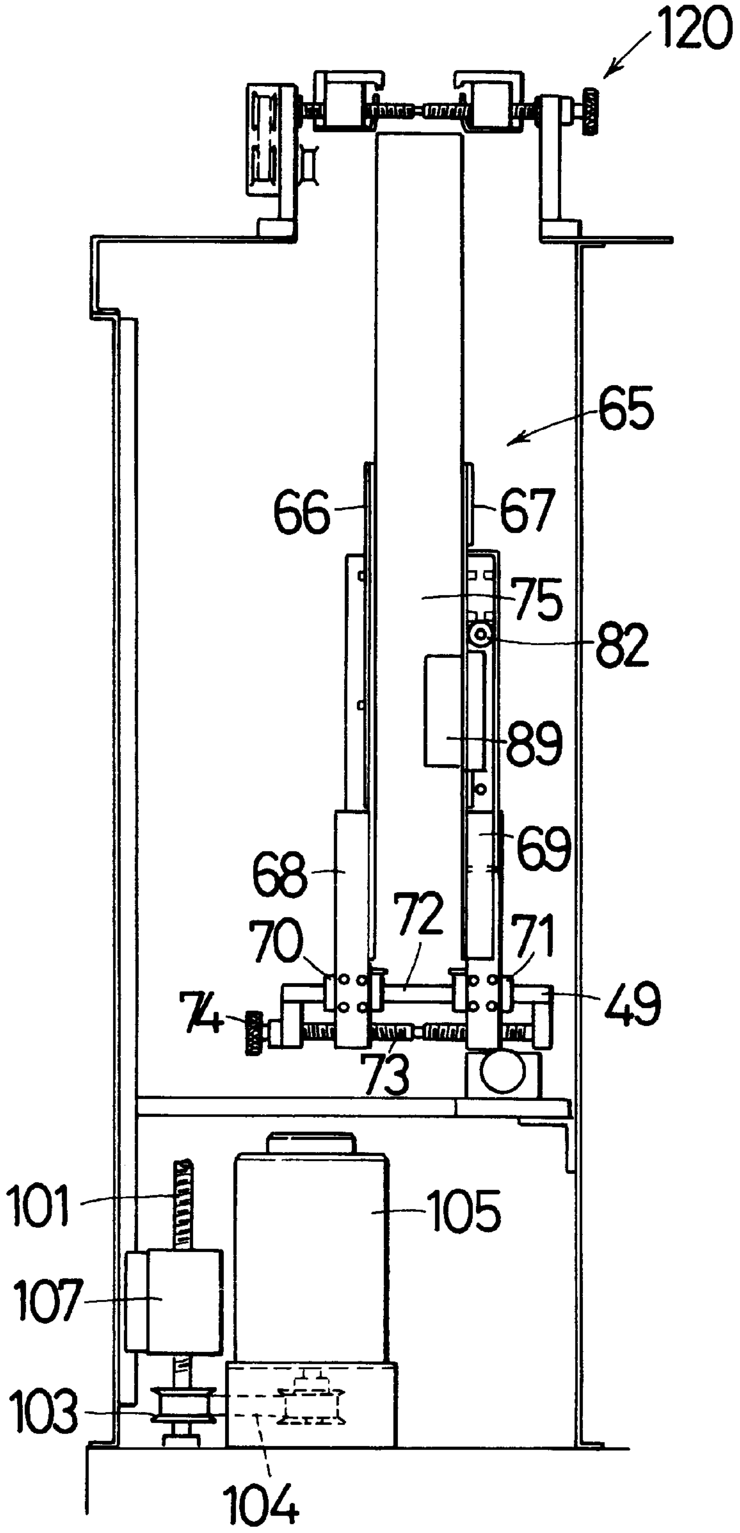
FIG. 7 is a side view of the IC stocker shown in FIG. 5 as viewed from the right-hand side thereof.

The structure of the IC stocker 30 will be described below in detail. The IC stocker 30 comprises a cassette lifting mechanism 48 for vertically moving the cassette 45, and a cassette holding mechanism 65 for holding the cassette 45. FIGS. 5, 6 and 7 show the IC stocker 30. FIG. 5 is a partly-cutaway side view of the IC stocker 30. FIG. 6 shows the cassette holding mechanism 65 raised by actuating the cassette lifting mechanism 48. FIG. 7 is a side view of the IC stocker 30 shown in FIG. 5 as viewed from the right-hand side thereof. The IC stocker 30 has a frame 44. A lower support plate 47 is disposed on the frame 44. The cassette lifting mechanism 48 is provided between the lower support plate 47 and an upper support plate 49 to move the upper support plate 49 vertically. The upper support plate 49 is supported by two first support rods 50 and two second support rods 51.

The upper ends of the two first support rods 50 are pivotably supported at a distance from each other by respective pivot shafts 52 on the lower surface of the upper support plate 49. The lower ends of the two first support rods 50 are disposed to sandwich a moving block 53 therebetween and pivotably supported at a distance from each other by respective pivot shafts 54. The upper ends of the two second support rods 51 are pivotably supported by respective pivot shafts 55 on the lower surface of the upper support plate 49. The lower ends of the two second support rods 51 are disposed to sandwich a moving block 56 therebetween and pivotably supported by respective pivot shafts 57. The moving block 53 and the moving block 56 are screwed on a driving screw 58. The driving screw 58 has both right- and left-hand threads formed thereon. The right-hand thread is screwed in the moving block 53, and the left-hand thread is screwed in the moving block 56.

Both ends of the driving screw 58 are rotatably supported by respective bearings 59 fixed on the lower support plate 47. A knob 60 is secured to one end of the driving screw 58. As will be understood from the foregoing description, turning the knob 60 drives the driving screw 58 to rotate, causing the moving block 53 and the moving block 56 to move over the lower support plate 47 toward or away from each other. When the moving block 53 and the moving block 56 move toward each other, the upper support plate 49 moves upward, causing the cassette holding mechanism 65 on the upper support plate 49 to move upward, as shown in FIG. 6.

A straight-line shaped guide rail 61 is vertically secured to the frame 44 to guide vertical movement of the upper support plate 49. A linear bearing 62 is secured to a side of the upper support plate 49. A first vertical plate 66 and a second vertical plate 67 are disposed to face each other on the upper support plate 49 (see FIG. 7). The space between the first and second vertical plates 66 and 67 is defined as a cassette space 75 for holding a cassette 45 (see FIG. 4). A first connecting plate 68 is secured to the first vertical plate 66.

Similarly, a second connecting plate 69 is secured to the second vertical plate 67. A linear bearing 70 is secured to the first connecting plate 68, and a linear bearing 71 is secured to the second connecting plate 69. The linear bearings 70 and 71 slide on a front edge 72 of the upper support plate 49. Nuts are secured to the lower ends of the first and second connecting plates 68 and 69, respectively. A feed screw 73 is screwed in the two nuts. The feed screw 73 has threads formed thereon in an inverse relation to each other. Both ends of the feed screw 73 are rotatably supported by the upper support plate 49 through respective bearings. A turning knob 74 is secured to one end of the feed screw 73. Accordingly, turning the knob 74 causes the feed screw 73 to rotate, and this causes the first connecting plate 68 and the second connecting plate 69 to move simultaneously through equal distances in opposite directions to each other. Thus, the first connecting plate 68 and the second connecting plate 69 move toward or away from each other.

As a result, the first vertical plate 66 and the second vertical plate 67 simultaneously move toward or away from each other while maintaining parallelism. A cassette space 75 is formed between the first vertical plate 66 and the second vertical plate 67. In this embodiment, the IC stocker 30 is provided with one cassette space 75. In the cassette space 75, a cassette 45 is held by two cassette securing members disposed to face opposite to each other. The cassette 45 is held in a center position in both the longitudinal and lateral directions of the cassette space 75, i.e. the directions of depth and width of the cassette space 75. Cassettes 45 vary in the width and length according to the shape of the leadframes 2 accommodated therein as described above. Therefore, the width and length of the cassette space 75 can be adjusted so that the cassette space 75 is compatible with any cassettes 45 of various dimensions. Positioning of the cassette space 75 in the direction of the width thereof is effected by the abovedescribed interlocking mechanism using the feed screw 73. Positioning of the cassette space 75 in the direction of the depth thereof is effected by using the cassette holding mechanism 65, which will be described below.

[Cassette Holding Mechanism 65]

Figure 8:
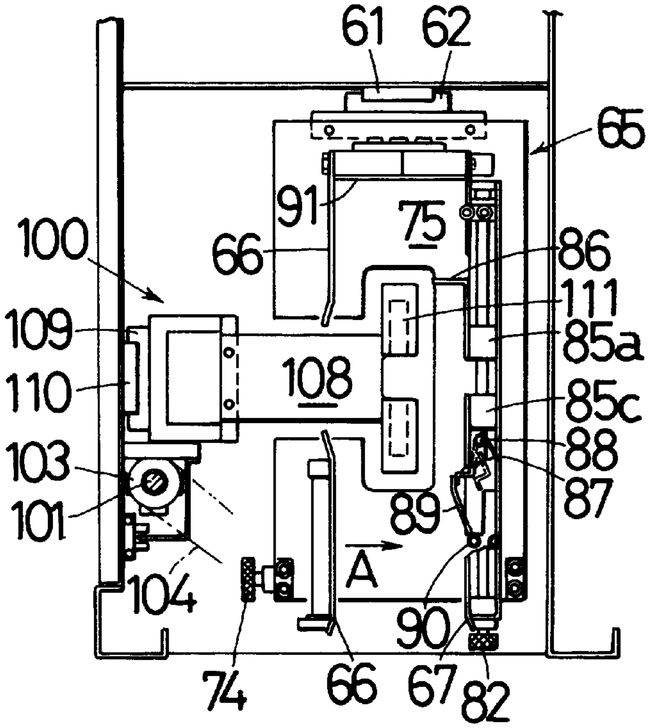
FIG. 8 is a plan view of the IC stocker shown in FIG. 5.
Figure 9:
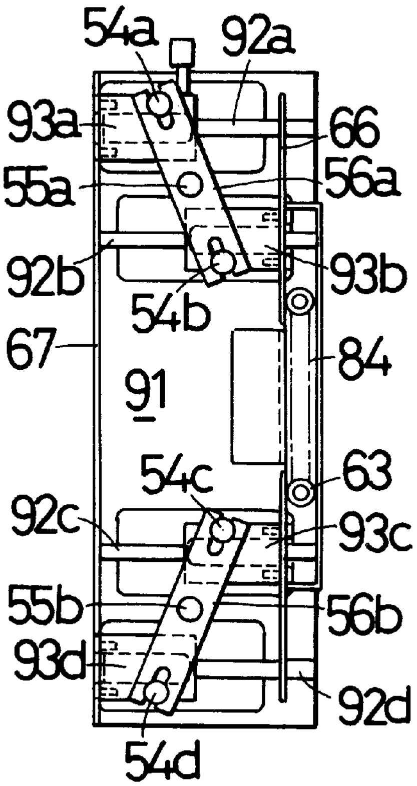
FIG. 9 is a side view of a cassette holding mechanism shown in FIG. 5 as viewed from the left-hand side thereof.

FIG. 5 is a partly-cutaway view showing the second vertical plate 67 as viewed from the direction A in FIG. 8. FIG. 8 is a plan view of the arrangement shown in FIG. 5. FIG. 9 is a side view of the arrangement shown in FIG. 5 as viewed from the left-hand side thereof. A pair of upper and lower screw rods 81*a* and 81*b* are disposed in the second vertical plate 67. The screw rods 81*a* and 81*b* each have right- and left-hand threads formed thereon. A turning knob 82 is secured to one end of the screw rod 81*a*. Timing pulleys 83*a* and 83*b* are secured to the other ends of the screw rods 81*a* and 81*b*, respectively. A timing belt 84 is stretched between the two timing pulleys 83*a* and 83*b*. Four nuts 85*a*, 85*b*, 85*c* and 85*d* are screwed on the right- and left-hand threads of the screw rods 81*a* and 81*b*. An L-shaped first holding member 86 is secured to the two nuts 85*a* and 85*b*.

A second holding member 87 is secured to the other two nuts 85*c* and 85*d*. The second holding member 87 rotates about a shaft 88 (see FIG. 8). The second holding member 87 is constantly pressed toward the cassette space 75 by a spring. A pressing plate 89 is provided over the second holding member 87. The pressing plate 89 is rotatable about a shaft 90. The pressing plate 89 is provided with a spring so as to press the second holding member 87 toward the first vertical plate 66. Consequently, when the pressing plate 89 is pressed against the spring pressure, the pressing plate 89 pivots about the shaft 90. When the pressing plate 89 presses the second holding member 87, the second holding member 87 pivots about the shaft 88. Therefore, the cassette 45 can be inserted into the cassette space 75 but cannot be taken out of it. This function is used when the cassette 45 is inserted into the cassette space 75 from the front side.

FIG. 9 is a side view of the arrangement shown in FIG. 5 as viewed from the left-hand side thereof. A third vertical plate 91 is mounted on the upper support plate 49 to lie at a rear position between the first vertical plate 66 and the second vertical plate 67. The third vertical plate 91 has four horizontal guide rods 92*a*, 92*b*, 92*c* and 92*d* disposed therein in parallel to each other. Moving members 93*a*, 93*b*, 93*c* and 93*d* are movably fitted on the guide rods 92*a*, 92*b*, 92*c* and 92*d* through bearings, respectively. One end of each of the moving members 93*a* and 93*d* is secured to the second vertical plate 67 by using screws. Accordingly, the second vertical plate 67 and the moving members 93*a* and 93*d* move together as one unit.

Similarly, one end of each of the moving members 93*b* and 93*c* is secured to the first vertical plate 66 by using screws. Therefore, the first vertical plate 66 and the moving members 93*b* and 93*c* move together as one unit. Meanwhile, the third vertical plate 91 has shafts 55*a* and 55*b*. Two interlocking links 56*a* and 56*b* are rotatably attached to the shafts 55*a* and 55*b*, respectively. The interlocking links 56*a* and 56*b* each have U-shaped grooves formed in both ends thereof. Pins 54*a*, 54*b*, 54*c* and 54*d* are inserted into the U-shaped grooves, respectively. Consequently, the first vertical plate 66 and the second vertical plate 67 move toward or away from each other while maintaining parallelism through the interlocking links 56*a* and 56*b*.

[IC Pushing-up Mechanism 100]

Figure 10:
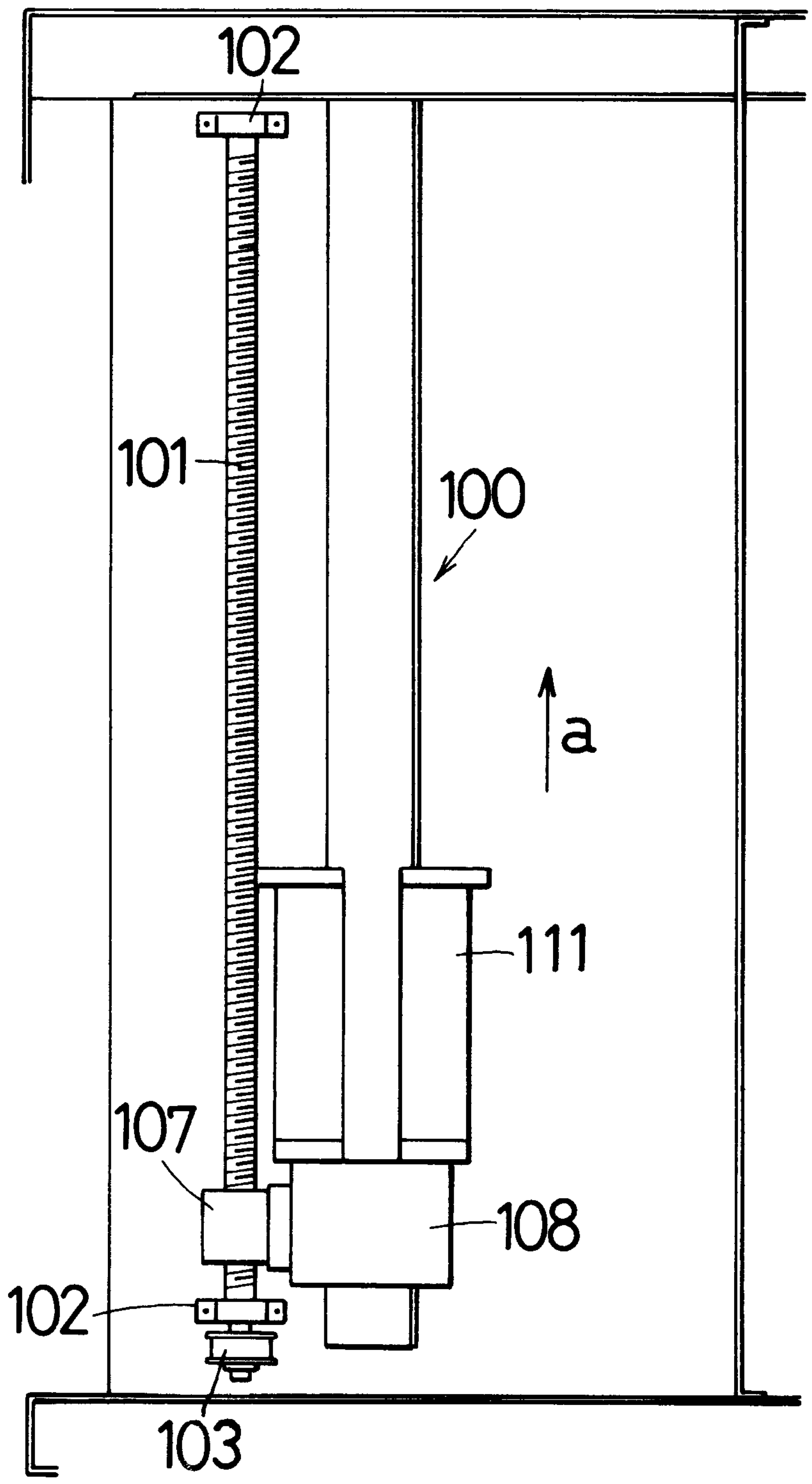
FIG. 10 is a front view of an IC pushing-up mechanism.

FIG. 10 shows the IC pushing-up mechanism 100. The leadframes 2 stacked in the cassette 45 are taken out one by one from the top of the stack of leadframes 2 and transferred to the subsequent step by the first transfer device 140. At this time, it is necessary to push up the stack of leadframes 2 from the bottom of the cassette 45 to thereby take out the topmost leadframe 2. The IC pushing-up mechanism 100 is a mechanism for pushing up the stack of leadframes 2. A vertical ball screw 101 is provided in a corner of the frame of the IC stocker 30. Both ends of the ball screw 101 are rotatably supported through respective bearings 102 on the frame of the IC stocker 30. A timing pulley 103 is secured to the lower end of the ball screw 101. The timing pulley 103 is engaged with a timing belt 104. The timing belt 104 is driven to rotate by a servomotor 105 (see FIG. 7). The ball screw 101 has a ball nut 107 screwed thereon. An arm 108 is integrally secured to the ball nut 107.

A pushing-up member 111 is integrally provided at the distal end of the arm 108. The pushing-up member 111 pushes up the lowermost leadframe 2 in the cassette 45 held in the cassette space 75. As shown in FIG. 8, a linear bearing 109 is secured to the arm 108. The linear bearing 109 is guided along a vertical guide rail 110 secured to the frame. Accordingly, when the servomotor 105 is driven to rotate, the ball nut 107 moves vertically along the ball screw 101, causing the pushing-up member 111 to move vertically along the vertical guide rail 110.

[Centering Device 120]

Figure 11:
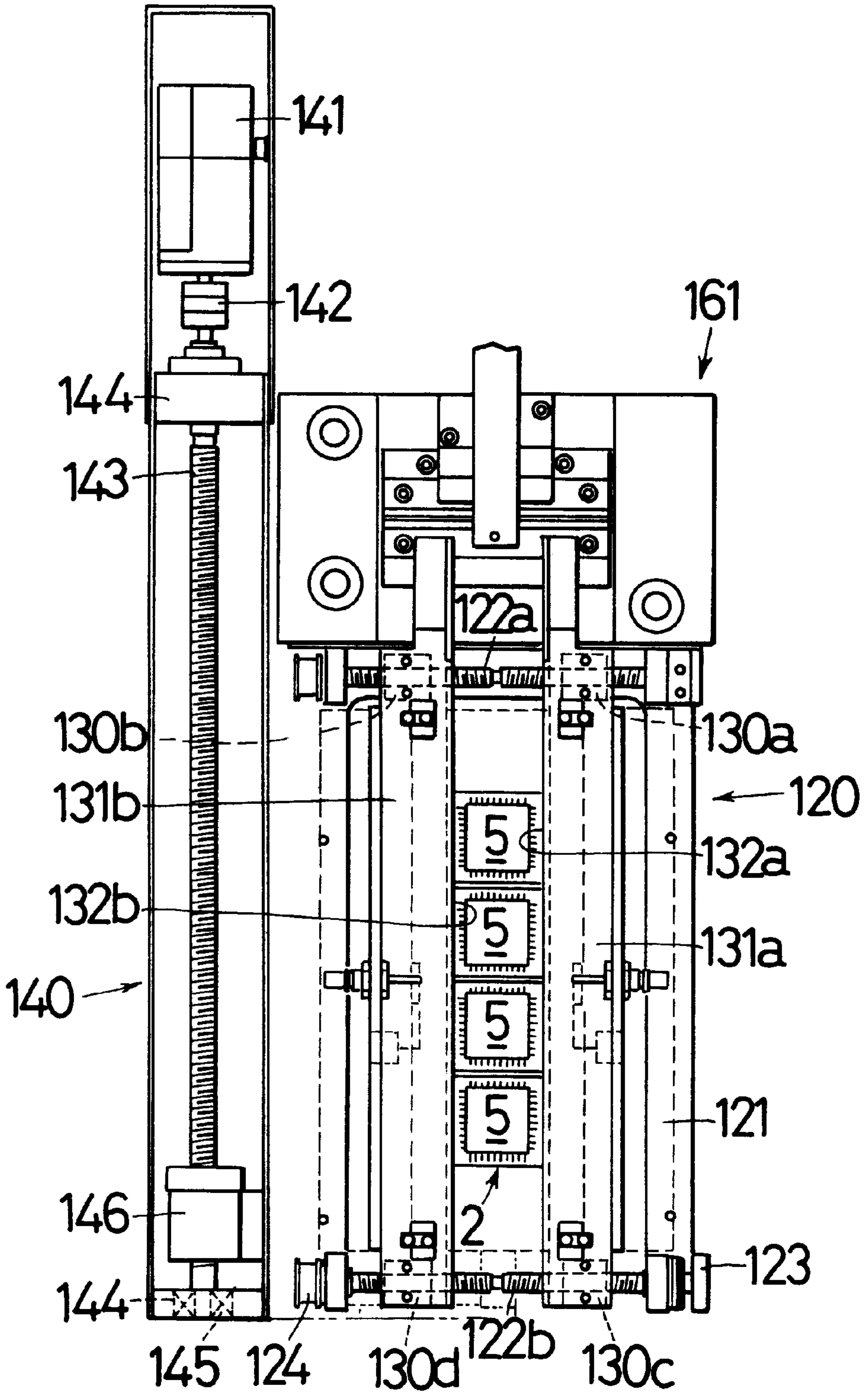
FIG. 11 is a plan view of a centering device, showing a part thereof in a sectional view taken along the line B—B in FIG. 12.
Figure 12:
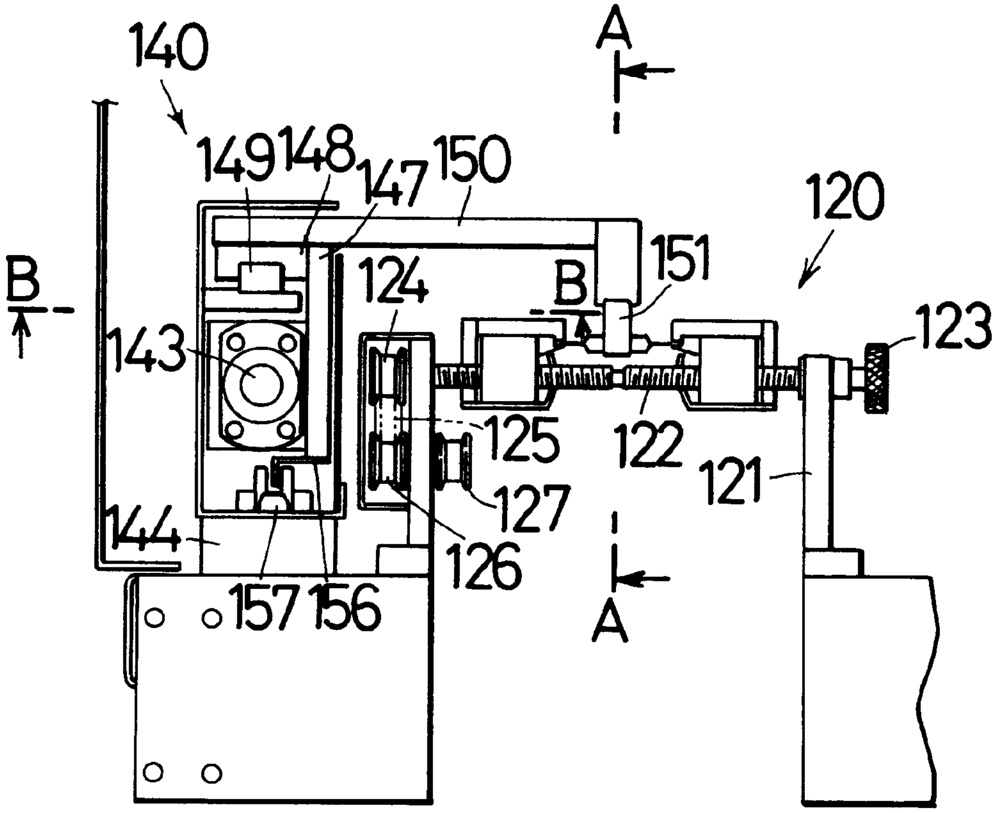
FIG. 12 is a front view of the centering device shown in FIG. 11.
Figure 13:
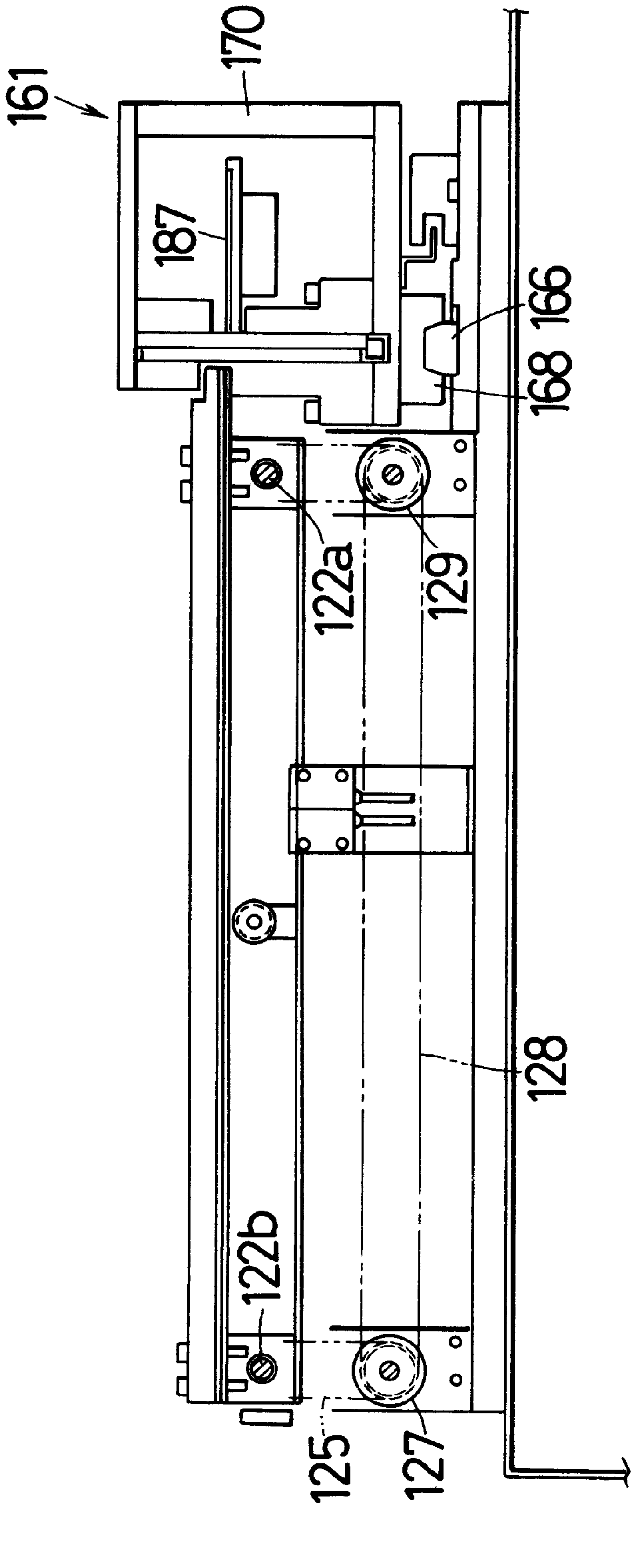
FIG. 13 is a sectional side view taken along the line A—A in FIG. 12.

The centering device 120 and the first transfer device 140 are disposed above the cassette space 75. The centering device 120 positions and centers the topmost leadframe 2 in the cassette 45 pushed up by the IC pushing-up mechanism 100 to prepare for the transfer of the leadframe 2 to the subsequent step. The first transfer device 140 transfers the centered leadframe 2 to the leadframe cutting device 160. FIG. 11 is a plan view of the centering device 120. FIG. 12 is a front view of the arrangement shown in FIG. 11. FIG.

Figure 14:
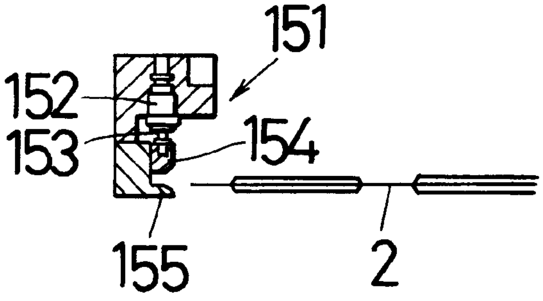
FIG. 14 is a sectional view showing the distal end of an arm of a first transfer device.
Figure 15:
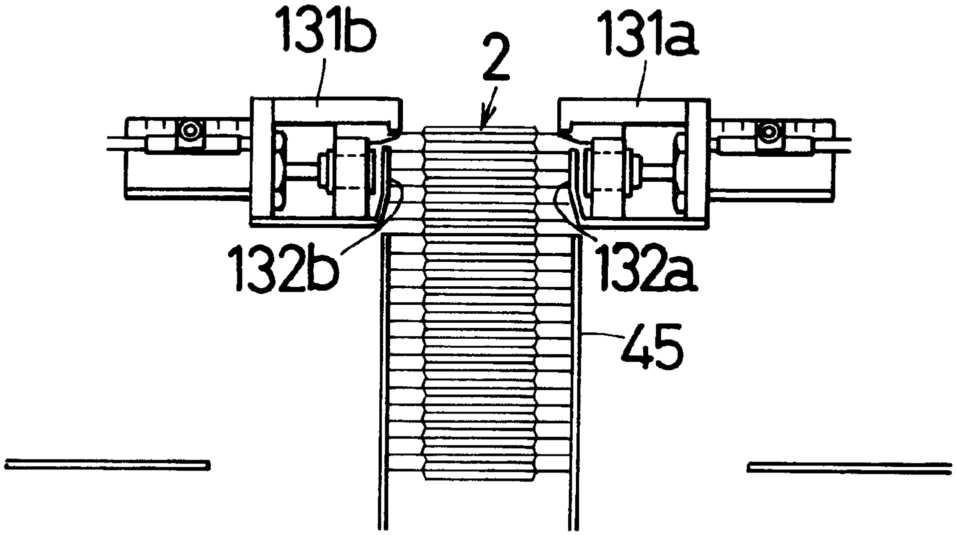
FIG. 15 is a fragmentary sectional view of the centering device.

13 is a side view of the arrangement shown in FIG. 11 as viewed from the right-hand side thereof. FIG. 14 is a sectional view taken along the line A—A in FIG. 12. A frame 121 has a rectangular shape. Two parallel screw rods 122*a* and 122*b* are rotatably supported on the upper side of the frame 121 (see FIG. 11).

The screw rods 122*a* and 122*b* each have right- and left-hand threads cut thereon. A turning knob 123 is secured to one end of the screw rod 122*b*. A timing pulley 124 Is secured to the other end of the screw rod 122*b*. The timing pulley 124 is engaged with a timing belt 125 (see FIG. 12). The timing belt 125 is stretched between the timing pulley 124 and a timing pulley 126. A timing pulley 127 is secured in a coaxial relation to the timing pulley 126. The timing pulley 127 is engaged with a timing belt 128. The timing belt 128 is stretched between the timing pulley 127 and a timing pulley 129 (see FIG. 13). The timing pulley 129 is connected to a timing pulley (not shown) secured to one end of the screw rod 122*a* through a timing belt. Accordingly, the screw rod 122*a* and the screw rod 122*b* are rotated in the same direction in an interlocked relation to each other.

The screw rods 122*a* and 122*b* have nuts 130*a*, 130*b*, 130*c* and 130*d* screwed on their right- and left-hand threads, respectively. A centering plate 131*a* having a rectangular cross-sectional configuration is connected to the nuts 130*a* and 130*c*. Similarly, a centering plate 131*b* having a rectangular cross-sectional configuration is connected to the nuts 130*b* and 130*d*. The respective sides 132*a* and 132*b* of the centering plates 131*a* and 131*b* contact the sides of the leadframe 2 to effect positioning of the leadframe 2. Consequently, turning the knob 123 causes the screw rod 122*b* to rotate, and the rotation of the screw rod 122*b* drives the timing pulley 127 to rotate through the timing pulley 124, the timing belt 125 and the timing pulley 126.

The rotation of the timing pulley 127 drives the screw rod 122*a* to rotate simultaneously with the screw rod 122*b* through the timing belt 128, the timing pulley 129, the timing belt (not shown) and the timing pulley (not shown). The rotation of the two screw rods 122*a* and 122*b* drives the nuts 130*a*, 130*b*, 130*c* and 130*d* to move, thus causing the two centering plates 131*a* and 131*b* to move toward or away from each other across the center line. Therefore, the leadframe 2 is positioned in the center of the centering device 120 at all times.

[First Transfer Device 140]

FIGS. 11, 12 and 14 show the first transfer device 140. The first transfer device 140 transfers the leadframe 2 from the centering device 120 to the leadframe cutting machine 160. The first transfer device 140 is disposed alongside the centering device 120 and the leadframe cutting machine 160. One end of a feed screw 143 is connected through a joint 142 to an output shaft of a servomotor 141. Both ends of the feed screw 143 are supported by a frame 144 through respective bearings 145. The feed screw 143 has a nut 146 screwed thereon. A connecting member 147 is secured to the nut 146 (see FIG. 12). A linear bearing 148 is connected to the upper end of the connecting member 147. The linear bearing 148 moves along a rail 149 as a guide. The rail 149 is disposed above the feed screw 143. Both ends of the rail 149 are secured to the frame 144. Further, one end of an arm 150 is secured to the linear bearing 148.

As shown in FIG. 14, the other end of the arm 150 is provided with a chuck 151. The chuck 151 has an air cylinder 152. A movable holding member 154 is secured to the distal end of a piston rod 153 of the air cylinder 152. A fixed holding member 155 is provided on the arm 150 at a position facing the movable holding member 154. The movable holding member 154 and the fixed holding member 155 cooperate with each other to hold the leadframe 2. A dog 156 is secured to the lower end of the connecting member 147 secured to the nut 146. A mechanical origin detecting sensor 157 is disposed on the frame 144 at a position corresponding to the position of travel of the dog 156. The mechanical origin detecting sensor 157 is used to detect the mechanical absolute origin of the arm 150. An amount of movement of the position of the arm 150 is determined from the position detected by the mechanical origin detecting sensor 157.

As will be clear from the above description of the structure, when the servomotor 141 is activated, the feed screw 143 is driven to rotate, and the nut 146 screwed on the feed screw 143 moves along the feed screw 143. The linear bearing 148 moves along the rail 149. Consequently, the arm 150, which is integrally provided with the linear bearing 148, also moves along the rail 149. By the movement of the arm 150, the IC leadframe 2 held by the chuck 151 is transferred to the leadframe cutting machine 160.

[Leadframe Cutting Machine 160]

Figure 16:
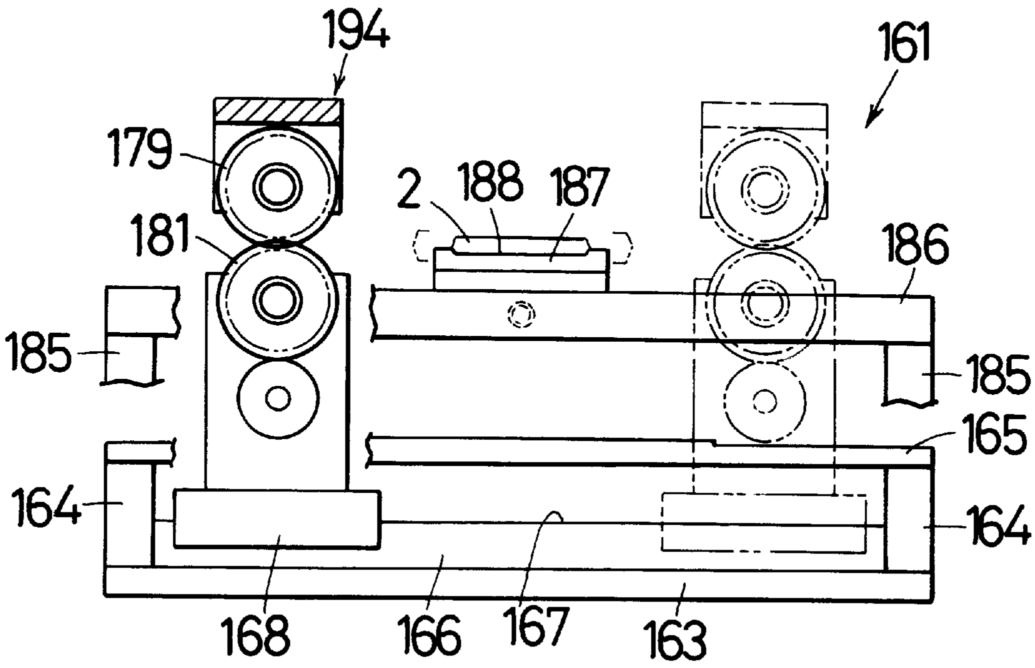
FIG. 16 is a partly-sectioned front view of a leadframe cutting machine that cuts a leadframe into individual chips.
Figure 17:
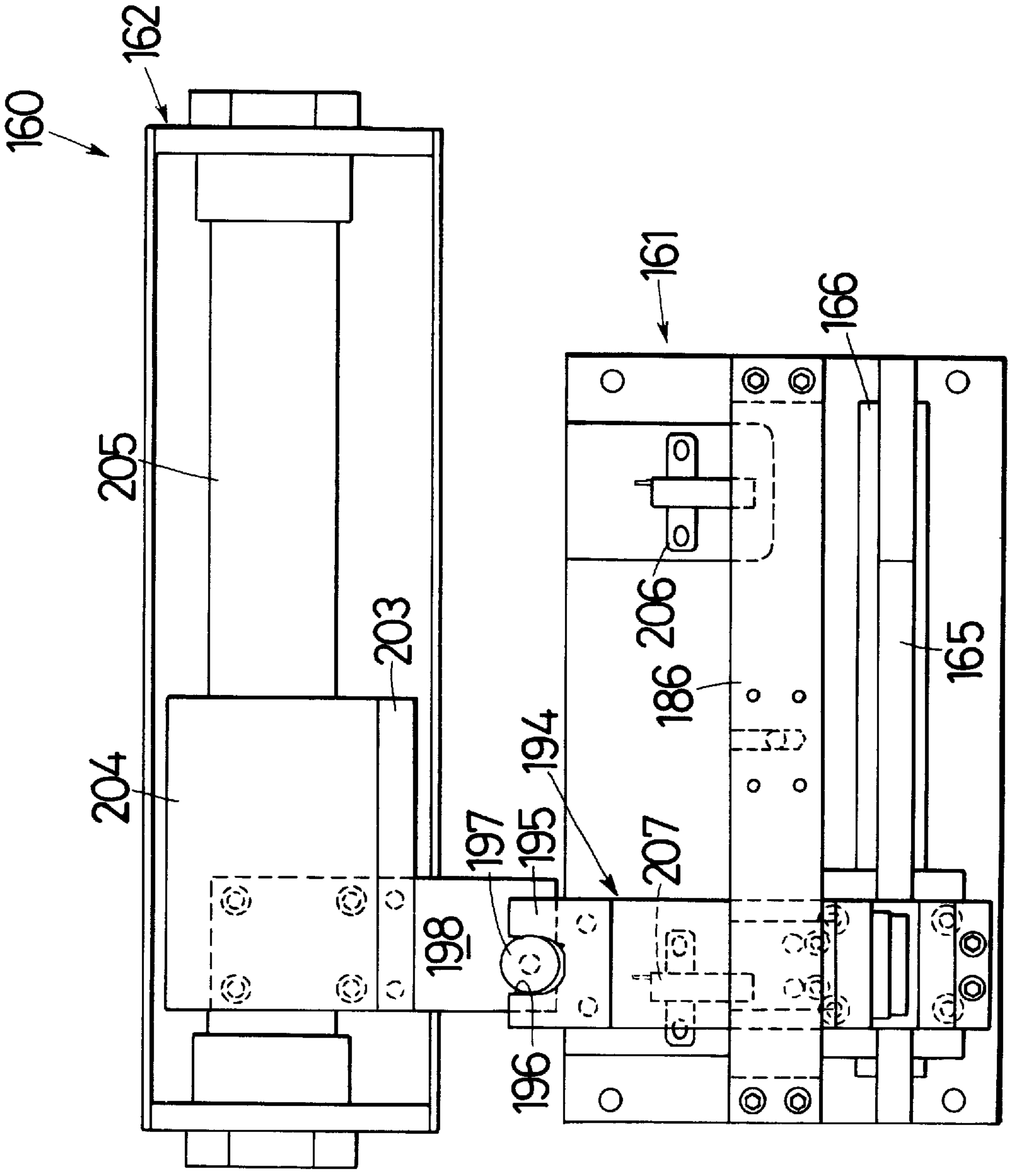
FIG. 17 is a plan view of the leadframe cutting machine shown in FIG. 16.
Figure 18:
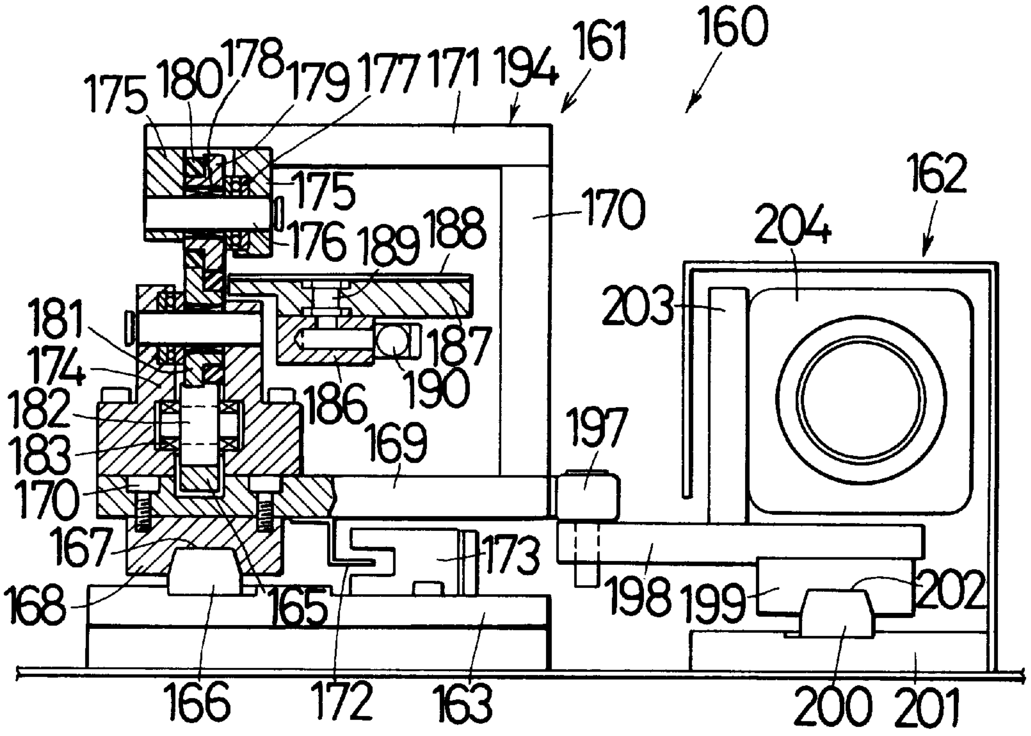
FIG. 18 is a sectional view showing a part containing rotary cutting blades.

FIGS. 16, 17 and 18 show the leadframe cutting machine 160 that cuts the leadframe 2 into each individual packaged IC 5. FIG. 16 is a front view, and FIG. 17 is a plan view. FIG. 18 is a sectional view showing a part containing rotary cutting blades. The leadframe cutting machine 160 comprises a rotary cutter 161 and a driver 162. The rotary cutter 161 cuts the packaged ICs 5, which are formed at a predetermined pitch on the leadframe 2 (see FIG. 1), into each individual packaged IC 5 to provide a single packaged IC 5. The driver 162 drives the rotary cutter 161 for cutting the leadframe 2.

The rotary cutter 161 has a plate-shaped base 163. Two support members 164 are stood on both ends, respectively, of the base 163. Both ends of a guide member 165 are secured to the upper ends of the two support members 164. The guide member 165 guides a rotary cutting blade 179 and a rotary cutting blade 181. A guide rail 166 is fixed on the base 163. A linear bearing 168 is movably mounted on a guideway 167 of the guide rail 166.

The lower surface of a lower plate 169 is secured to the upper surface of the linear bearing 168. The lower end of a vertical plate 170 is fixed on one end of the upper surface of the lower plate 169. One end of an upper plate 171 is secured to the upper end of the vertical plate 170. The lower plate 169, the vertical plate 170 and the upper plate 171 form a movable frame 194 in the shape of a rectangle, one side of which is open. A dog 172 is secured to the lower surface of the lower plate 169. A non-contact sensor 173 is disposed on the base 163. Movement of the movable frame 194 is detected by a combination of the dog 172 and the non-contact sensor 173 to determine the mechanical origin of the movable frame 194. One end of each of two parallel shaft support members 175 is secured to the distal end of the upper plate 171. Both ends of a rotary cutting blade shaft 176 are fixedly supported by the two shaft support members 175. The rotary cutting blade 179 is rotatably supported by the rotary cutting blade shaft 176 through a bearing 178. An annular elastic member 180 is wound around and secured to the outer periphery of the rotary cutting blade 179.

A thrust bearing 177 is disposed between the rotary cutting blade 179 and one shaft support member 175 to enable the rotary cutting blade 179 to rotate smoothly. A shaft support member 174 is fixed on the lower plate 169. The rotary cutting blade 181 is rotatably supported in the upper part of the shaft support member 174. The structure for supporting the rotary cutting blade 181 is similar to that for the rotary cutting blade 179; therefore, a description thereof is omitted. The support shaft of the rotary cutting blade 181 and the support shaft of the rotary cutting blade 179 are parallel to each other. The outer peripheral surface of the elastic member 180 provided on the rotary cutting blade 179 is in contact with the outer peripheral surface of the rotary cutting blade 181, and the outer peripheral surface of the elastic member provided on the rotary cutting blade 181 is in contact with the outer peripheral surface of the rotary cutting blade 179. A support roller 182 is in contact with the outer periphery of the rotary cutting blade 181. The support roller 182 is rotatably supported by the shaft support member 174 through a bearing 183.

The outer periphery of the support roller 182 is contacted and thus supported by the upper surface of the guide member 165. Thus, the support roller 182 allows the rotary cutting blade 181 to be supported by the guide member 165, thereby preventing deformation of the rotary cutting blade 181. Two vertical members 185 are disposed on the base 163. A table support member 186 is secured to the upper ends of the vertical members 185. A cutting table 187 for placing and fixing thereon the leadframe 2 transferred thereto is secured to the table support member 186. A mount surface 188 for placing the leadframe 2 is formed on the upper surface of the cutting table 187. A suction passage 189 is formed to extend through the center of the cutting table 187 and through the table support member 186. Air is sucked from a suction opening 190 through the suction passage 189 to produce a vacuum in the suction passage 189, thereby fixing the leadframe 2 on the mount surface 188.

A connecting plate 195 is secured to the back surface of the vertical plate 170 of the movable frame 194 (see FIG. 17). The connecting plate 195 is provided with a U-shaped groove 196. A cam follower 197 is inserted into the U-shaped groove 196. The cam follower 197 is secured to the distal end of a connecting plate 198. The lower end of a plate member 203 is secured to the connecting plate 198. A driven member 204 is integrally secured to the plate member 203. The driven member 204 is driven by a rodless cylinder 205. Both ends of the rodless cylinder 205 are secured to a base 201. A rail 200 is secured to the base 201.

A linear bearing 199 is secured to the lower surface of the connecting plate 198. The linear bearing 199 moves on a guideway 202 formed by the upper surface of the rail 200. It should be noted that both extremities of travel of the movable frame 194 are detected by travel extremity sensors 206 and 207, respectively. When the leadframe 2 is placed on the upper surface of the cutting table 187, the leadframe 2 is secured to the mount surface 188 by a negative pressure of air in the suction passage 189. When the rodless cylinder 205 is activated, the driven member 204 is driven to move on the guideway 202. As the driven member 204 moves, the movable frame 194 connected to the driven member 204 is moved. As the movable frame 194 moves on the upper surface of the guide rail 166, the leadframe 2 is put between the rotary cutting blade 179 and the rotary cutting blade 181 and cut by shearing.

[Second Transfer Device 210]

Figure 19:
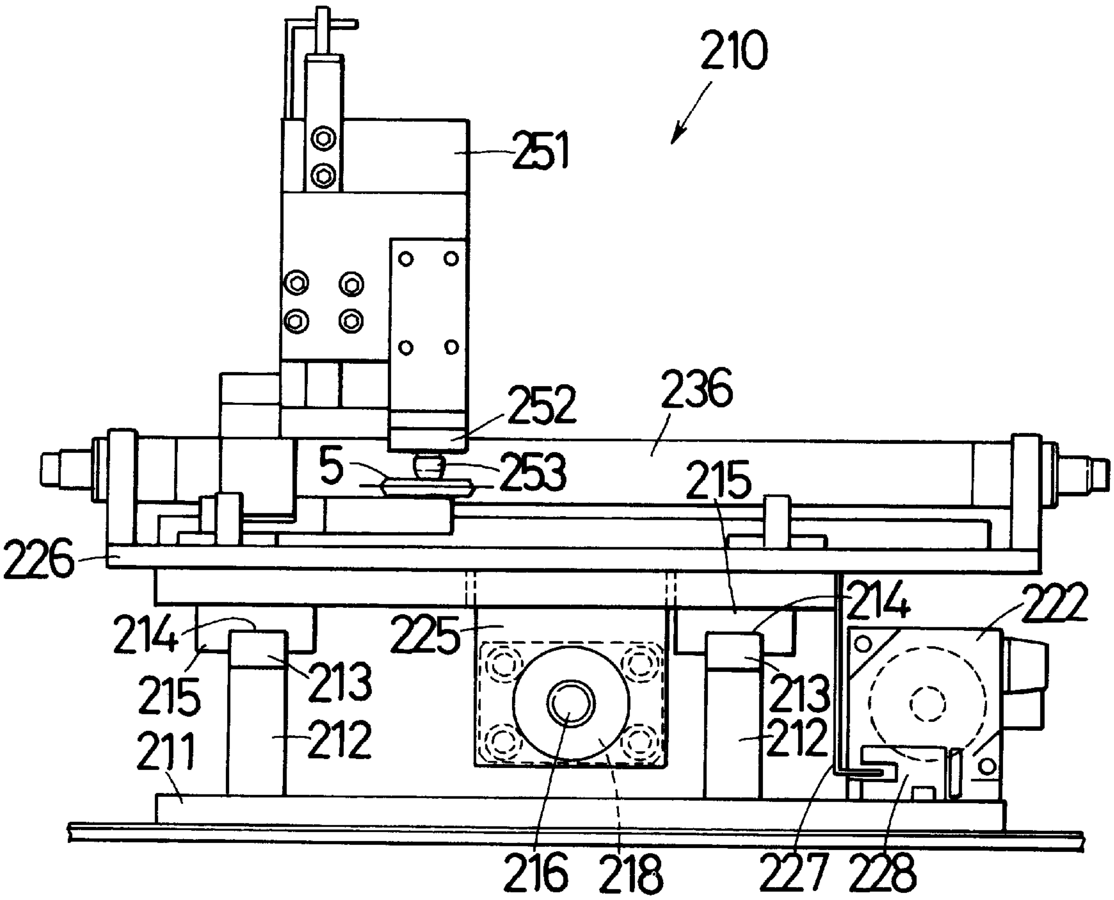
FIG. 19 is a front view showing a second transfer device.
Figure 20:
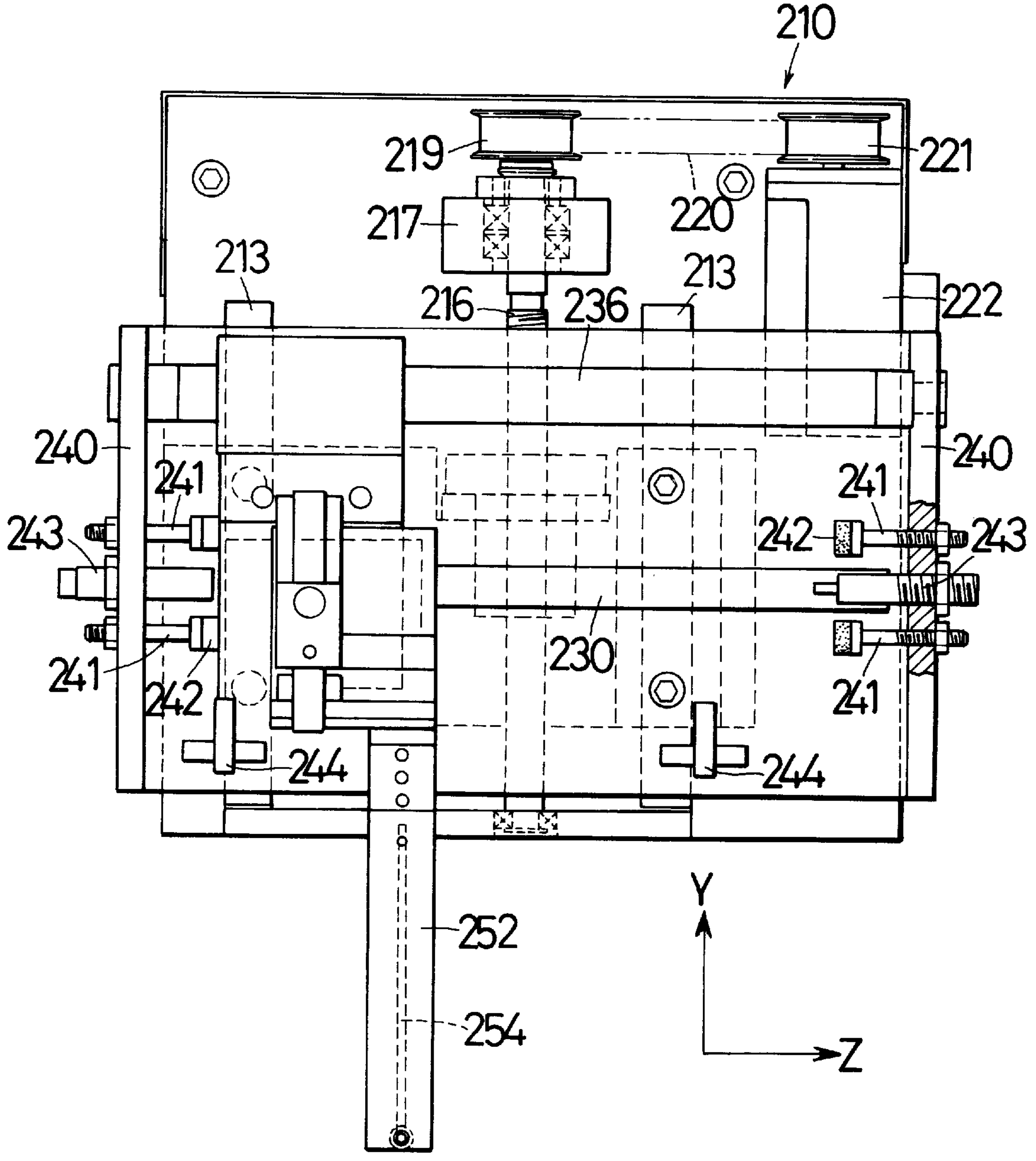
FIG. 20 is a plan view of the second transfer device shown in FIG. 19.
Figure 21:
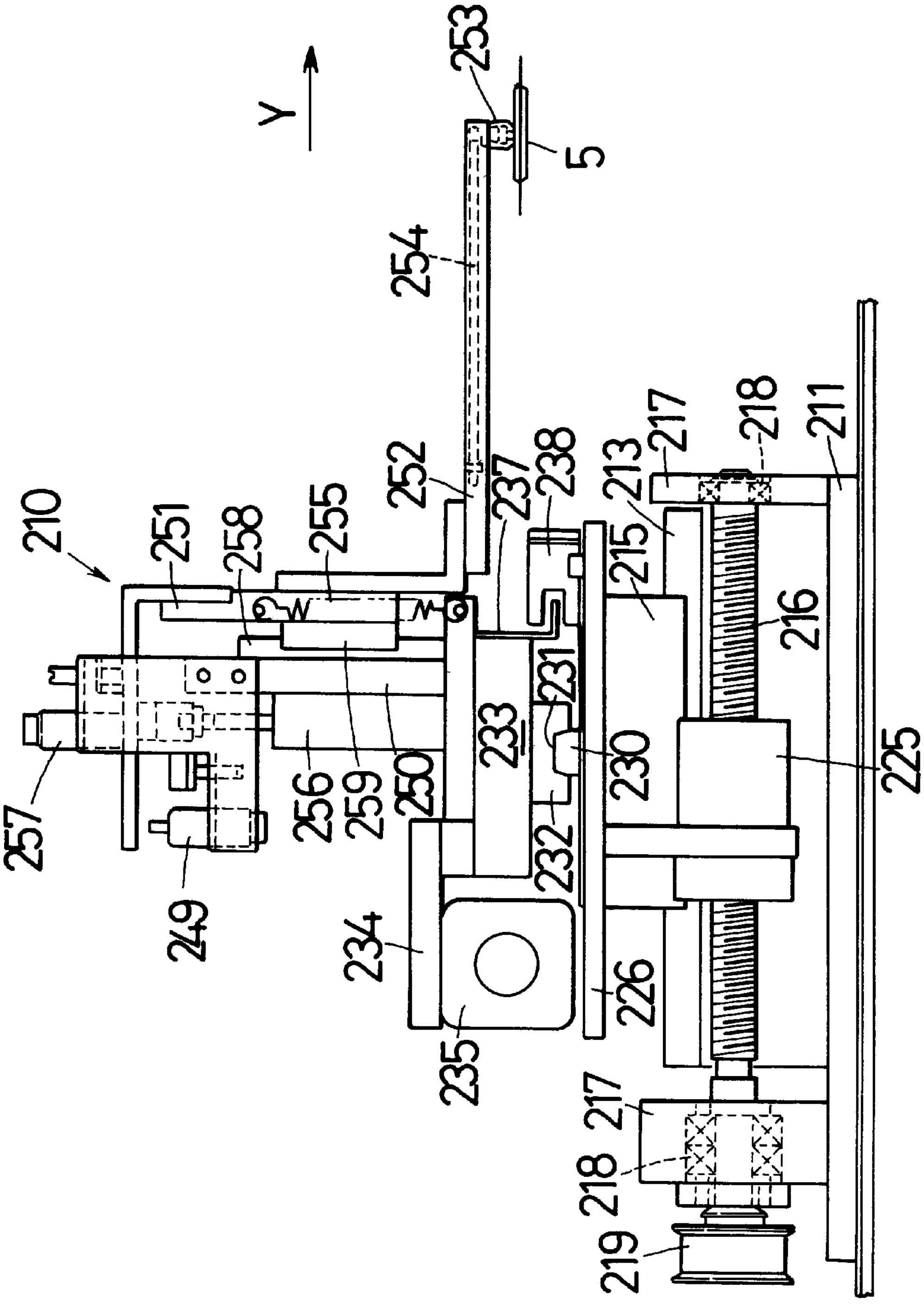
FIG. 21 is a side view of the second transfer device shown in FIG. 19 as viewed from the left-hand side thereof.

FIG. 19 is a front view showing the second transfer device 210. FIG. 20 is a plan view of the arrangement shown in FIG. 19. FIG. 21 is a side view of the arrangement shown in FIG. 19 as viewed from the left-hand side thereof. The second transfer device 210 transfers the packaged IC 5 cut from the leadframe 2 as an individual IC chip from the leadframe cutting machine 160 to the position of a rotary table of a lead processing machine indexing table 295. Support plates 212 are vertically provided on both ends, respectively, of a base 211. A rail 213 is secured to the upper end of each support plate 212. A linear bearing 215 is movably disposed on a guideway 214 formed by the upper surface of each rail 213. The linear bearings 215 are secured to the lower surface of a moving plate 226. A ball screw 216 is disposed in parallel to the rails 213. Both ends of the ball screw 216 are rotatably supported by respective bearings 218.

The bearings 218 are secured to respective bearing retaining members 217. The bearing retaining members 217 are provided on the base 211. Thus, the ball screw 216 is rotatably supported over the base 211. A timing pulley 219 is secured to one end of the ball screw 216. A servomotor 222 is fixed on the base 211. A timing pulley 221 is secured to an output shaft of the servomotor 222. A timing belt 220 is stretched between the timing pulley 219 and the timing pulley 221. A ball nut casing 225 is secured to the lower surface of the moving plate 226. The ball screw 216 is screwed into a ball nut secured in the ball nut casing 225.

A rail 230 is secured to the upper surface of the moving plate 226 to extend in a direction perpendicularly intersecting the ball screw 216. A linear bearing 232 is movably mounted on a guideway 231 formed by the upper surface of the rail 230. The linear bearing 232 is secured to the lower surface of a cross slide 233. Thus, the cross slide 233 is movable along the rail 230. A connecting plate 234 is secured to the upper surface of the cross slide 233. The connecting plate 234 is connected to a driven member 235. The driven member 235 is disposed to cover the outer peripheral surface of a rodless cylinder 236. Consequently, the rodless cylinder 236 drives the cross slide 233 to move along the guideway 231 of the rail 230. Stoppers 241 are disposed at the extremities of travel of the cross slide 233.

The stoppers 241 are secured to the moving plate 226. Cushioning members 242 made of a rubber material are secured to the distal ends of the stoppers 241, respectively. Shock absorbers 243 are disposed between the stoppers 241 in parallel to them. The shock absorbers 243 stop movement of the cross slide 233 and damp the velocity energy. The position of the mechanical origin of the cross slide 233 is detected by a combination of a dog 237 secured to the cross slide 233 and a non-contact sensor 238 fixed on the moving plate 226. A column 250 is vertically fixed on the cross slide 233. A rail 258 is vertically disposed on the column 250. An L-shaped vertically moving member 251 is disposed in the neighborhood of the column 250.

A linear bearing 259 is secured to the vertically moving member 251. The linear bearing 259 is guided by the rail 258. A tension spring 255 is interposed between the vertically moving member 251 and the cross slide 233 to pull them toward each other. One end of a horizontally disposed arm member 252 is secured to the lower end of the vertically moving member 251 through an L-shaped connecting member. The arm member 252 is provided with an air passage 254. A vacuum chuck 253 is provided at the distal end of the arm member 252. The vacuum chuck 253 holds the packaged IC 5 by suction. The vertically moving member 251 is connected to a rod of an air cylinder 256. The vertically moving member 251 is driven to move vertically by the air cylinder 256. The upper extremity of travel of the vertically moving member 251 is detected by an upper extremity contact sensor 257, and the lower extremity of travel of the vertically moving member 251 is detected by a lower extremity contact sensor 249.

[Operation of the Second Transfer Device 210]

As will be understood from the foregoing description of the structure, when the servomotor 222 is activated, the ball screw 216 is driven to rotate through the timing pulley 221, the timing belt 220 and the timing pulley 219. The rotation of the ball screw 216 causes the moving plate 226 to move in the Y-axis direction along the rails 213. When the rodless cylinder 236 is activated, the cross slide 233 is moved in the X-axis direction along the guideway 231 of the rail 230 through the driven member 235 and the connecting plate 234. The packaged IC 5 held by the vacuum chuck 253 can be moved to a desired plane position by the above drive. When the packaged IC 5 is held by the vacuum chuck 253 at a predetermined position, the packaged IC 5 is moved upwardly by the drive of the air cylinder 256. After being moved to a predetermined position, the vertically moving member 251 is moved downwardly by the air cylinder 256. Thereafter, the vacuum chuck 253 is opened, and thus the transfer of the packaged IC 5 is completed.

[Lead Processing Machine Table 260]

Figure 22:
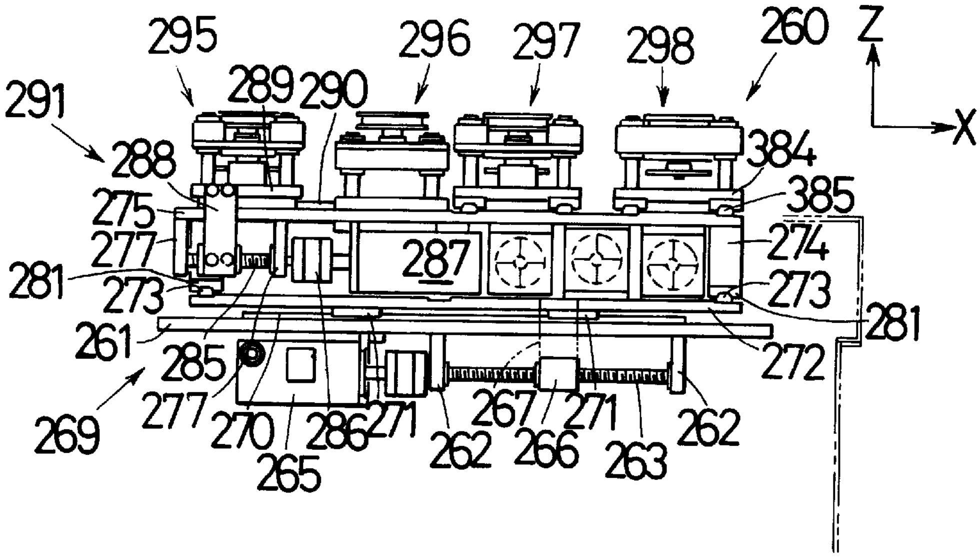
FIG. 22 is a front view showing a lead processing machine table.
Figure 23:
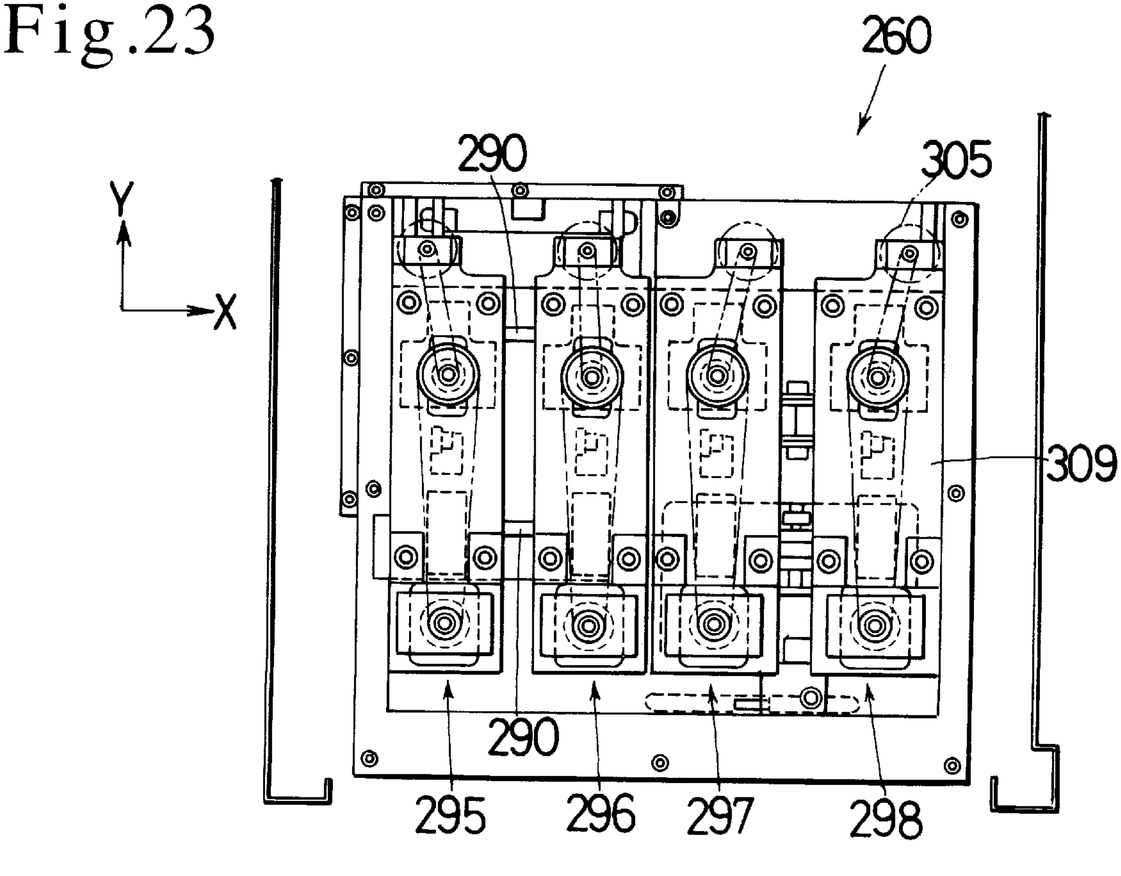
FIG. 23 is a plan view of the lead processing machine table shown in FIG. 22.
Figure 24:
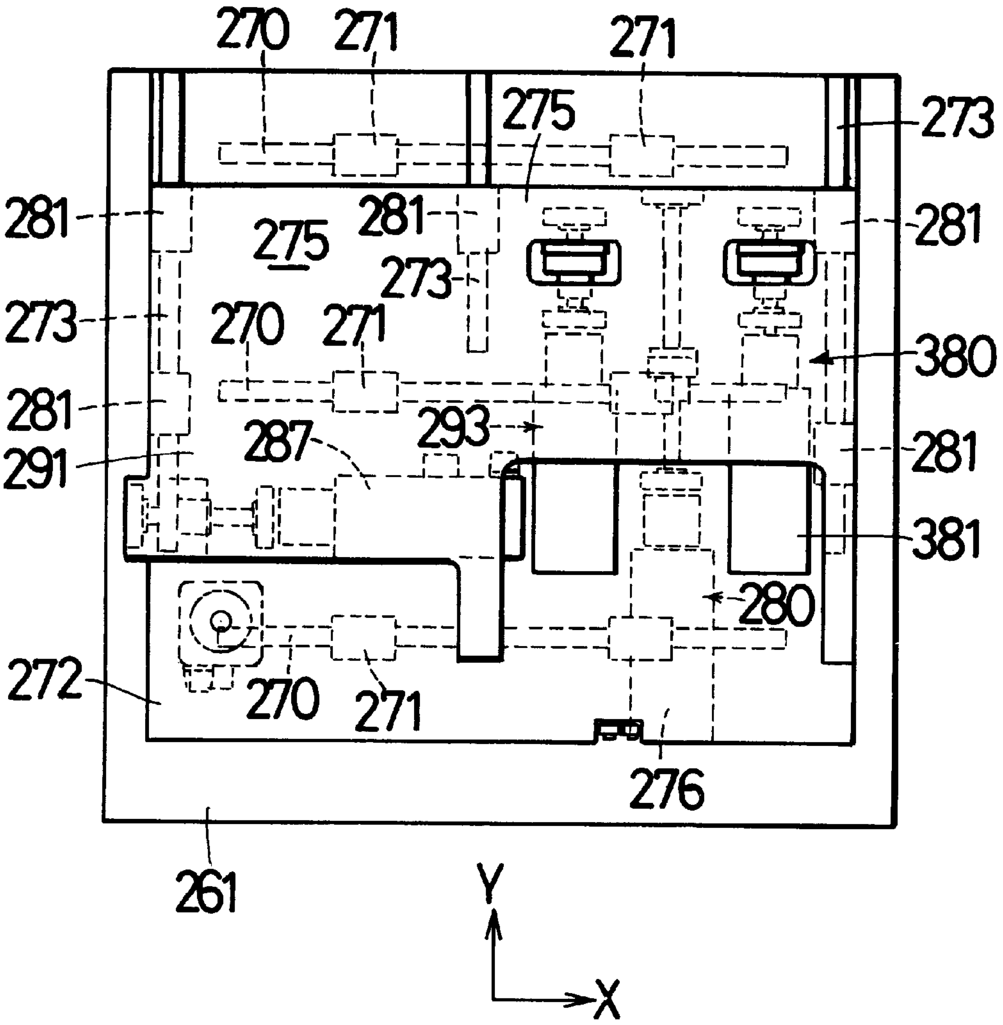
FIG. 24 is a diagram showing the lead processing machine table with four lead processing machine indexing tables removed therefrom.

FIGS. 22, 23, 24, 25, 26(*a*) and 26(*b*) show the lead processing machine table 260. FIG. 22 is a front view showing the lead processing machine table 260. FIG. 23 is a plan view of the arrangement shown in FIG. 22. FIG. 24 shows the lead processing machine table 260 with four lead processing machine indexing tables removed therefrom.

The lead processing machine table 260 is a processing table for transferring the packaged IC 5, which is transferred thereto after being cut by the leadframe cutting machine 160, to the position of the cutting die 330 and the lead bending machine 400 for mainly cutting the lead wires 3 of the packaged IC 5. The lead processing machine table 260 further rotates the packaged IC 5 for indexing in units of 90 degrees to cut the lead wires 3 on the four sides of the packaged IC 5. Four lead processing machine indexing tables 295, 296, 297 and 298 are disposed on the lead processing machine table 260. The lead processing machine indexing table 295 is an indexing table for cutting the pinch portions 6 at the four corners of the packaged IC 5 into an L shape. The lead processing machine indexing table 296 is an indexing table for cutting the dam portions 7 of the packaged IC 5, i.e. connecting portions that connect together the intermediate portions of a plurality of lead wires 3 so that the lead wires 3 do not separate from each other.

The lead processing machine indexing table 297 is an indexing table for cutting the lead distal end portions 8 of the packaged IC 5 at which the distal ends of a plurality of lead wires 3 are connected to each other so that the lead wires 3 do not separate from each other. The lead processing machine indexing table 298 is an indexing table for bending the lead wires 3 of the packaged IC 5 into a Z shape by the lead bending machine 400 (described later). The structure and function of the lead processing machine table 260 will be described below in detail. The lead processing machine table 260 has a base 261. Three rails 270 are disposed in parallel to each other on the base 261. A moving plate 272 is movably provided over the rails 270 through linear bearings 271. A ball screw 263 is disposed underneath the base 261 to extend in the X-axis direction in parallel to the lower surface of the base 261.

Bearing support members 262 are secured to the lower surface of the base 261. Both ends of the ball screw 263 are rotatably supported by respective bearings provided in the bearing support members 262. One end of the ball screw 263 is connected to an output shaft of an X-axis feed servomotor 265 through a joint. The ball screw 263 has a ball nut 266 screwed thereon. The ball nut 266 is secured to the moving plate 272 through a connecting member 267. When the X-axis feed servomotor 265 is activated to rotate the ball screw 263, the ball nut 266 moves, causing the moving plate 272 to move along the rails 270. Thus, the moving plate 272 is moved in a direction (X-axis direction) perpendicularly intersecting a direction (Y-axis direction) in which the cutting die 330 and the lead bending machine 400 lie in series to the lead processing machine table 260. The X-axis feed servomotor 265, the ball screw 263, the ball nut 266, etc. constitute an X-axis feed servo mechanism 269. The X-axis feed servo mechanism 269 drives the moving plate 272 to move in the X-axis direction by a distance given by a command.

A cross slide 275 is mounted over the moving plate 272 with a vertical space provided therebetween. In the vertical space, a Y-axis feed servo mechanism 280 (see FIG. 24) substantially similar to the X-axis feed servo mechanism 269 is disposed to drive the cross slide 275 in a direction crossing the direction of movement of the moving plate 272. The upper ends of support members 274 are secured to the lower surface of the cross slide 275. Linear bearings 281 are secured to the lower ends of the support members 274, respectively. The linear bearings 281 are movable on cross rails 273, respectively. In the Y-axis feed servo mechanism 280, when a servomotor 276 is activated, the cross slide 275 is driven to rotate in the Y-axis direction along the rails 273. The Y-axis feed servo mechanism 280 is substantially the same as the X-axis feed servo mechanism 269; therefore, a detailed description thereof is omitted. As will be understood from the foregoing description, the four lead processing machine indexing tables 295, 296, 297 and 298 mounted on the cross slide 275 can be moved to any position in the XY-plane.

The Y-axis feed servo mechanism 280 (see FIG. 24) driven by the servomotor 276 causes the cross slide 275 to move in a direction in which the cutting die 330 and the lead bending machine 400 are located in series to the lead processing machine table 260. The lead processing machine indexing table 295 is an indexing table for cutting the pinch portions 6 at the four corners of the packaged IC 5 into an L shape. The lead processing machine indexing table 296 is an indexing table for cutting the dam portions 7 of the packaged IC 5, i.e. connecting portions that connect together the intermediate portions of a plurality of lead wires 3 so that the lead wires 3 do not separate from each other.

[X-axis Direction Feed Correction Driving Mechanism 291 for the Lead Processing Machine Indexing Table 295]

As shown in FIGS. 22, bearing support members 277 are secured to the lower surface of the cross slide 275. Both ends of a ball screw 285 are rotatably supported by respective bearings provided in the bearing support members 277. One end of the ball screw 285 is connected to an output shaft of a servomotor 287 through a joint 286. The ball screw 285 has a ball nut screwed thereon.

The ball nut is secured to an indexing table plate 289 through a connecting member 288. The table plate 289 is secured on two rails 290 disposed on the cross slide 275. The lead processing machine indexing table 295 is mounted on the table plate 289. Thus, the servomotor 287 and so forth constitute an X-axis direction feed correction driving mechanism 291. The X-axis direction feed correction driving mechanism 291 makes correction of the feed in the X-axis direction of the lead processing machine indexing table 295, thereby precisely correcting the position for machining the lead wires 3.

[Lead Processing Machine Indexing Table 295]

The lead processing machine indexing table 295 is a table that secures the packaged IC 5, and it is a machining table for indexing the packaged IC 5 to a rotational angle position and correcting the position of the packaged IC 5 in the Y-axis direction to cut the pinch portions 6 of the lead wires 3 at the four corners of the packaged IC 5. To cut the pinch portions 6 into an L shape, positioning must be effected in both the X- and Y-axis directions. Correction control for the feed in the Y-axis direction is effected by the Y-axis feed servo mechanism 280 (see FIG. 24). More specifically, the servomotor 276 is activated to drive the cross slide 275 to move in the Y-axis direction along the rails 273. Correction control for the feed in the X-axis direction is effected by the X-axis direction feed correction driving mechanism 291 (see FIG. 22). The structures and functions of the other portions of the lead processing machine indexing table 295 are the same as those of the lead processing machine indexing table 298 (described later); therefore, a detailed description and illustration thereof are omitted.

[Lead Processing Machine Indexing Table 296]

Figure 26:
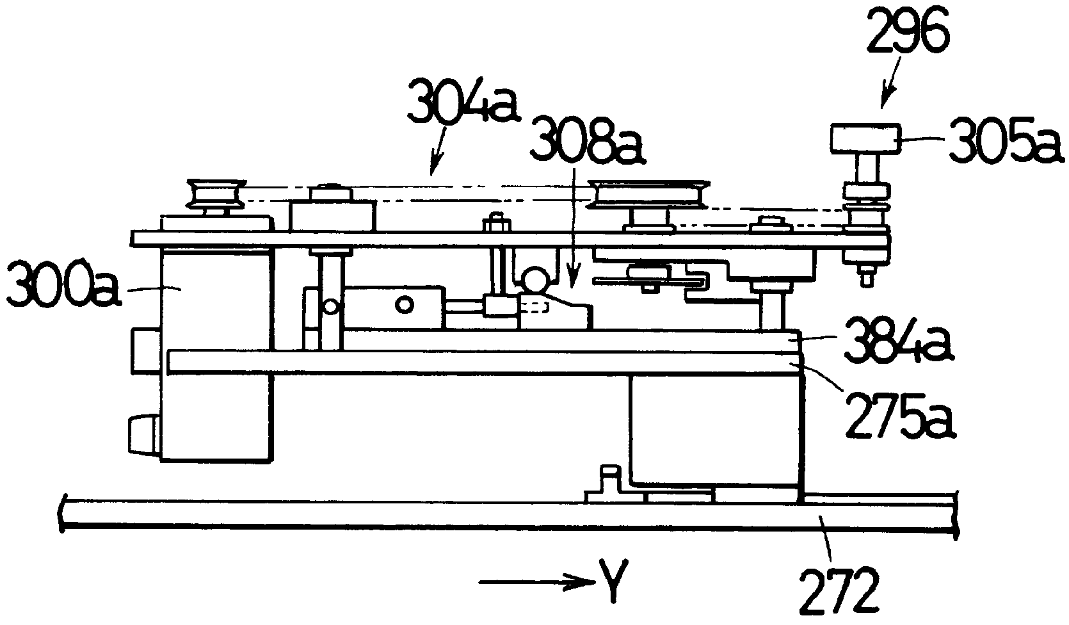
FIG. 26(*a*) is a side view of another lead processing machine indexing table, and FIG. 26(*b*) is an enlarged sectional view of a vacuum chuck.
Figure 26:
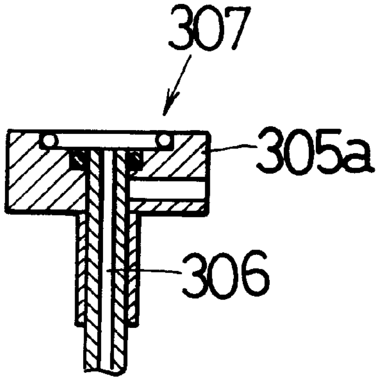

FIG. 26(*a*) is a side view of the lead processing machine indexing table 296. FIG. 26(*b*) is an enlarged view of a vacuum chuck of the lead processing machine indexing table 296. The lead processing machine indexing table 296 is a table that secures the packaged IC 5, and it is a machining table for indexing the packaged IC 5 to a rotational angle position to cut four dam portions 7 of the packaged IC 5, i.e. connecting portions that connect together the intermediate portions of a plurality of lead wires 3 so that the lead wires 3 do not separate from each other. To cut the dam portions 7, the position of the lead processing machine indexing table 296 is determined according to the positions in the X- and Y-axis directions of the dam portions 7. Positioning of the other lead processing machine indexing tables 295, 297 and 298 is effected on the basis of the positions of the dam portions 7.

The determination of the position in the X-axis direction is made by driving the X-axis feed servomotor 265 to position the moving plate 272. The determination of the position in the Y-axis direction-is made by the Y-axis feed servo mechanism 280. Accordingly, the lead processing machine indexing table 296 for cutting the dam portions 7 has no position correcting function for either of the X- and Y-axis directions.

FIG. 26(*a*) is a side view of the lead processing machine indexing table 296. Rotation of a servomotor 300*a* causes a rotary table 305*a* to rotate for indexing through a speed reduction mechanism 304*a*. A table plate 384*a* is immovably fixed on a cross slide 275*a*. An air passage 306 is provided in the center of the rotary table 305*a* to form a vacuum chuck 307 that holds the packaged IC 5 by a vacuum produced by sucking air from the air passage 306. Vertical movement of the rotary table 305*a* is performed by a rotary table vertically driving mechanism 308*a* that is the same as the mechanism described later.

[Lead Processing Machine Indexing Table 297]

The lead processing machine indexing table 297 is a table that secures the packaged IC 5, and it is a machining table for indexing the packaged IC 5 to a rotational angle position and correcting the position in the Y-axis direction to cut the lead distal end portions 8 of the packaged IC 5 at which the distal ends of a plurality of lead wires 3 are connected to each other so that the lead wires 3 do not separate from each other. To cut the distal ends of the lead wires 3 of the packaged IC 5, the lead processing machine indexing table 297 is positioned by moving it in the Y-axis direction, in which the cutting die 330 is located in series to the lead processing machine indexing table 297. The lead processing machine indexing table 297 needs only positioning in the Y-axis direction and does not require positioning in the X-axis direction.

Correction of the position of the lead processing machine indexing table 297 in the Y-axis direction is made by a Y-axis direction feed correction driving mechanism 293 (see FIG. 24). The Y-axis direction feed correction driving mechanism 293 is used to finely correct the position of the lead processing machine indexing table 297 in the Y-axis direction during the cutting process. Accordingly, the structures and functions of the lead processing machine indexing table 297 and the Y-axis direction feed correction driving mechanism 293 are substantially the same as those of the lead processing machine indexing table 298 and a feed correction driving mechanism 380 (described later); therefore, a detailed description and illustration thereof are omitted.

[Y-axis Direction Feed Correction Driving Mechanism 380 of the Lead Processing Machine Indexing Table 298]

Figure 25:
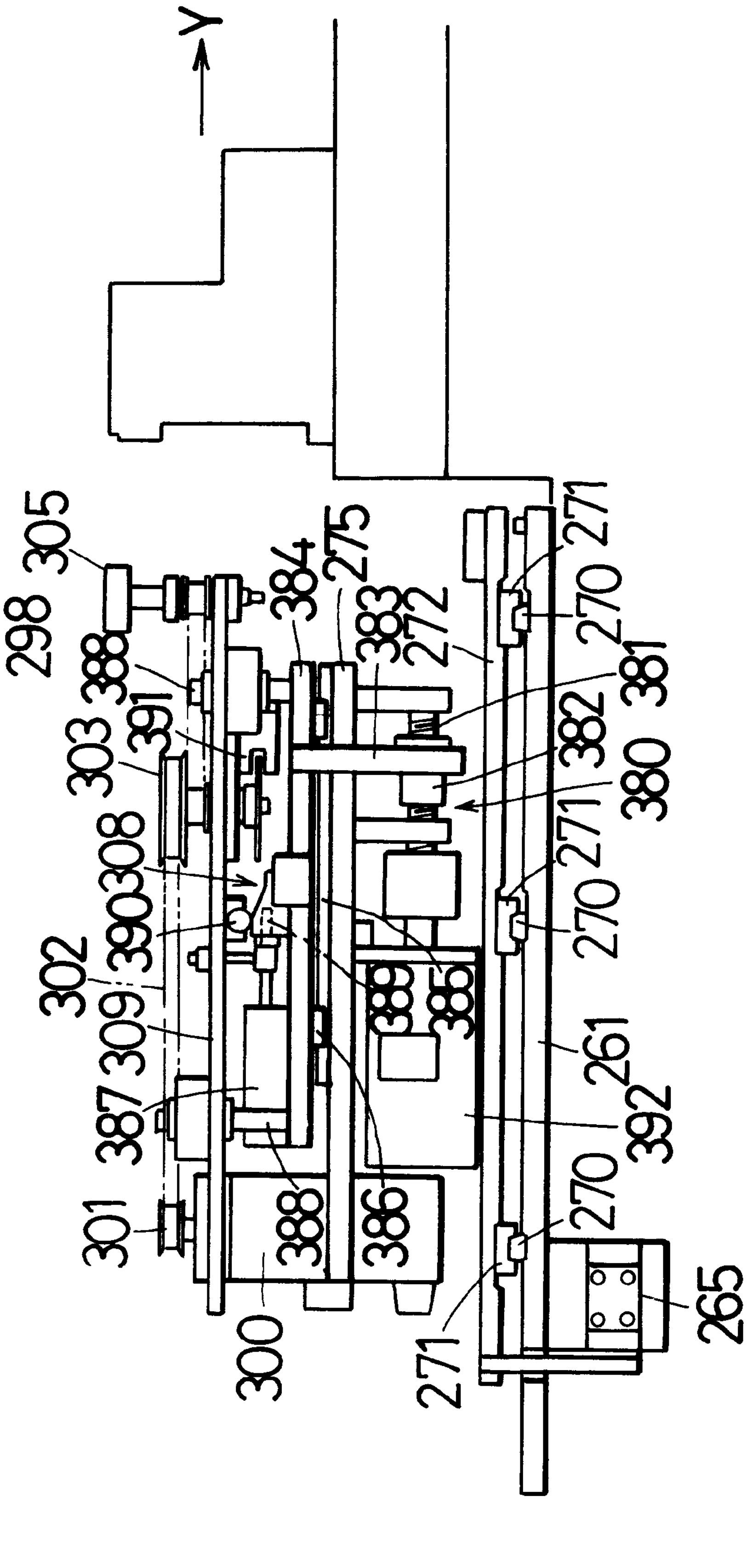
FIG. 25 is a side view of a lead processing machine indexing table.

FIG. 25 is a side view of the lead processing machine indexing table 298. The lead processing machine indexing table 298 is a table that secures the packaged IC 5, and it is a machining table for indexing the packaged IC 5 to a rotational angle position and correcting the position in the Y-axis direction to bend the distal ends of the lead wires 3 of the packaged IC 5. The bending step is the final step of the machining process. Two linear rails 385 are disposed on the cross slide 275. A table plate 384 is provided over the linear rails 385 through linear guides 386 so as to be movable in the Y-axis direction.

The lead processing machine indexing table 298 is mounted on the table plate 384. The table plate 384 is secured to a ball nut 382 through a connecting member 383. The ball nut 382 is screwed on a ball screw 381. The ball screw 381 is rotatably supported by the cross slide 275 and connected to a Y-axis correction servomotor 392. When the Y-axis correction servomotor 392 is activated, the table plate 384 is driven to rotate in the Y-axis direction. The Y-axis correction servomotor 392, the ball screw 381, the ball nut 382, the connecting member 383, etc. constitute a Y-axis direction feed correction driving mechanism 380. The Y-axis direction feed correction driving mechanism 380 is used to finely correct the position of the lead processing machine indexing table 298 in the Y-axis direction during the bending process.

[Lead Processing Machine Indexing Table 298]

The lead processing machine indexing table 298 is mounted on the table plate 384. The lower ends of four support posts 388 are secured to the table plate 384. The support posts 388 vertically movably support a rectangular plate member 309 through bearings. The plate member 309 is the main body of the lead processing machine indexing table 298. A timing pulley 301 is secured to an output shaft of a servomotor 300. A timing pulley 303 is secured to a shaft rotatably provided on the plate member 309 at a position away from the timing pulley 301.

A timing belt 302 is stretched between the timing pulley 301 and the timing pulley 303 to transmit the rotation of the servomotor 300 to the timing pulley 303 after the speed thereof has been reduced. The shaft having the timing pulley 303 secured thereto has another timing pulley secured thereto below and in a coaxial relation to the timing pulley 303. The rotation of this timing pulley is transmitted to the rotary table 305. Thus, the timing pulley 301, the timing belt 302, the timing pulley 303, etc. constitute a speed reduction mechanism 304 for indexing the rotary table 305 to a predetermined angle position.

Detection of the indexed angle position of the rotary table 305 is effected by detecting a disk connected to the shaft of the timing pulley 303 with an angle detecting sensor 391, which is a photosensor. The rotary table 305 is rotated through a predetermined angle by the speed reduction mechanism 304 to effect desired indexing. The rotary table 305 secures the packaged IC 5 by holding it with a vacuum chuck incorporated therein. After being transferred (in the Y-axis direction) to the IC lead bending machine 400, the packaged IC 5 held on the rotary table 305 must be lowered to the position for working by the IC lead bending machine 400 and raised upon completion of the working.

The vertical movement of the rotary table 305 is effected by a rotary table vertically driving mechanism 308. A cylinder 387 is mounted on the table plate 384. A cam 389 is secured to the distal end of a piston rod of the cylinder 387. The cam 389 is contacted by a cam follower 390. The cam follower 390 is secured to the back surface of the plate member 309. When the cylinder 387 is driven, the cam 389 moves, and the cam follower 390 contacting the cam 389 follows it, causing the plate member 309 to move upward. Consequently, the rotary table 305 mounted on the plate member 309 moves upward. Lowering of the rotary table 305 is effected by an operation reverse to the operation for raising the rotary table 305.

[Third Transfer Device 310]

Figure 27:
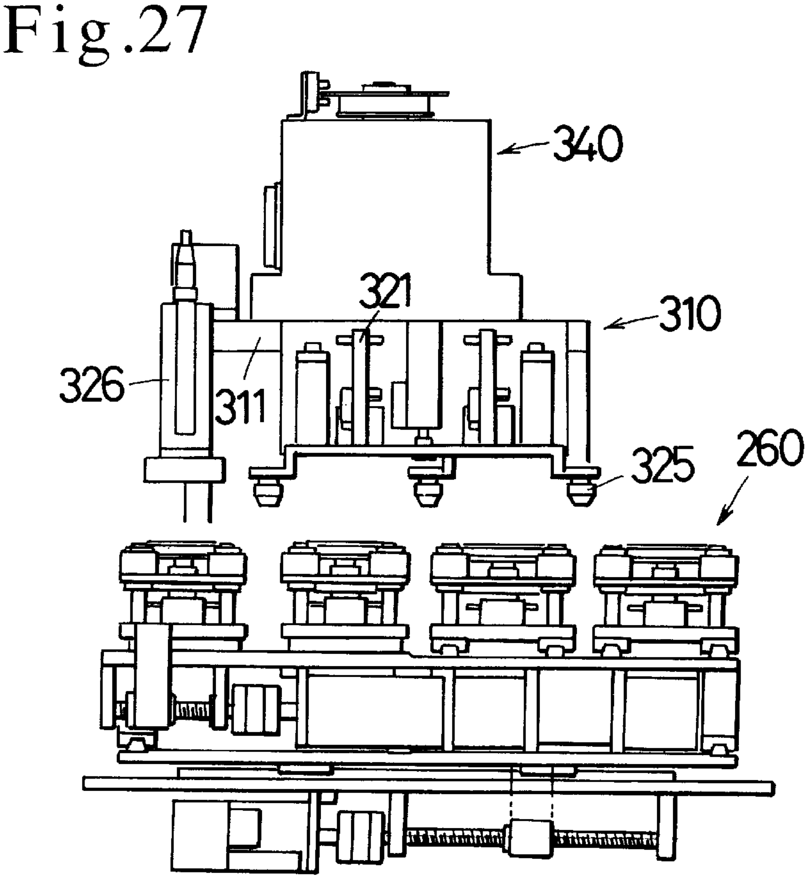
FIG. 27 is a front view showing a third transfer device as placed in the IC leadframe processing system.
Figure 28:
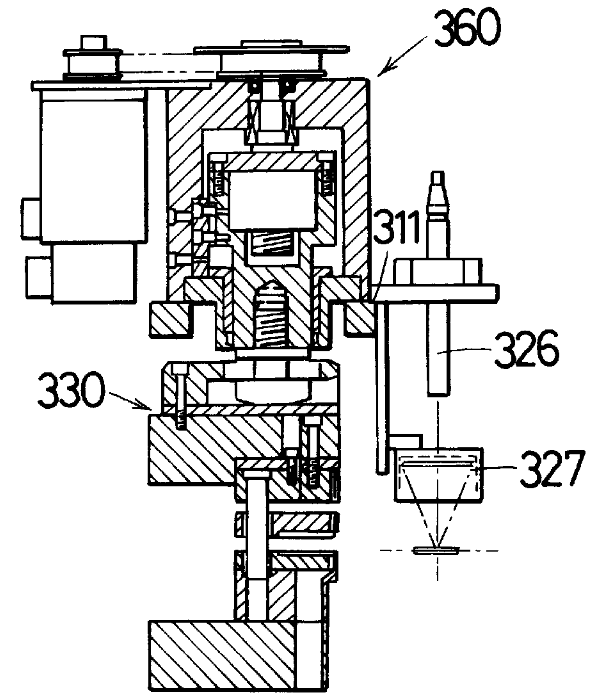
FIG. 28 is a side view of the third transfer device shown in FIG. 27 as viewed from the left-hand side thereof.
Figure 29:
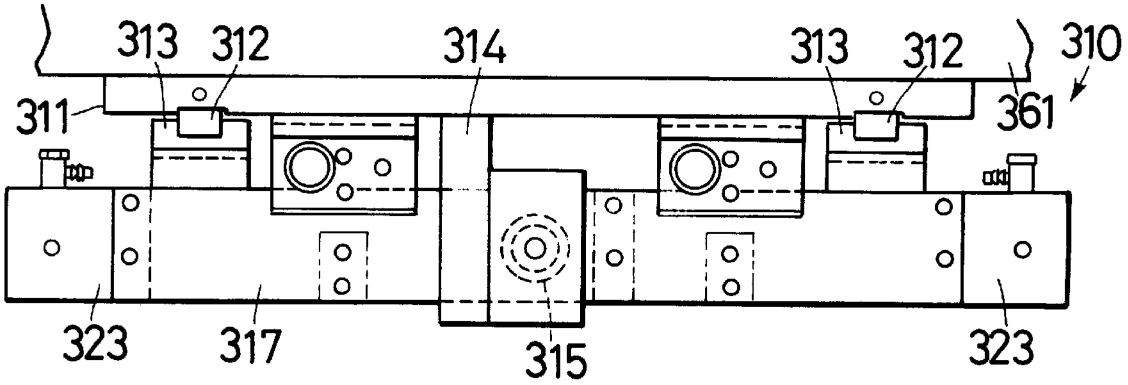
FIG. 29(*a*) is a plan view of the third transfer device, and FIG. 29(*b*) is a front view of the third transfer device.
Figure 29:
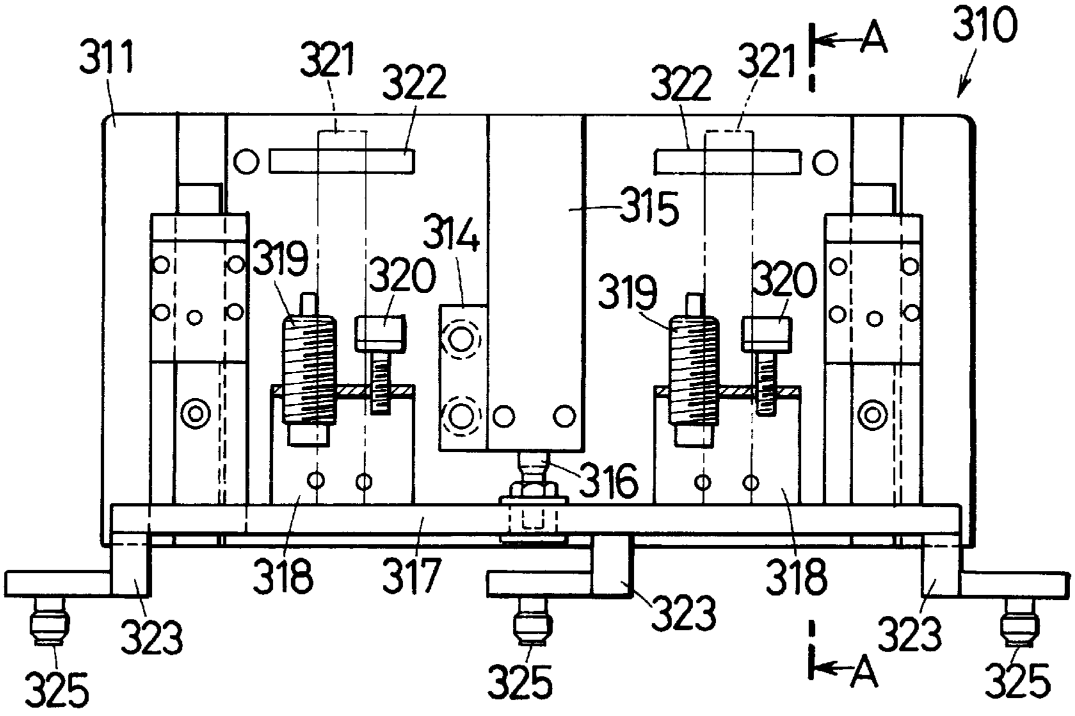
Figure 30:
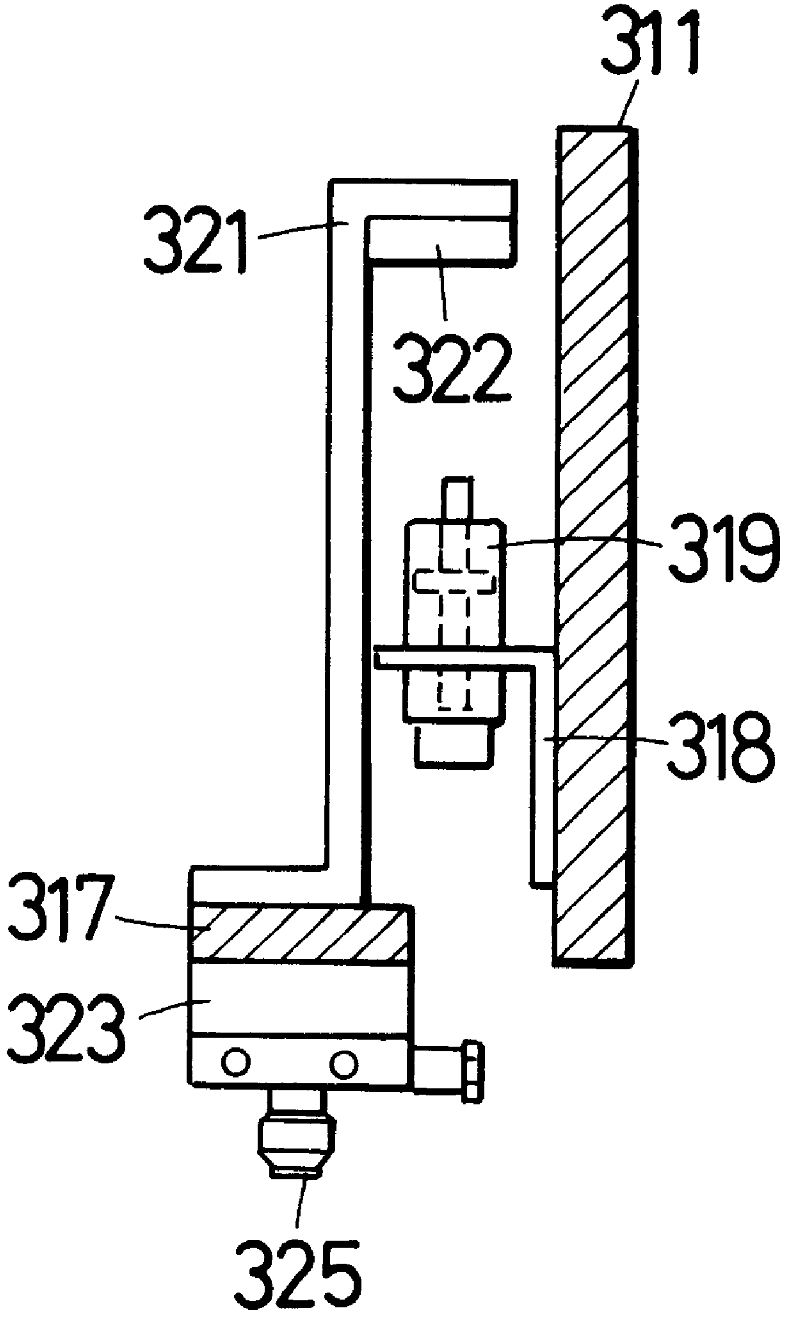
FIG. 30 is a sectional view taken along the line A—A in FIG. 29(*b*).

FIGS. 27, 28, 29(*a*), 29(*b*) and 30 show the third transfer device 310. FIG. 27 is a front view showing the third transfer device 310 as incorporated into the system. FIG. 28 is a side view of the arrangement shown in FIG. 27 as viewed from the left-hand side thereof. FIG. 29(*a*) is a plan view of the third transfer device. FIG. 29(*b*) is a front view of the third transfer device. FIG. 30 is a sectional view taken along the line A—A in FIG. 29(*b*). The third transfer device 310 is fixed on the front side of the press machine 360 (described later). A rectangular plate 311 made of a sheet metal material is secured to a base 361 of the press machine 360.

Two rails 312 are vertically fixed on the front side of the plate 311. Linear bearings 313 are movably disposed on the guideways of the rails 312, respectively. A pneumatically-driven cylinder 315 is secured to the plate 311 by a mounting member 314. The cylinder 315 is disposed parallel to the rails 312. A vertically moving arm 317 is secured to the two linear bearings 313 through mounting members. A piston rod 316 of the cylinder 315 is secured to the vertically moving arm 317.

Shock absorbers 319 and stoppers 320 are secured to the front side of the plate 311 through L-shaped mounting members 318. The lower ends of Z-shaped dog support members 321 are secured to the vertically moving arm 317. Dogs 322 are secured to the upper ends of the dog support members 321, respectively. When the cylinder 315 is driven, the vertically moving arm 317 moves vertically. The dogs 322 first come into contact with the respective shock absorbers 319. Thus, the speed of the vertically moving arm 317 is reduced, and thereafter, the dogs 322 are stopped by the respective stoppers 320.

Three vacuum chucks 325 are secured to the lower surface of the vertically moving arm 317 through respective L-shaped mounting members 323. The vacuum chucks 325 are disposed at equally spaced positions, respectively, so as to be coincident with intervals at which the rotary tables 305 of the four lead processing machine indexing tables 295, 296, 297 and 298 are disposed.

Accordingly, the third transfer device 310 simultaneously holds three packaged ICs 5 by the vacuum chucks 325 and vertically moves the packaged ICs 5 by the vertical drive (Z-axis direction) of the cylinder 315. Moreover, the third transfer device 310 transfers the packaged ICs 5 to the subsequent rotary tables 305, respectively, by the horizontal movement (X-axis direction) of the lead processing machine table 260. More specifically, the vertical movement for holding or releasing the packaged ICs 5 is effected by the cylinder 315, and the horizontal transfer of the packaged ICs 5 is effected by horizontal movement of the lead processing machine table 260. Accordingly, the vacuum chucks 325 of the third transfer device 310 simultaneously hold three packaged ICs 5 in response to the vertical drive of the cylinder 315 and transfer the packaged ICs 5 to the respective indexing tables 305 of the lead processing machine indexing tables 295 to 298 in units of one pitch.

A CCD camera 326 is disposed on a side of the base 311 of the third transfer device 310, A light 327 as a light source is disposed directly below the CCD camera 326. The CCD camera 326 is used to identify the center position, type, etc. of the packaged IC 5 placed on the lead processing machine indexing table 295 and illuminated by the light 327. The type of the packaged IC 5 is identified by measuring the shape of the package, the shape of the leadframe 2, etc., together with the number, size, etc. of lead wires 3, and comparing the measured data with previously input data.

After the center position of the packaged IC 5 has been measured, the rotary tables 305 of the lead processing machine indexing tables 295 to 298 are positioned so as to coincide with the center position. In this embodiment, the lead processing machine indexing table 296 is positioned on the basis of the result of the measurement, and positioning of the other three lead processing machine indexing tables 295, 297 and 298 is effected on the basis of the X- and Y-axis positions of the dam portions 7.

[Cutting Die 330]

Figure 31:
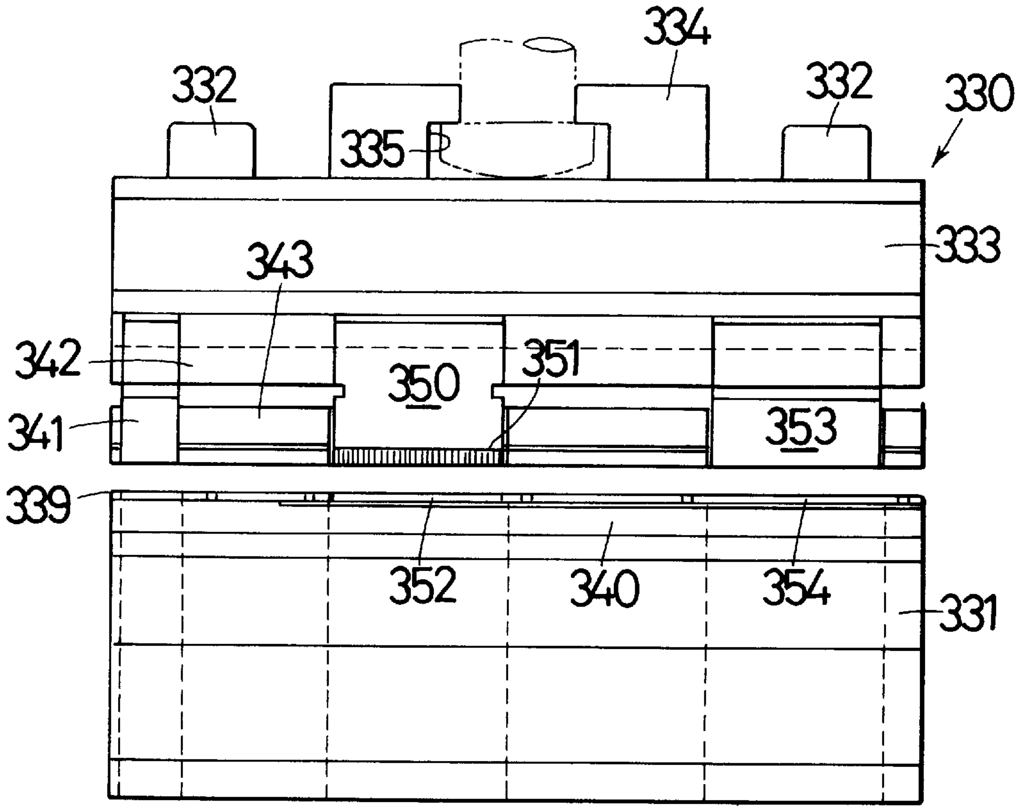
FIG. 31 is a front view showing a cutting die.
Figure 32:
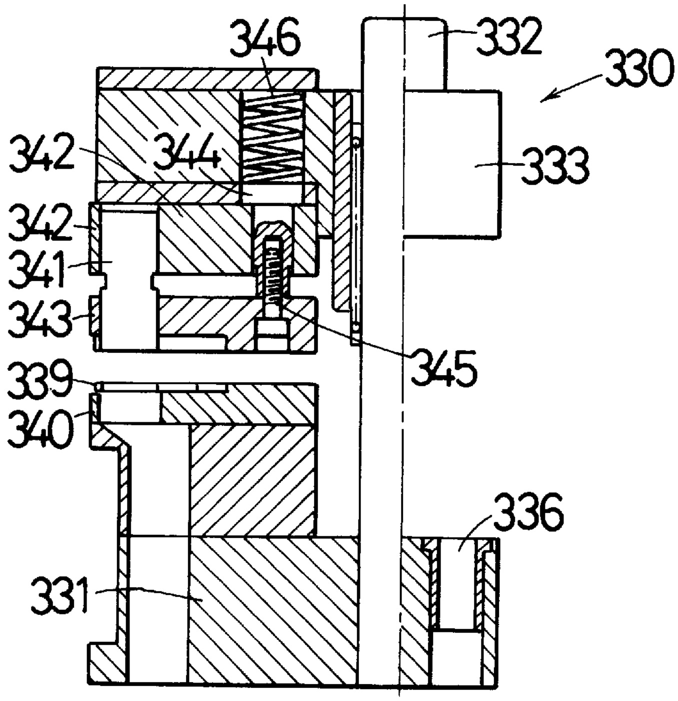
FIG. 32 is a sectional view of the cutting die shown in FIG. 31, showing a cutting die portion for cutting pinch portions of a packaged IC.
Figure 33:
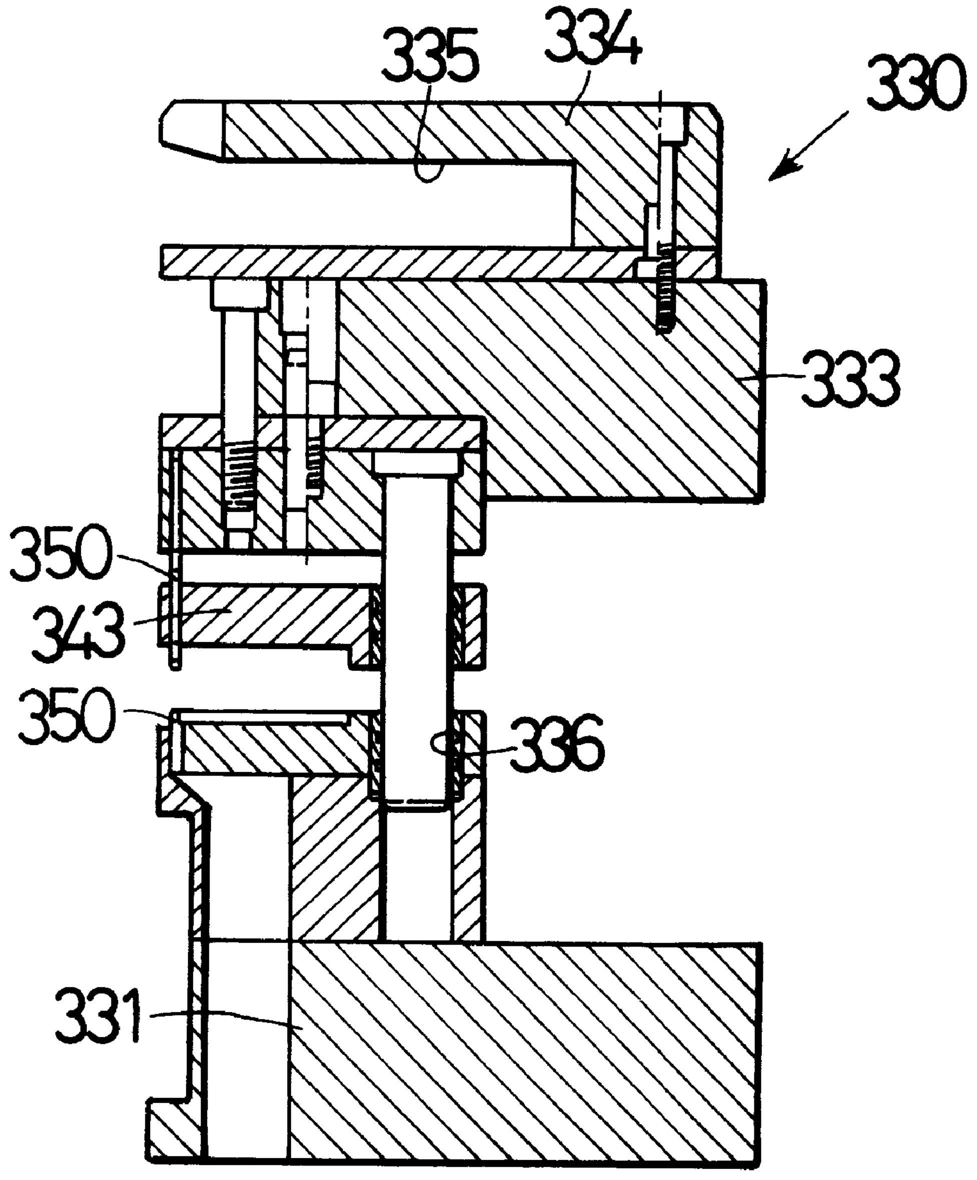
FIG. 33 is a sectional view of the cutting die shown in FIG. 31, showing a cutting die portion for cutting dam portions of a packaged IC.
Figure 34:
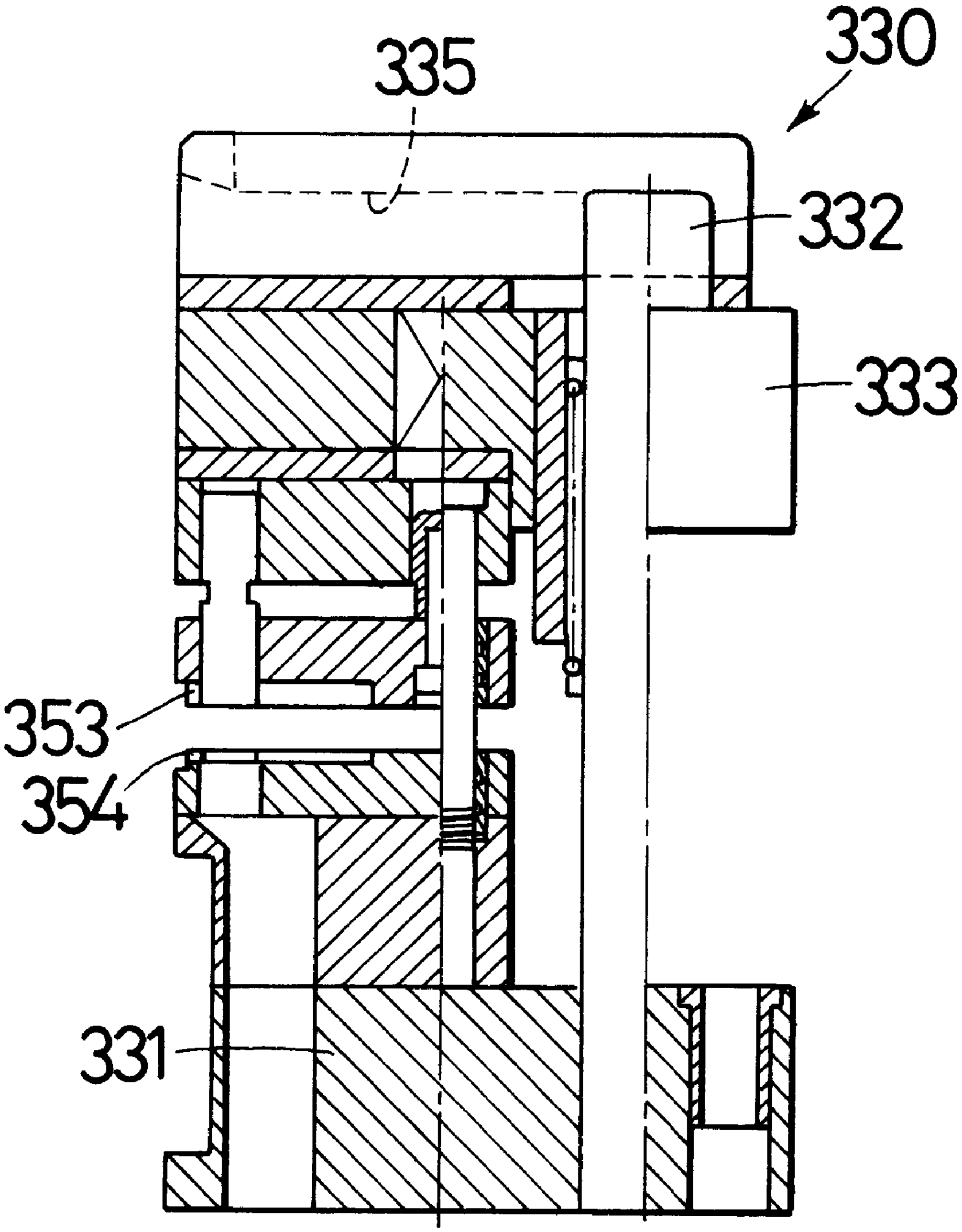
FIG. 34 is a sectional view of the cutting die shown in FIG. 31, showing a cutting die portion for cutting lead distal end portions.

FIGS. 31, 32, 33 and 34 show the cutting die 330. FIG. 31 is a general front view showing the whole cutting die 330. FIG. 32 is a fragmentary sectional view showing a pinch cutting die portion for cutting the four corners of the packaged IC 5 into an L shape. FIG. 33 is a fragmentary sectional view showing a cutting die portion for cutting the dam portions 7. FIG. 34 is a fragmentary sectional view showing a cutting die portion for cutting the lead distal end portions 8. The cutting die 330 has a base 331 having a discharge space for receiving cuttings removed from packaged ICs 5. A die retaining plate 340 is mounted on the base 331.

The die retaining plate 340 retains a die for cutting. The die retaining plate 340 has a hole formed to correspond to the cuttings discharge space. Therefore, it is possible to discharge cuttings removed from packaged ICs 5 by the cutting die. A pinch cutting lower die member 339 is secured to the upper surface of the die retaining plate 340. The lower ends of two sleeves 332 are secured to the base 331. A movable plate 333 is vertically movably guided by the sleeves 332. The movable plate 333 has a joint 334 integrally formed with the top thereof so that the movable plate 333 is driven by the press machine 360 (see FIG. 35; described later) through the joint 334.

The joint 334 has a T-shaped socket 335 formed therein. A joint of the press machine 360 is connected to the socket 335. A die retaining plate 342 is secured to the lower surface of the movable plate 333. A pinch cutting upper die member 341 is secured to the die retaining plate 342. A stripper 343 is vertically movably disposed underneath the die retaining plate 342, The stripper 343 is secured to a T-bolt 344 through a bolt 345.

A coil spring 346 loaded in the movable plate 333 is disposed on top of the T-bolt 344. The coil spring 346 constantly presses the T-bolt 344 downwardly. Accordingly, the stripper 343 forms a stripper mechanism that secures the packaged IC 5 as a workpiece during cutting and presses the packaged IC 5 to separate it from the cutter after it has been cut. A bush hole 336 is a hole for guiding the stripper 343 (see FIG. 33). A dam cutting blade 350 is a relatively thin comb tooth-shaped (fork-shaped) blade because the cut portions are narrow. An end cutting blade 353 cooperates with a lower blade 354 to cut off the lead distal end portions 8 in a straight-line shape and has a relatively wide cutting blade.

[Press Machine 360]

Figure 35:
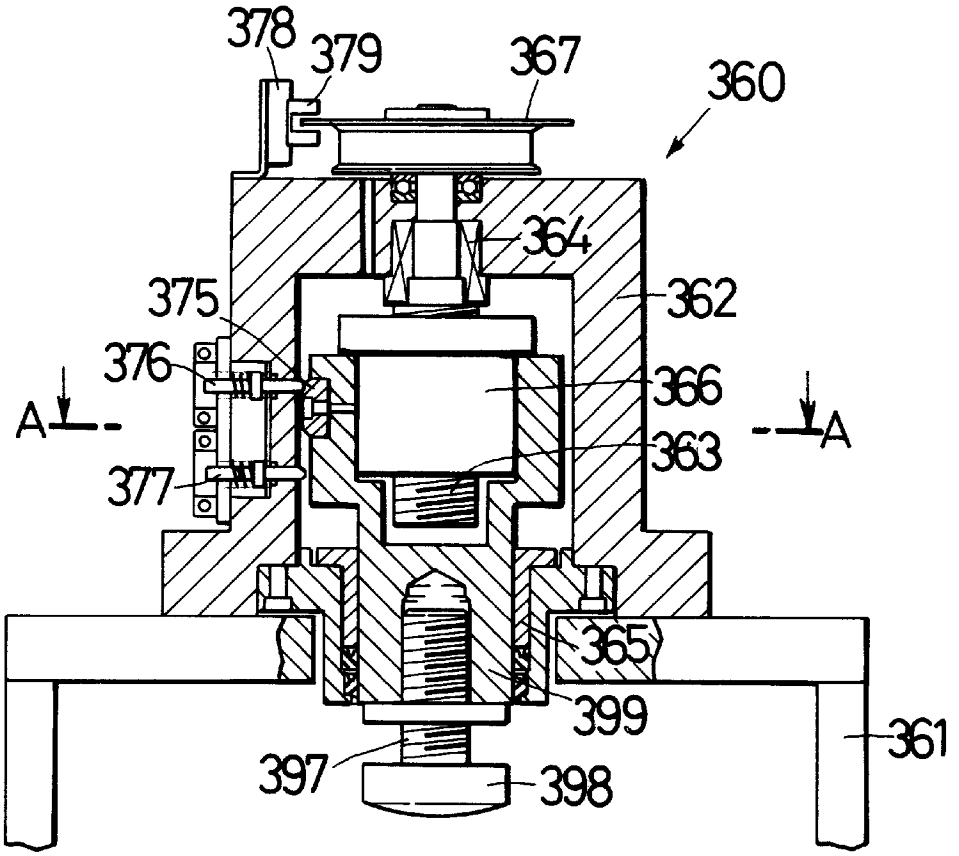
FIG. 35 is a sectional front view showing a screw press machine.
Figure 36:
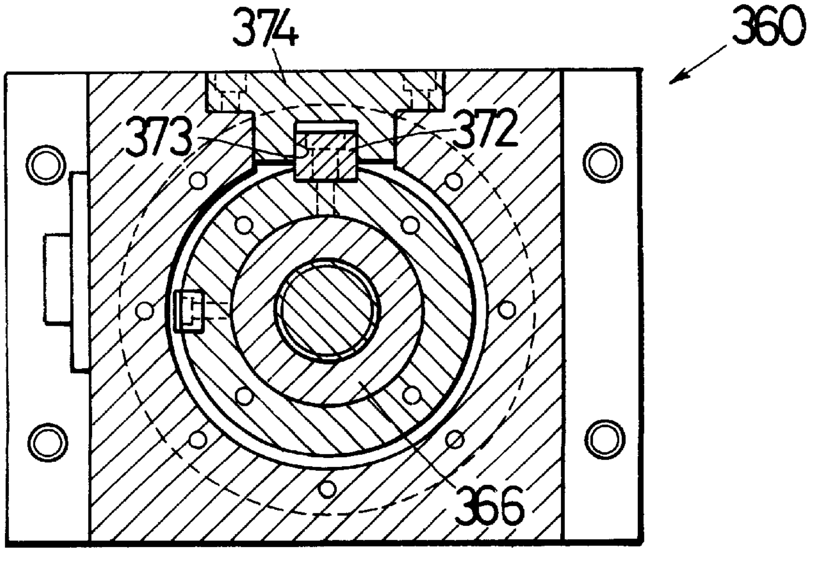
FIG. 36 is a sectional view taken along the line A—A in FIG. 35.
Figure 37:
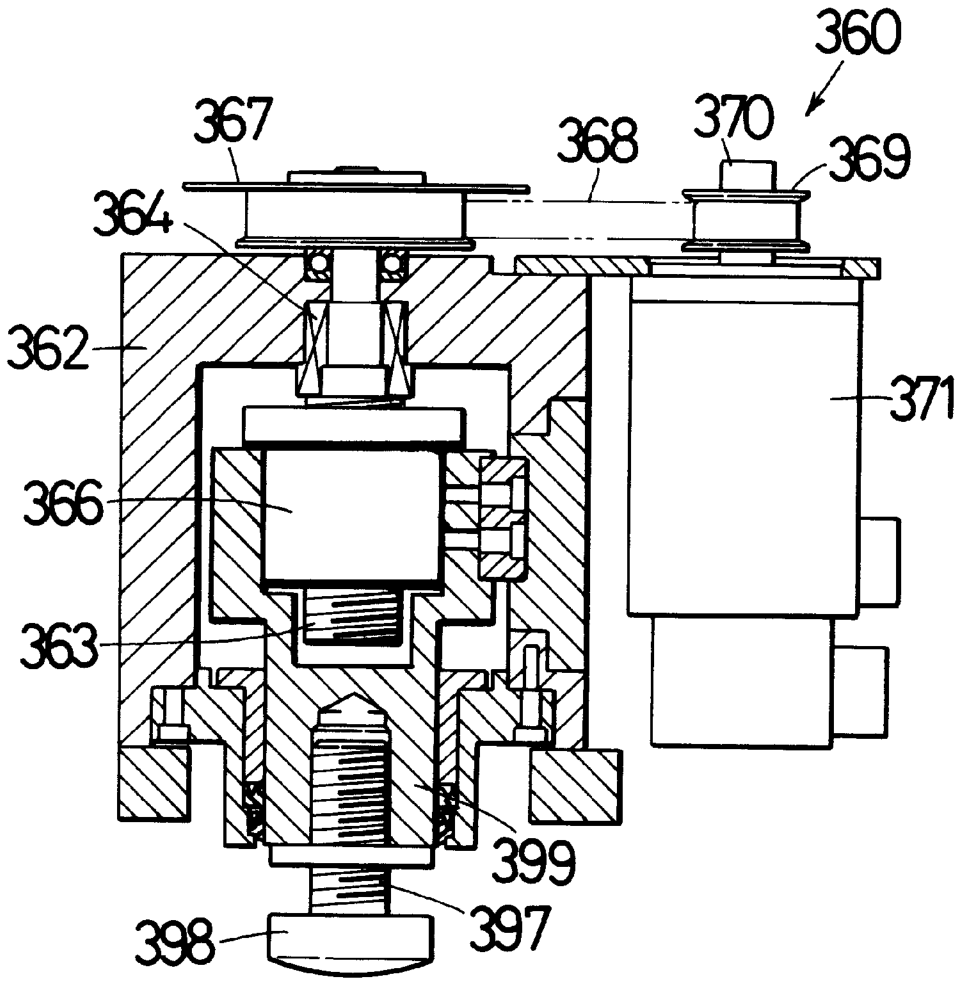
FIG. 37 is a sectional side view of the screw press machine shown in FIG. 35 as viewed from the right-hand side thereof.

FIGS. 35, 36 and 37 show a screw press machine 360. FIG. 35 is a sectional front view of the press machine 360. FIG. 36 is a sectional view taken along the line A—A in FIG. 35. FIG. 37 is a side view of the press machine 360 as viewed from the right-hand side thereof. A cylindrical body 362, the lower end of which is open, is fixed on the base 361. A screw shaft 363 is rotatably supported by the cylindrical body 362 through a bearing 364. A timing pulley 367 is secured to the upper end of the screw shaft 363. A timing pulley 369 is secured to an output shaft 370 of a servomotor 371. A timing belt 368 is stretched between the timing pulley 369 and the timing pulley 367. When the servomotor 371 is activated, the screw shaft 363 is driven to rotate through the timing pulley 369, the timing belt 368 and the timing pulley 367.

The screw shaft 363 has a nut member 366 screwed thereon. The nut member 366 is integrally secured to a ram 399. The ram 399 has a key 372 secured to the outer peripheral surface thereof to prevent the ram 399 from rotation. The key 372 is slidably inserted into a keyway 373 formed in a keyway member 374. Thus, the key 372 vertically moves along the keyway 373. The keyway member 374 is secured to the cylindrical body 362. The lower part of the ram 399 is vertically movably inserted into a bearing 365. The position in the vertical direction of the ram 399 is controlled by detecting a rotational angle. A non-contact sensor 379 is disposed through a securing member 378. The non-contact sensor 379 extends over the outer periphery of the timing pulley 367 to detect the rotational angle of the timing pulley 367. A dog 375 is secured to the outer periphery of the ram 399. The upper and lower extremity positions of the dog 375 are detected by an upper contact sensor 376 and a lower contact sensor 377, respectively, which are connected to the cylindrical body 362.

A connecting bolt 397 is fixedly screwed into the lower end of the ram 399. The head 398 of the connecting bolt 397 is inserted into the socket 335 of the cutting die 330 to connect the press machine 360 to the cutting die 330. When the servomotor 371 is activated, the screw shaft 363 is driven to rotate through the timing pulley 369, the timing belt 368 and the timing pulley 367. The rotation of the screw shaft 363 causes the nut member 366 to move vertically along the keyway 373, thus driving the movable plate 333 as the upper die of the cutting die 330.

[IC Lead Bending Machine 400]

Figure 38:
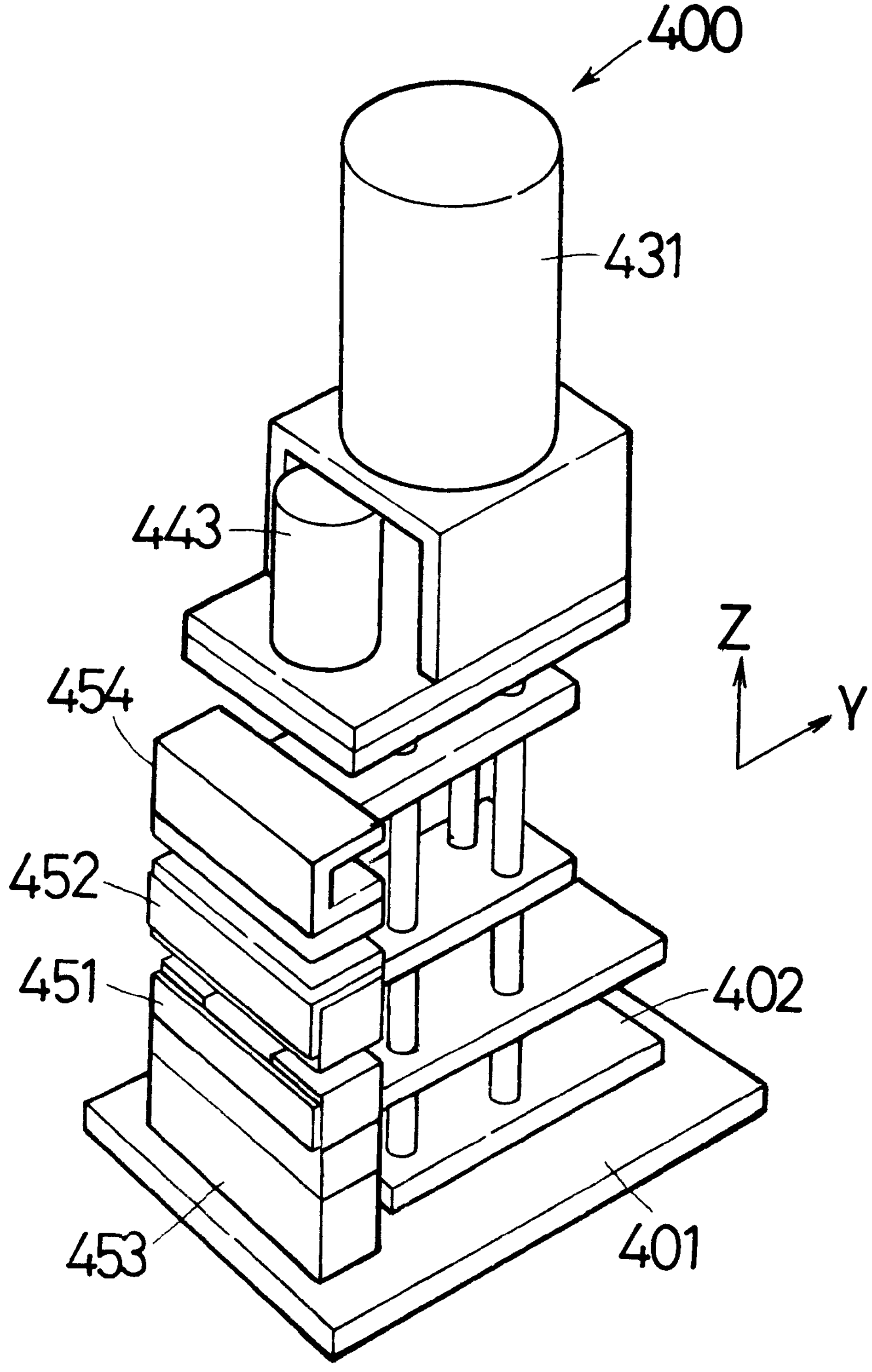
FIG. 38 is an oblique projection showing the whole of an IC lead bending machine according to the present invention.

FIG. 38 is a general perspective view of the IC lead bending machine 400. The IC lead bending machine 400 bends each lead wire 3 into a Z-shape. A base 401 is fixed on the frame of the bending machine 400. A moving plate 402 is installed on the base 401 so as to be movable in one direction (Y-axis direction) in a horizontal plane. A lead support block 453 is also fixed on the base 401. A lead holding device including a lead support fixed member 451 and a lead support movable member 452 is installed on the lead support block 453. The Y-axis direction is set to be a direction in which the moving plate 402 moves toward and away from the lead holding device. The lead wires 3 of the packaged IC 5 are positioned and fixedly placed on the rotary table 305. The lead wires 3 of the packaged IC 5 are held by clamping the root portions of the lead wires 3 of the packaged IC 5 between the lead support fixed member 451 and the lead support movable member 452 from the upper and lower sides thereof.

Figure 39:
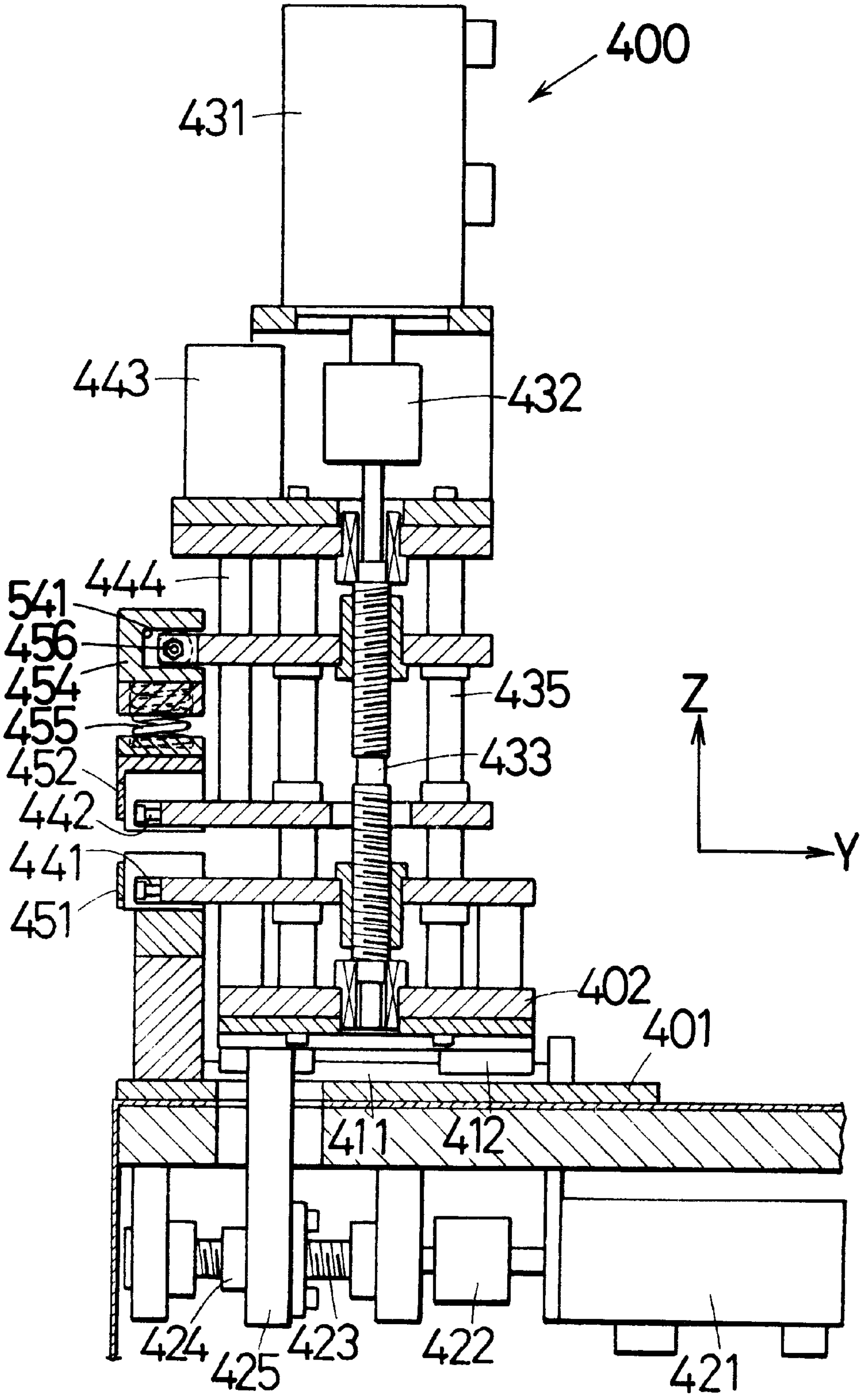
FIG. 39 is a sectional side view of the IC lead bending machine.

FIG. 39 is a sectional side view of the IC lead bending machine 400. A Y-axis guide 411 is provided to extend in the Y-axis direction on the base 401. A Y-axis slider 412 is guided on the Y-axis guide 411 so as to be movable in the Y-axis direction. The Y-axis slider 412 is secured to the lower surface of the moving plate 402, thereby enabling the moving plate 402 to move smoothly in the Y-axis direction. The moving plate 402 is driven in the Y-axis direction by the power of a Y-axis servomotor 421. An output shaft of the Y-axis servomotor 421 is connected to a Y-axis ball screw 423 through a Y-axis coupling 422, and thus rotation of the output shaft is transmitted to the Y-axis ball screw 423. The Y-axis ball screw 423 has a Y-axis ball nut 424 screwed thereon. The Y-axis ball nut 424 is nonrotatably secured to the moving plate 402 through a connecting member 425. Accordingly, the moving plate 402 is driven rectilinearly in the Y-axis direction by the rotation of the Y-axis servomotor 421.

The lead wires 3 are held at their distal end portions between a lower lead holding member 441 and an upper lead holding member 442 and bent into a predetermined shape. At this time, the root portions of the lead wires 3 are clamped between the lead support fixed member 451 and the lead support movable member 452 and thus immovably supported. The lower lead holding member 441 and the lead support movable member 452 are driven in a Z-axis direction, which is a vertical direction, by a Z-axis servomotor 431. An output shaft of the Z-axis servomotor 431 is connected to a Z-axis ball screw 433 through a Z-axis coupling 432. The upper lead holding member 442 is driven in the Z-axis direction by a cylinder device 443 through a cylinder shaft 444.

Figure 40:
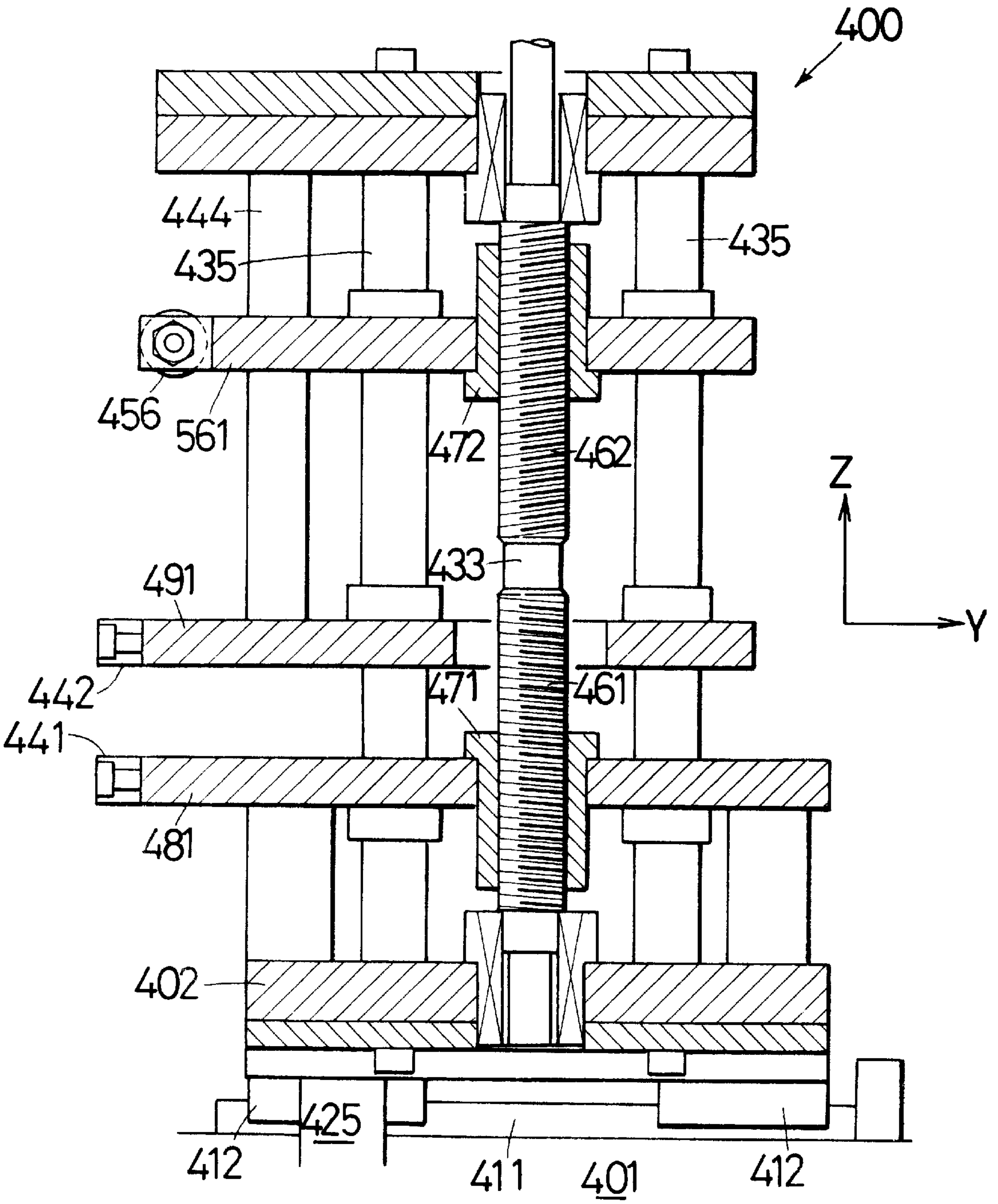
FIG. 40 is an enlarged view of a Y-axis direction driving mechanism for lead holding members and a driving mechanism for lead support members.

FIG. 40 is an enlarged view showing the Z-axis direction driving mechanism for the lower lead holding member 441 and the upper lead holding member 442, together with the lead support movable member 452. Four vertical Z-axis guides 435 are fixed on the moving plate 402. The Z-axis guides 435 have a columnar shape and guide a lower moving plate 481, an upper moving plate 491 and a roller retaining plate 561 in the Z-axis direction. The Z-axis ball screw 433, which is driven by the Z-axis servomotor 431, has a lower ball screw 461 and an upper ball screw 462 in the lower and upper portions, respectively, of the central part of the Z-axis ball screw 433. The lower ball screw 461 and the upper ball screw 462 have respective threads cut thereon in an inverse relation to each other with the same pitch.

The lower ball screw 461 has a lower ball nut 471 screwed thereon. The lower ball nut 471 is nonrotatably secured to the lower moving plate 481. The lower lead holding member 441 is secured to the distal end portion of the lower moving plate 481. Accordingly, the lower lead holding member 441 can be moved in the Z-axis direction by rotatively driving the Z-axis ball screw 433 by the Z-axis servomotor 431. The upper ball screw 462 has an upper ball nut 472 screwed thereon. The upper ball nut 472 is nonrotatably secured to the roller retaining plate 561. A driving roller 456 is rotatably supported at the distal end portion of the roller retaining plate 561. Accordingly, the driving roller 456 can be moved in the Z-axis direction by rotatively driving the Z-axis ball screw 433 by the Z-axis servomotor 431.

Because the lower ball screw 461 and the upper ball screw 462 have respective threads cut thereon in an inverse relation to each other, the rotation of the Z-axis ball screw 433 causes the driving roller 456 and the lower lead holding member 441 to move vertically through equal distances in opposite directions to each other. The driving roller 456 is engaged in an engagement groove 541 of an engagement member 454. By moving the driving roller 456 in the Z-axis direction, the lead support movable member 452 can be urged toward the lead support fixed member 451 through a spring 455. The engagement mechanism of the driving roller 456 and the engagement groove 541 is adapted to urge the lead support movable member 452 independently of the movement in the Y-axis direction of the moving plate 402.

The engagement groove 541 absorbs the movement in the Y-axis direction of the moving plate 402. The upper moving plate 491, which has the upper lead holding member 442 secured to the distal end portion thereof, is driven to press in the Z-axis direction by the cylinder device 443 through the cylinder shaft 444. Consequently, the upper lead holding member 442 is urged toward the lower lead holding member 441. In a state where the upper lead holding member 442 is urged toward the lower lead holding member 441 by an air pressure or the like, when the lower lead holding member 441 moves, the upper lead holding member 442 also moves together with it so as to follow the movement of the lower lead holding member 441 while being held in the urged state.

Figure 41:
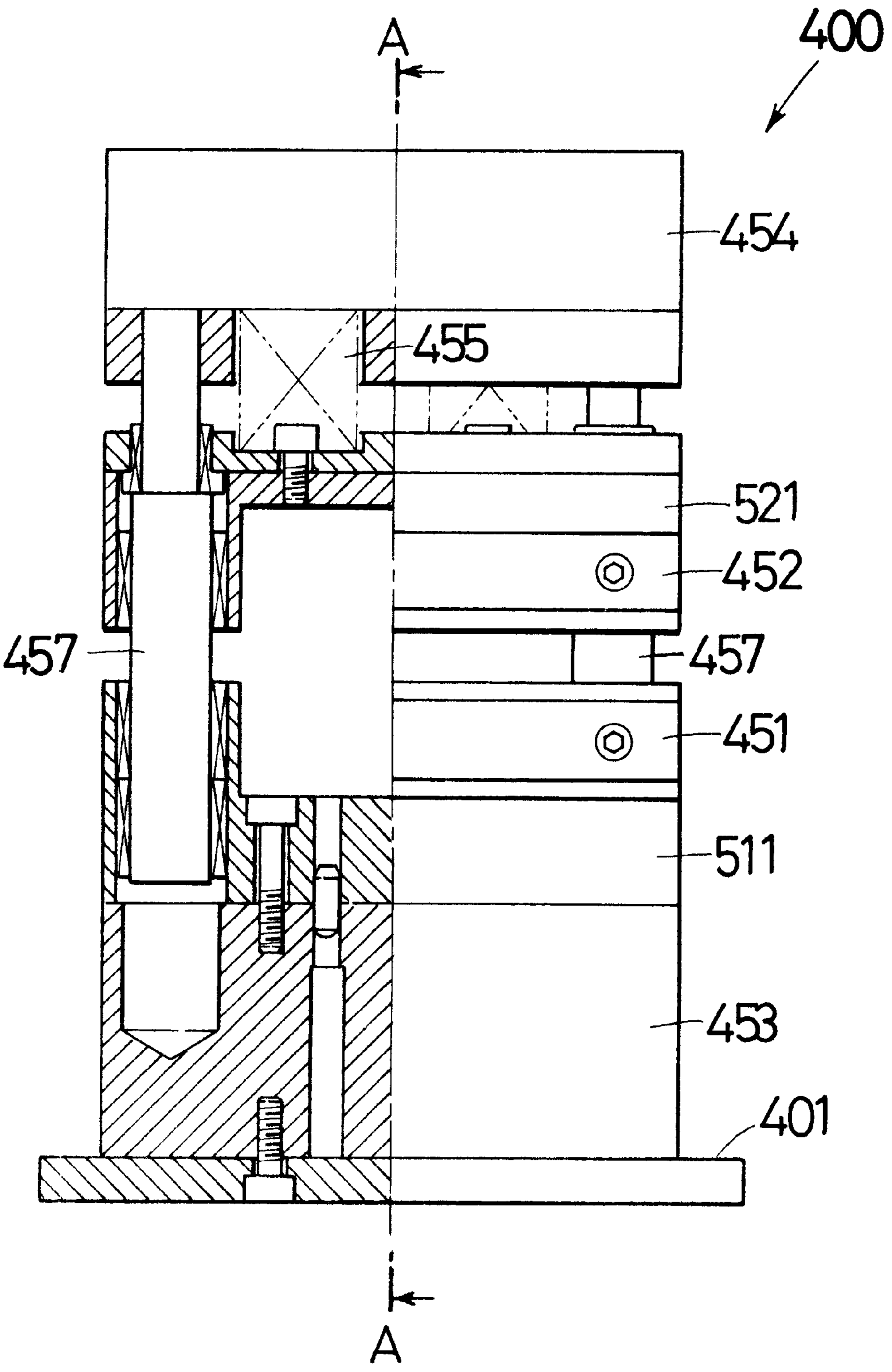
FIG. 41 is an enlarged front view of the lead support members.
Figure 42:
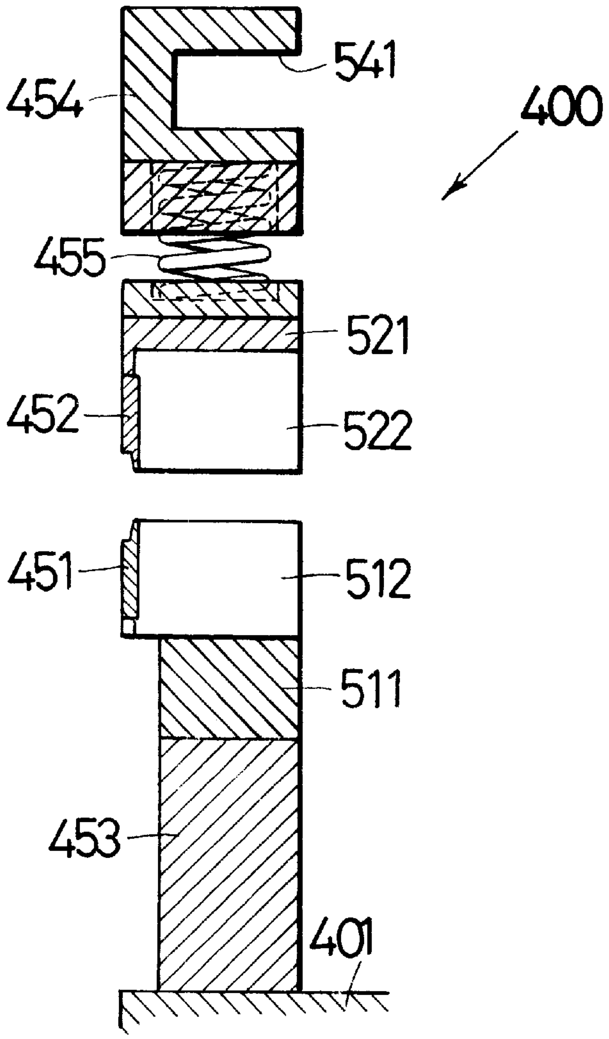
FIG. 42 is a sectional view of the lead support members taken along the line A—A in FIG. 41.

FIG. 41 is an enlarged front view of the lead holding device for fixedly supporting the root portions of IC leads during the bending of the leads, in which a part of the lead holding device is shown in a sectional view. FIG. 42 is a sectional view of the lead holding device as seen from the arrow A—A in FIG. 41. The lead holding device is installed on the lead support block 453. The lead support block 453 is fixedly installed on the base 401. The lead holding device comprises the lead support fixed member 451, which is a lower member whose position is fixed, and the lead support movable member 452, which is an upper member. As has been stated above, the lead support movable member 452 is urged toward the lead support fixed member 451 by the Z-axis servomotor 431 and the Z-axis ball screw 433.

Guide bars 457 are secured to the engagement member 454 in such a manner as to extend in the Z-axis direction. An upper lead support member mounting part 521 and a lower lead support member mounting part 511 are fitted on the guide bars 457 so as to be movable relative to each other. The guide bars 457 enable the engagement member 454 and the lead support movable member 452 to move in the Z-axis direction and guide them with respect to the lead support fixed member 451. By lowering the driving roller 456 engaged in the engagement groove 541, the engagement member 454 is moved downwardly, and further, the lead support movable member 452 is moved downwardly through the spring 455, thereby fixedly supporting the root portions of the leads. Even after the lead support movable member 452 has come in contact with the lead root portions, the engagement member 454 is further moved downwardly until the supporting force from the spring 455 reaches a predetermined magnitude.

Figure 43:
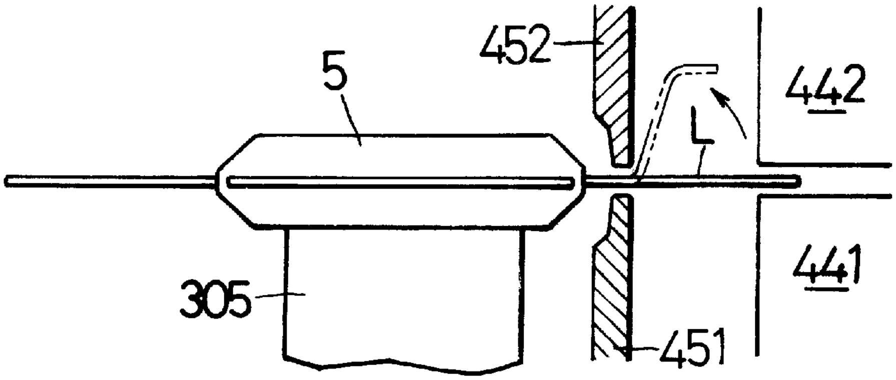
FIG. 43 is a diagram showing the way in which IC leads are bent.

The upper lead support member mounting part 521 and the lower lead support member mounting part 511 have spaces 522 and 512 formed therein, respectively, so that the upper lead holding member 442 and the lower lead holding member 441 can freely move in both the Y- and Z-axis directions in the spaces 522 and 512. FIG. 43 shows the way in which leads of a packaged IC 5 are bent. The packaged IC 5 is positioned and fixedly supported on the rotary table 305.

The rotary table 305 holds the packaged IC 5 by vacuum or the like and has the function of indexing rotation whereby leads L of the packaged IC 5 that are to be worked are indexed to a working position. With the root portions of the leads L press-supported by the lead support fixed member 451 and the lead support movable member 452, the distal end portions of the leads L are clamped between the lower lead holding member 441 and the upper lead holding member 442. Then, the Y-axis servomotor 421 and the Z-axis servomotor 431 are controlled such that the lower lead holding member 441 and the upper lead holding member 442 draw a circular arc-shaped locus as shown in FIG. 43, thereby bending the leads L.

[Inverting Device 560]

Figure 44:
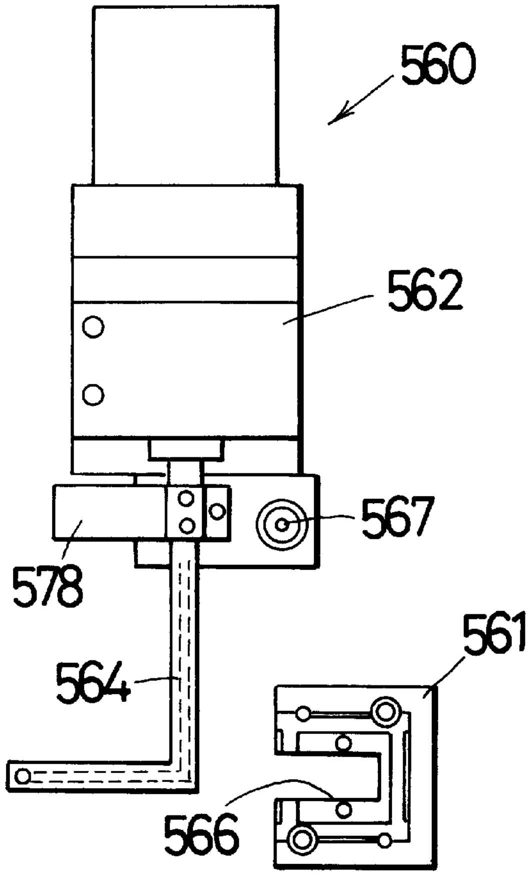
FIG. 44 is a diagram showing a device for inverting a processed packaged IC.
Figure 45:
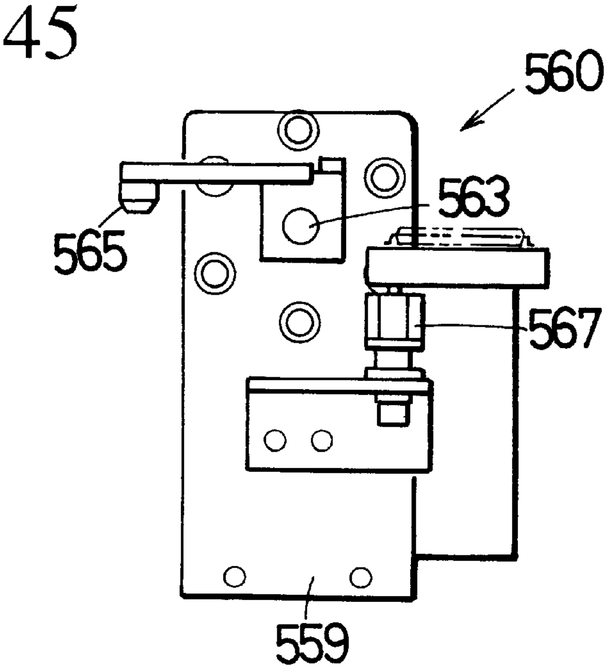
FIG. 45 is a front view of the inverting device shown in FIG. 44.
Figure 46:
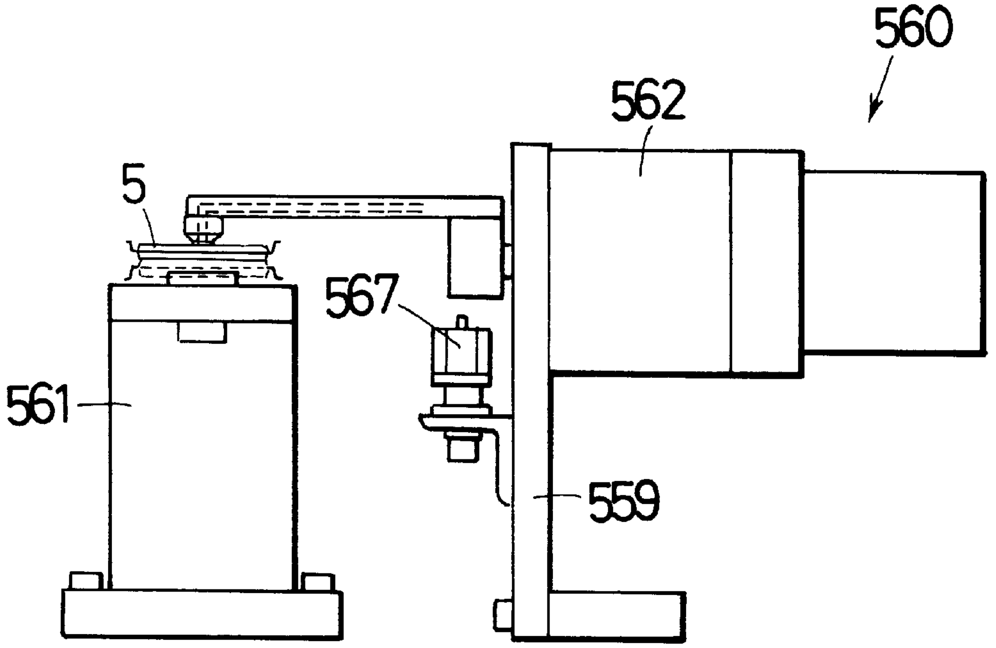
FIG. 46 is a side view of the inverting device shown in FIG. 44.

FIGS. 44, 45 and 46 show the inverting device 560. FIG. 44 is a plan view. FIG. 45 is a front view. FIG. 46 is a side view. The inverting device 560 is used to invert the completed packaged IC 5 and to temporarily lay the inverted packaged IC 5 on a temporary laying table 561. The temporarily laid packaged IC 5 is stacked on a tray (not shown) for storage by a transfer device (not shown). A rotary actuator 562 is an air-operated actuator having an output shaft 563 that oscillates. An oscillating arm 564 is secured to the output shaft 563. A vacuum chuck 565 for holding the packaged IC 5 is disposed on the distal end of the oscillating arm 564.

The temporary laying table 561 is provided with a through-hole 566 such that the distal end of the oscillating arm 564 can pass through the through-hole 566. Accordingly, when the oscillating arm 564 holding the packaged IC 5 oscillates, the distal end of the oscillating arm 564 passes through the through-hole 566, and only the packaged IC 5 is placed on the temporary laying table 561. A dog 578 is secured to the root of the output shaft 563 so as to oscillate together with the oscillating arm 564 as one unit. A shock absorber 567 is fixed on a frame 559 to which the rotary actuator 562 is secured. The shock absorber 567 stops the oscillation of the dog 578. The shock absorber 567 receives the distal end of the dog 578 to damp the oscillation when the oscillating arm 564 holding the completed packaged IC 5 by the vacuum chuck 565 places the packaged IC 5 on the temporary laying table 561.

[Other Embodiments]

Although in the above-described embodiment the centering device 120 is provided, it is not always necessary because the leadframe 2 is subjected to positioning, i.e. centering, by the cassette holding mechanism 65, as will be understood from the foregoing description. Although there is provided a single cutting die 330 in the described embodiment, the cutting die 330 comprises a plurality of cutting dies. The details of the cutting process are not necessarily limited to those described above but may be changed according to the type of packaged IC 5 to be processed.

[Leadframe Roller Cutting Machine 580]

Figure 47:
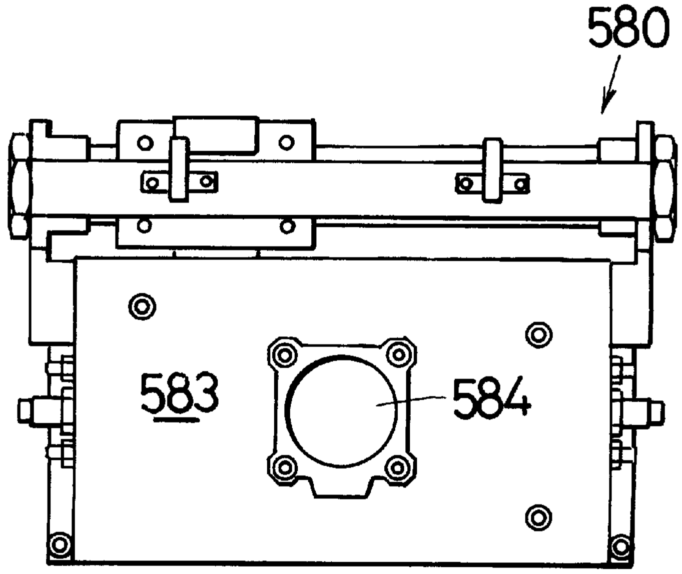
FIG. 47 is a plan view showing another example of a leadframe roller cutting machine.
Figure 48:
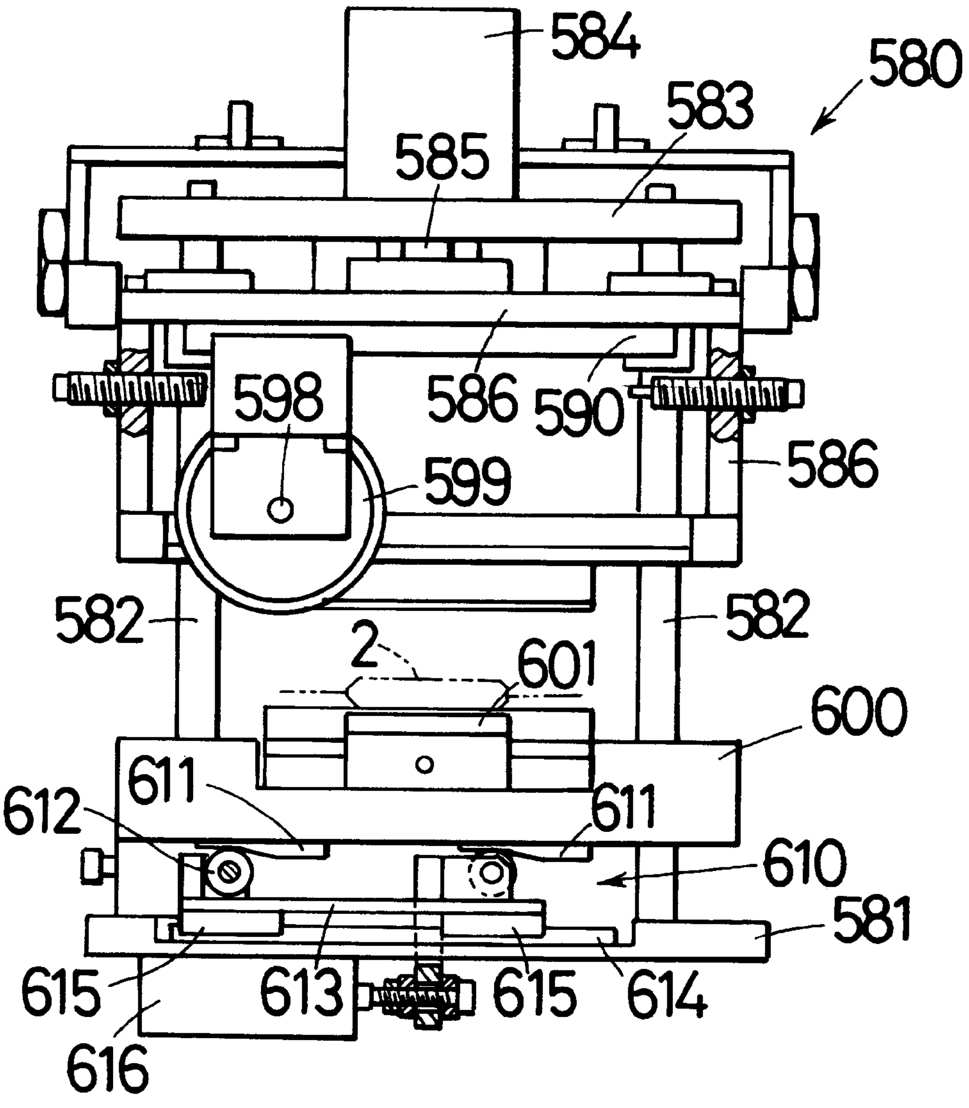
FIG. 48 is a front view of the leadframe roller cutting machine shown in FIG. 47.
Figure 49:
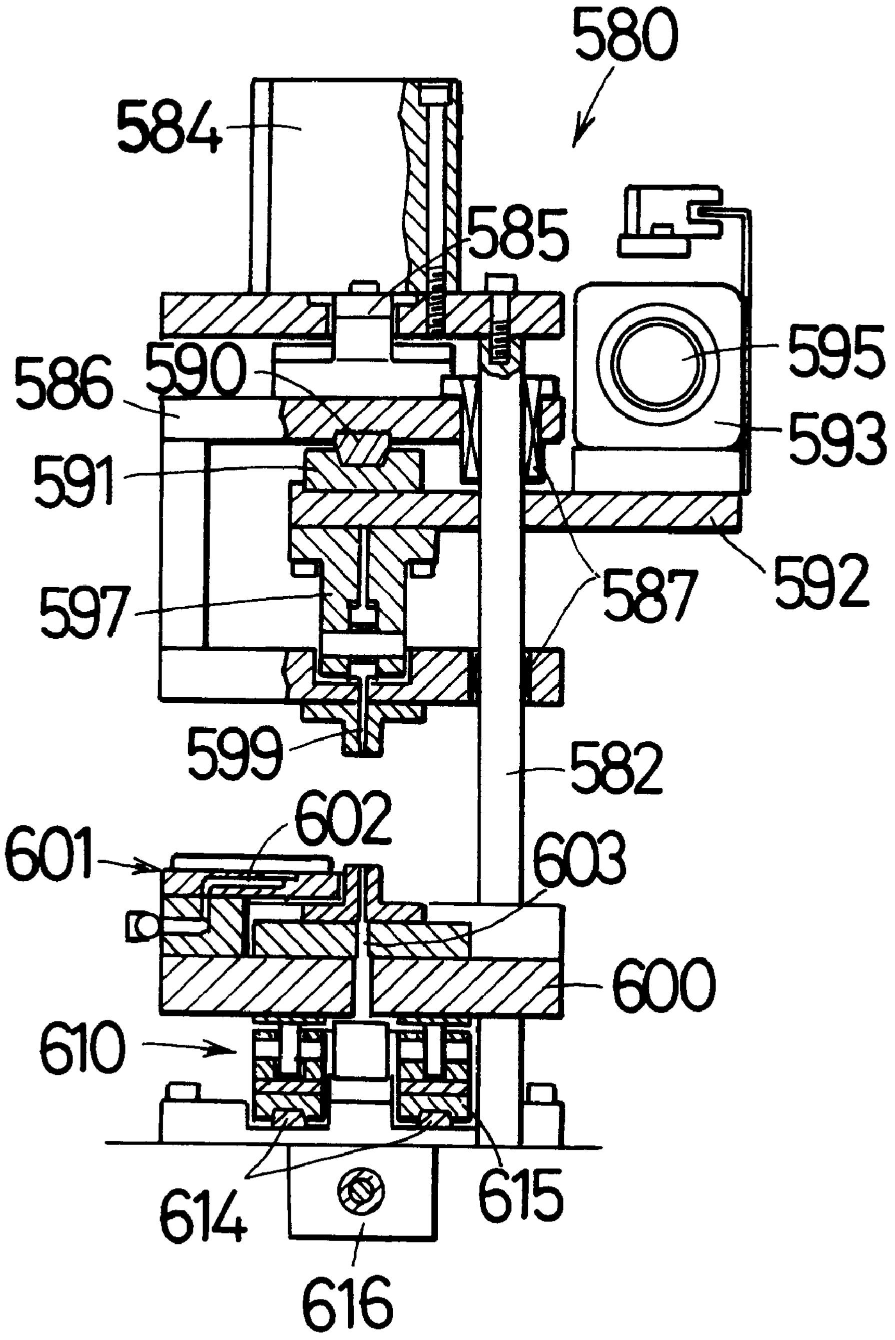
FIG. 49 is a sectional side view of the leadframe roller cutting machine shown in FIG. 48 as viewed from the right-hand side thereof.

The above-described leadframe cutting machine 160 cuts the leadframe 2 into individual packaged ICs 5 by shearing the leadframe 2 between two rotary cutting blades. FIGS. 47, 48 and 49 show a leadframe roller cutting machine 580 as another example of the leadframe cutting machine used in the present invention. The leadframe roller cutting machine 580 is of the type in which the leadframe 2 is cut by rolling a disk cutter on the leadframe 2. FIG. 47 is a plan view of the leadframe roller cutting machine 580. FIG. 48 is a front view of the arrangement shown in FIG. 47. FIG. 49 is a sectional side view of the arrangement shown in FIG. 48 as viewed from the right-hand side thereof. A base plate 581 is secured to the frame of the system.

The leadframe roller cutting machine 580 has two parallel columns 582 with a circular sectional configuration. The lower ends of the two columns 582 are secured to the base plate 581. The upper portions of the columns 582 are fixedly connected by a horizontal plate 583. An air cylinder 584 is fixed on the top of the horizontal plate 583. A piston rod 585 which is an output shaft of the air cylinder 584 is secured to the upper end of a vertically moving plate 586. The vertically moving plate 586 has an approximately cubic frame structure.

The rear part of the vertically moving plate 586 is provided with four bearings 587 at four upper and lower positions, respectively, to enable the vertically moving plate 586 to move vertically along the two columns 582. Thus, when the air cylinder 584 is activated, the vertically moving plate 586 is driven to move vertically along the columns 582. A rail 590 is secured in the vertically moving plate 586. A linear bearing 591 is movably disposed on the rail 590.

A connecting member 592 is secured to the linear bearing 591. The connecting member 592 is secured to a driven member 593 disposed at the back of the leadframe roller cutting machine 580. The driven member 593 is driven to move the linear bearing 591. Both ends of a rodless cylinder 595 are secured to the vertically moving plate 586. A cutting blade support member 597 is secured to the lower surface of the connecting member 592. A cutting blade support shaft 598 is secured to the cutting blade support member 597. A cutting blade 599 is rotatably supported by the cutting blade support shaft 598 through a bearing.

Accordingly, the rodless cylinder 595, the driven member 593 and the connecting member 592 are mounted on the vertically moving plate 586 so as to move vertically. When the rodless cylinder 595 is activated, the cutting blade 599 is driven to move along the rail 590 as a guide. A vertically moving table 600 is vertically movably disposed on the lower portions of the columns 582. A machining table 601 is disposed on the top of the vertically moving table 600.

A vacuum chuck 602 is disposed on the machining table 601 to fix the leadframe 2 on the machining table 601 during the cutting process. The machining table 601 is provided with a slit 603. The slit 603 is used to receive the cutting blade 599 when the leadframe 2 is cut.

A table vertically driving mechanism 610 is disposed underneath the vertically moving table 600. The table vertically driving mechanism 610 moves the table 600 downwardly so that the table 600 does not interfere with the leadframe 2 when the leadframe 2 is placed on the machining table 601. Linear cams 611 are secured to the lower surface of the table 600. Cam followers 612, which are rollers, are in contact with the linear cams 611, respectively. The cam followers 612 are rotatably supported on a moving plate 613. The moving plate 613 moves along two rails 614 secured to the base plate 581 through linear bearings 615.

The moving plate 613 is connected to an output rod of an air cylinder 616. The air cylinder 616 drives the moving plate 613 to move along the rails 614. As the moving plate 613 moves, the cam followers 612 push up the respective linear cams 611 or allow them to lower, causing the whole table 600 to be pushed up or lowered.

[Rotary Table Vertically Driving Mechanism 620]

Figure 50:
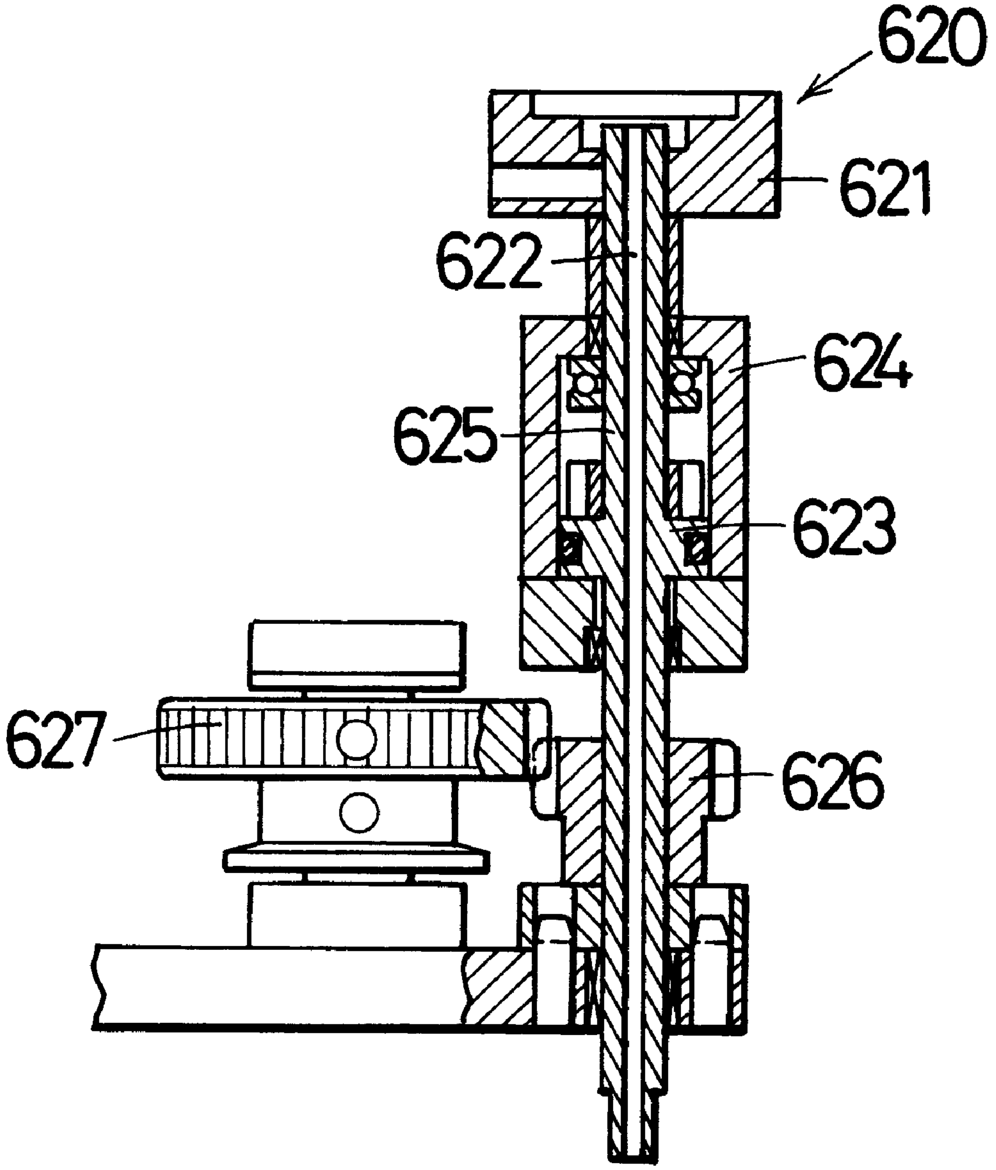
FIG. 50 is a diagram showing another example of a rotary table.

The above-described rotary table 305 (see FIGS. 25, 26(*a*) and 26(*b*)) is vertically moved by the rotary table vertically driving mechanism 308, which comprises a cam mechanism, when the packaged IC 5 to be cut is placed on the cutting die 330. However, the vertical movement of the rotary table 305 is not always necessary to perform by a cam mechanism. FIG. 50 shows an example in which a rotary table is vertically moved by an air cylinder. A rotating center shaft 625 of a rotary table 621 is provided with a vacuum hole 622 for sucking air. The packaged IC 5 is vacuum-held on the rotary table 621 by sucking air from the vacuum hole 622.

The rotating center shaft 625 has a piston 623 formed thereon. The piston 623 is fitted in a cylinder 624.

Accordingly, when air is introduced into the cylinder 624, the piston 623 is moved. Thus, the rotary table 621 is caused to move vertically. A gear 626 is secured to the lower portion of the rotating center shaft 625. The gear 626 is in mesh with a gear 627. The gear 627 is driven to rotate by an electric servomotor (not shown). Accordingly, the rotary table 621 is driven to rotate for indexing through the gear 627.

[Advantageous Effects of the Invention]

As has been detailed above, according to the present invention, packaged ICs having different sizes and shapes can be efficiently positioned and centered for machining in large quantity by a single processing system. Therefore, different facilities are not needed. Thus, the processing system is simplified. It is possible to meet a need of increasing the throughput of the IC leadframe machining process simply by increasing the number of IC leadframe processing systems each unitized as a single processing system without a need of new facilities.

Although the present invention has been described through specific terms, it should be noted here that the described embodiments are not necessarily exclusive and that various changes and modifications may be imparted thereto without departing from the scope of the invention which is limited solely by the appended claims.

What is claimed is:

1. An IC leadframe processing system utilized as a single processing system, comprising:

storage means for storing a stack of leadframes each having a plurality of IC chips mounted thereon;

separating means for separating the leadframes, one by one, from said stack of leadframes stored in storage means;

leadframe cutting means for cutting said leadframes separated from said storage means each into individual IC chips to obtain a plurality of packaged ICs;

machining means for machining lead wires of each of said individual packaged ICs;

a lead processing machine table for transferring and angularly indexing said packaged ICs for said machining by said machining means; and transfer means for transferring said separated leadframes between said separating means and said leadframe cutting means and for transferring said packaged IC cut from said leadframes between said leadframe cutting means and said machining means.

2. An IC leadframe processing system according to claim 1, further comprising a centering device disposed between said separating means and said leadframe cutting means to position said leadframe separated by said separating means.

3. An IC leadframe processing system according to claim 1 or 2, wherein said separating means is an IC pushing-up mechanism that pushes up said stack of leadframes in said storage means from a bottom of said stack to separate only a topmost leadframe from said stack of leadframes one by one.

4. An IC leadframe processing system according to claim 1 or 2, wherein said machining means comprises:

cutting means for cutting corner portions of said lead wires and cutting dam portions interconnecting said lead wires and further cutting distal end portions of said lead wires; and a lead bending machine for bending said lead wires by holding and moving distal ends of said lead wires.

5. An IC leadframe processing system according to claim 2, wherein said transfer means comprises:

a first transfer device for transferring said leadframe between said centering device and said leadframe cutting means;

a second transfer device for transferring said packaged IC cut by said leadframe cutting means to said machining means; and a third transfer device for transferring said packaged IC between a plurality of machining steps in said machining means.

6. An IC leadframe processing system according to claim 4, wherein said cutting means comprises:

a lead processing machine table for placing said packaged IC thereon, said lead processing machine table being controlled so as to be movable in a predetermined plane for cutting said packaged IC placed thereon;

a lead processing machine indexing table for indexing said packaged IC placed on said lead processing machine table to a rotational angle position substantially in said plane; and a cutting die for cutting said lead wires.

7. An IC leadframe processing system according to claim 4, wherein said cutting means has cutting die members simultaneously driven by a same press machine to cut the corner portions of said lead wires, the dam portions of said lead wires, and the distal end portions of said lead wires.

8. An IC leadframe processing system according to claim 6, wherein said lead processing machine indexing table comprises:

a first lead processing machine indexing table for indexing said packaged IC to a rotational angle position substantially in said plane to cut pinch portions, which are corner portions of said lead wires;

a second lead processing machine indexing table for indexing said packaged IC to a rotational angle position substantially in said plane to cut dam portions interconnecting respective portions of said lead wires so that said lead wires do not separate from each other;

a third lead processing machine indexing table for indexing said packaged IC to a rotational angle position substantially in said plane to cut lead distal end portions at which distal end portions of said lead wires are connected to each other so that said lead wires do not separate from each other; and a fourth lead processing machine indexing table for indexing said packaged IC to a rotational angle position substantially in said plane to bend distal ends of said lead wires.

9. An IC leadframe processing system according to claim 8, further comprising a feed correction driving mechanism for correcting respective positions in said plane of said first lead processing machine indexing table, said third lead processing machine indexing table and said fourth lead processing machine indexing table.

* * * * *